US010566550B2

(12) United States Patent
Eckes et al.

(10) Patent No.: US 10,566,550 B2
(45) Date of Patent: Feb. 18, 2020

(54) FORMULATION CONTAINING AN ORGANIC SEMICONDUCTOR AND A METAL COMPLEX

(71) Applicant: Merck Patent GmbH, Darmstadt (DE)

(72) Inventors: Fabrice Eckes, Saint Louis (FR); Katja Scheible, Darmstadt (DE); Holger Heil, Frankfurt am Main (DE); Dietmar Kunkel, Gernsheim (DE); Henning Seim, Darmstadt (DE)

(73) Assignee: Merck Patent GmbH (DE)

( * ) Notice: Subject to any disclaimer, the term of this patent is extended or adjusted under 35 U.S.C. 154(b) by 0 days.

(21) Appl. No.: 15/576,535

(22) PCT Filed: May 4, 2016

(86) PCT No.: PCT/EP2016/000739
§ 371 (c)(1),
(2) Date: Nov. 22, 2017

(87) PCT Pub. No.: WO2016/188609
PCT Pub. Date: Dec. 1, 2016

(65) Prior Publication Data
US 2019/0074453 A1 Mar. 7, 2019

(30) Foreign Application Priority Data
May 22, 2015 (EP) .................................. 15001556

(51) Int. Cl.
*H01L 51/00* (2006.01)
*H01L 51/50* (2006.01)
*H01L 51/05* (2006.01)
*H01L 51/42* (2006.01)

(52) U.S. Cl.
CPC ...... *H01L 51/0077* (2013.01); *H01L 51/0003* (2013.01); *H01L 51/006* (2013.01); *H01L 51/0035* (2013.01); *H01L 51/0039* (2013.01); *H01L 51/0043* (2013.01); *H01L 51/506* (2013.01); *H01L 51/0004* (2013.01); *H01L 51/0056* (2013.01); *H01L 51/0058* (2013.01); *H01L 51/0508* (2013.01); *H01L 51/42* (2013.01); *H01L 51/50* (2013.01); *H01L 51/5088* (2013.01)

(58) Field of Classification Search
CPC ............. H01L 51/0077; H01L 51/0003; H01L 51/0035; H01L 51/506; H01L 51/0039; H01L 51/006; H01L 51/0043; H01L 51/5088; H01L 51/0058; H01L 51/0508; H01L 51/42; H01L 51/50; H01L 51/0004; H01L 51/0056; H01L 51/0079; Y02P 70/521; Y02E 10/549
USPC .................................................. 252/500, 506
See application file for complete search history.

(56) References Cited

U.S. PATENT DOCUMENTS

| 9,090,532 | B2 * | 7/2015 | Kaiser | C07C 13/62 |
| 9,090,590 | B2 * | 7/2015 | Pflumm | C07D 403/10 |
| 9,416,310 | B2 * | 8/2016 | Stoessel | C07F 15/0086 |
| 9,837,617 | B2 * | 12/2017 | Pfister | H01L 51/0056 |
| 9,853,228 | B2 * | 12/2017 | Koenen | H01L 51/0085 |
| 10,003,024 | B2 * | 6/2018 | Pan | C08G 61/12 |
| 2012/0273736 | A1 | 11/2012 | James et al. | |
| 2014/0138661 | A1 * | 5/2014 | Ludemann | H01L 51/0059 257/40 |
| 2015/0069303 | A1 | 3/2015 | Eckes et al. | |
| 2015/0076415 | A1 | 3/2015 | Heil et al. | |
| 2015/0123047 | A1 | 5/2015 | Maltenberger et al. | |
| 2015/0255724 | A1 | 9/2015 | Pan | |

FOREIGN PATENT DOCUMENTS

| CN | 104245784 A | 12/2014 |
| CN | 104271632 A | 1/2015 |
| WO | WO-2014048542 A1 | 4/2014 |

OTHER PUBLICATIONS

International Search Report for PCT/EP2016/000739 dated Aug. 16, 2016.
Lessard, B., et al., "Poly(2-(N-carbazolyl)ethyl acrylate) as a host for high efficiency polymer light-emitting devices", Organic Electronics, vol. 17, (2015), pp. 377-385.
Tsuboi, T., et al., "Photoluminescence characteristics of Ir(ppy)₃ and PtOEP doped in TPD host material", Thin Solid Films, vol. 499, (2006), p. 306-312.
Written Opinion of the International Searching Authority for PCT/EP2016/000739 dated Aug. 16, 2016.

* cited by examiner

*Primary Examiner* — Douglas J McGinty
(74) *Attorney, Agent, or Firm* — Drinker Biddle & Reath LLP

(57) ABSTRACT

The present invention relates to formulations which comprise at least one organic semiconductor, at least one metal complex and at least one solvent and the use of these formulations in electronic devices, in particular organic electroluminescent devices.

16 Claims, No Drawings

FORMULATION CONTAINING AN ORGANIC SEMICONDUCTOR AND A METAL COMPLEX

CROSS-REFERENCE TO RELATED APPLICATIONS

This application is a national stage application (under 35 U.S.C. § 371) of PCT/EP2016/000739, filed May 4, 2016, which claims benefit of European Application No. 15001556.8, filed May 22, 2015, both of which are incorporated herein by reference in their entirety.

The present invention relates to a formulation comprising at least one organic semiconductor, at least one metal complex and at least one organic solvent for the production of electronic devices. The present invention furthermore relates to electronic devices and to a process for the production thereof.

Electronic devices which comprise organic, organometallic and/or polymeric semiconductors are increasing in importance; they are employed in many commercial products for cost reasons and owing to their performance. Examples which may be mentioned here are organic-based charge-transport materials (for example triarylamine-based hole transporters) in photocopiers, organic or polymeric light-emitting diodes (OLEDs or PLEDs) and in display devices, or organic photoreceptors in photocopiers. Organic solar cells (O-SC), organic field-effect transistors (O-FET), organic thin-film transistors (O-TFT), organic integrated circuits (O-IC), organic optical amplifiers and organic laser diodes (O-lasers) are at an advanced stage of development and may achieve major importance in the future.

Generally, an OLED comprises an anode, a cathode and an organic light emitting unit. The last one comprises several functional layers like hole- or electron-injection layers, hole- or electron-transport layers and organic light emitting layers.

Nowadays, there are two main techniques for the formation of the different functional layers in an OLED device: vacuum evaporation techniques and solution-based coating methods.

The evaporation techniques are the most common technique for the production of OLEDs devices. However, this represents a major cost disadvantage, in particular for large-area devices, since a multistep vacuum process in various chambers is very expensive and must be controlled very precisely. Less expensive and established coating methods from solution, such as, for example, ink-jet printing, air-brush methods, roll-to-roll processes would be a major advantage here.

Thus, for example, WO 2009/021107 A1 and WO 2010/006680 A1 describe organic compounds which are suitable for the production of electronic devices, where these compounds can be processed both via gas-phase deposition and also from solution. However, the electronic devices which are obtained via gas-phase deposition exhibit a more favourable property profile.

Known processes for the production of electronic devices have a usable property profile. However, it is constantly necessary to improve the properties of these processes.

In particular, the process should be inexpensive to carry out. Furthermore, the process should be suitable for the production of very small structures, enabling high-resolution screens to be obtained by the process. Furthermore, it should be possible to carry out the process using standard printing processes.

These advantages should be achieved individually or together. An essential point of view here is that the electronic devices obtainable by the process should have excellent properties. These properties include, in particular, the lifetime of the electronic devices.

A further problem is, in particular, the energy efficiency with which an electronic device achieves the specified object. In the case of organic light emitting diodes, which may be based both on low-molecular-weight compounds and also on polymeric materials, the light yield, in particular, should be high, so that as little electrical power as possible has to be applied in order to achieve a certain light flux. Furthermore, the lowest possible voltage should also be necessary in order to achieve a specified luminous density. Accordingly, these properties should not be adversely affected by the process.

More particularly, layers which are directly connected to emitting layers, especially hole-transport layers have a great influence on the properties of the adjacent emitting layer. The quality of the hole-injection layer, which is directly connected to the hole-transport layer, plays also a significant role in the performance of the OLED.

Compositions, which comprise an organic semiconductor and a metal complex like in WO2013/182389, can be successfully used as a hole injection and/or a hole-transport layer for the production of organic electronic components. These kind of compositions can be deposited using either a vacuum evaporation technique or a solution-based coating method. Nevertheless, the quality of layers, comprising an organic semiconductor and a metal complex, obtained from coating methods from solution is not as good as the quality of the same layers obtained from evaporation techniques. More particularly, it is very difficult to deposit homogenous, thick and reproducible layers in the range of from 100 to 300 nm when using a coating method. This is due to the fact that the solubilities of the organic semiconductor and/or of the metal complex are very limited in the solvents know from the prior art and therefore the total concentration of organic semiconductor and/or metal complex in the known solvents is very low ($\leq 3.5$ wt. % based on the total formulation).

It has now been found that formulations comprising at least one organic semiconductor, at least one metal complex and at least one solvent, wherein the organic semiconductor and the metal complex are present at high concentration in the formulation, lead to deposition of very homogenous, thick and transparent layers for the production of electronic devices. At the same time, layers deposited from these formulations were perfectly reproducible. This advantageously lead to electronic devices, which exhibit excellent performance in terms of lifetime, energy efficiency, light yield and working voltage in a reproducible manner. At the same time, the fact that these layers are obtained from a deposition process from a solution leads to a major cost advantage, since a multistep vacuum process in various chambers is avoided.

Accordingly, the first object of the present invention is a formulation comprising at least one organic semiconductor, at least one metal complex and at least one organic solvent, characterized in that the solubility at 20° C. of the metal complex is $\geq 5$ g/l, preferably $\geq 7.5$ g/l and more preferably $\geq 10$ g/l in at least one organic solvent and the solubility at 20° C. of the organic semiconductor is $\geq 10$ g/l, preferably $\geq 15$ g/l and more preferably $\geq 20$ g/l in at least one organic solvent.

The formulation of the present invention comprises at least one organic solvent, wherein the solubility of the metal complex is $\geq 5$ g/l, preferably $\geq 7.5$ g/l and more preferably $\geq 10$ g/l and the solubility of the organic semiconductor is $\geq 10$ g/l, preferably $\geq 15$ g/l and more preferably $\geq 20$ g/l.

For the purposes of this application, the solubility of a material in a solvent is taken to mean the highest material-to-solvent ratio in which the solution at room temperature (at about 20° C.), is clear and stays clear for at least several hours, preferably for at least 5 hours.

The solubility is given in grams per liter (g/l) and is determined according to the following method:
(1) A known amount of the solvent (for example 100 mL) is put in a container;
(2) A defined amount of the material is added and the mixture is stirred with a magnetic stirring bar;
(4) Step (2) is repeated until some of the material does not dissolve despite a vigorous and prolonged stirring.

Suitable organic solvents according to the invention comprise ketones, esters, amides, sulphur compounds, nitro compounds, halogenated hydrocarbons and hydrocarbons.

The proportion of the organic solvent in the formulation according to the invention is preferably at least 60% by weight, preferably at least 70% by weight and more preferably at least 80% by weight, based on the total weight of the formulation.

In a further preferred embodiment, the organic solvent may comprise a first organic solvent and a second organic solvent.

In a preferred embodiment, the first organic solvent of the present invention may has a boiling point of from 100° C. to 300° C., preferably from 105° C. to 290° C., and more preferably from 110° C. to 280° C.

Suitable solvents that can be used as a first solvent according to the invention are for example Benzonitrile, Dimethylformamide, Dimethyl sulfoxide, Toluene, Anisole, Xylene, Chlorbenzene and mixtures thereof. Preferably, the proportion of the first solvent according to the invention is at least 70% by weight, preferably at least 80% by weight, very preferably 85% by weight and most preferably at least 90% by weight, based on the total weight of the organic solvent.

In another preferred embodiment, the second organic solvent of the invention may have a boiling point of from 40° C. to 100° C., preferably 45° C. to 95° C., and most preferably 50° C. to 90° C.

Suitable solvents that can be used as a second solvent according to the invention are for example Tetrahydrofurane, Hexafluorobenzene, Acetonitrile, Acetone, Methanol, Ethylene glycol dimethyl ether and mixtures thereof.

Preferably, the proportion of the second organic solvent according to the invention is less than 30% by weight, preferably less than 20% by weight, very preferably less than 15% by weight and most preferably less then 10% by weight, based on the total weight of the organic solvent.

In a still further preferred embodiment, the organic solvent of the present invention comprises at least two solvents, wherein a first solvent has a boiling point of from 100° C. to 300° C., preferably from 105° C. to 290° C., and more preferably from 110° C. to 280° C. and a second solvent has a boiling point of from 40° C. to 100° C., preferably 45° C. to 95° C., and most preferably 50° C. to 90° C. It is further preferred that the difference between the boiling point of the first solvent and of the second solvent is at least 10° C.

In a very particularly preferred embodiment, the first solvent is chosen from Benzonitrile, Dimethylformamide, Dimethyl sulfoxide, Toluene, Anisole, Xylene or Chlorbenzene and mixtures thereof, preferably Toluene and the second solvent is chosen from Tetrahydrofurane, Hexafluorobenzene, Acetonitrile, Acetone, Methanol or Ethylene glycol dimethyl ether and mixture thereof, preferably Tetrahydrofurane.

Advantageously, the weight ratio of the first solvent to the second solvent in the formulation of the invention is from 100:1 to 1:1, preferably from 50:1 to 5:1, more preferably from 15:1 to 8:1 and most preferably from 10:1 to 9:1.

Formulations according to the present invention comprise at least one organic semiconductor.

A suitable organic semiconductor according to the invention may preferably be a hole-transport material (HTM) and/or a hole-injection material (HIM). Hole-injection materials simplify or facilitate the transfer of holes, i.e. positive charges, from the anode into an organic layer. Hole-transport materials are capable of transporting holes, i.e. positive charges, which are generally injected from the anode or an adjacent layer, for example a hole-injection layer.

These materials are frequently described via the properties of the frontier orbitals, which are described in greater detail below. Molecular orbitals, in particular also the highest occupied molecular orbital (HOMO) and the lowest unoccupied molecular orbital (LUMO), their energy levels and the energy of the lowest triplet state $T_1$ or of the lowest excited singlet state $S_1$ of the materials are determined via quantum-chemical calculations. In order to calculate organic substances without metals, firstly a geometry optimisation is carried out using the "Ground State/Semi-empirical/Default Spin/AM1/Charge 0/Spin Singlet" method. An energy calculation is subsequently carried out on the basis of the optimised geometry. The "TD-SCF/DFT/Default Spin/B3PW91" method with the "6-31G(d)" base set (charge 0, spin singlet) is used here. For metal-containing compounds, the geometry is optimised via the "Ground State/Hartree-Fock/Default Spin/LanL2 MB/Charge 0/Spin Singlet" method. The energy calculation is carried out analogously to the above-described method for the organic substances, with the difference that the "LanL2DZ" base set is used for the metal atom and the "6-31G(d)" base set is used for the ligands. The energy calculation gives the HOMO energy level HEh or LUMO energy level LEh in hartree units. The HOMO and LUMO energy levels in electron volts calibrated with reference to cyclic voltammetry measurements are determined therefrom as follows:

HOMO(eV)=((HEh*27.212)−0.9899)/1.1206

LUMO(eV)=((LEh*27.212)−2.0041)/1.385

For the purposes of this application, these values are to be regarded as HOMO and LUMO energy levels respectively of the materials.

The lowest triplet state $T_1$ is defined as the energy of the triplet state having the lowest energy which arises from the quantum-chemical calculation described.

The lowest excited singlet state $S_1$ is defined as the energy of the excited singlet state having the lowest energy which arises from the quantum-chemical calculation described.

The method described herein is independent of the software package used and always gives the same results. Examples of frequently used programs for this purpose are "Gaussian09 W" (Gaussian Inc.) and Q-Chem 4.1 (Q-Chem, Inc.).

In general, a hole-injection material has an HOMO level which is in the region of or above the level of the anode, i.e. in general is at least −5.3 eV. A hole-transport material generally has a high HOMO level of preferably at least −5.4 eV. Depending on the structure of an electronic device, it may also be possible to employ a hole-transport material as hole-injection material.

Preferred hole-injection materials and/or hole-transport materials include, for example, triarylamine, benzidine, tetraaryl-para-phenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital).

The hole-injection and/or hole-transport material according to the invention can be a compound having a low molecular weight or a polymer, where the hole-injection material and/or hole-transport material may also be in the form of a mixture. Thus, the formulations according to the invention may comprise two compounds as hole-injection material and/or hole-transport material having a low molecular weight, one compound having a low molecular weight and one polymer or two polymers (blend).

In a first preferred embodiment, the organic semiconductor according to the invention is a polymer.

According to the invention, a polymer is a polymer compound, or an oligomer compound or a dendrimer. A polymer compound according to the invention preferably has 10 to 10000, more preferably 10 to 5000 and most preferably 10 to 2000 structural units (i.e. repetitive units). An oligomer compound according to the invention preferably has 3 to 9 structural units. The branching factor of the polymer is between 0 (linear polymer, no branching) and 1 (polymer completely branched).

Polymers according to the invention have a molecular weight (Mw) in the range of 10,000 to 2,000,000 g/mol, preferably in the range of 50,000 to 1,500,000 g/mol, and more preferably in the range of 100,000 to 1,000,000 g/mol. The molecular weight (Mw) is determined by means of GPC (Gel Permeation Chromatography) against an internal polystyrene standard.

Polymers according to the invention are either conjugated, partly conjugated or non-conjugated polymers, preferably conjugated or partly conjugated.

Preferably, the polymer comprises a structural unit, which is a triarylamine unit having three aromatic or heteroaromatic ring systems $Ar^1$, $Ar^2$, $Ar^3$, wherein at least one of $Ar^1$, $Ar^2$, $Ar^3$ is substituted by $Ar^4$ in at least one, preferably in one of the two ortho positions, where $Ar^4$ is a mono- or polycyclic, aromatic or heteroaromatic ring system having 5 to 60 aromatic ring atoms, which may be substituted by one or more radicals R.

More preferably, the triarylamine unit has the following formula (I):

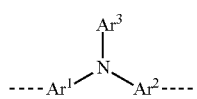
(I)

where
  $Ar^1$ to $Ar^3$ is on each occurrence, in each case identically or differently, a mono- or polycyclic, aromatic or heteroaromatic ring system having 5 to 60 aromatic ring atoms, which may be substituted by one or more radicals R;
  R is on each occurrence, identically or differently, H, D, F, Cl, Br, I, $N(R^1)_2$, CN, $NO_2$, $S_1(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^1$, where one or more non-adjacent $CH_2$ groups may be replaced by $R^1C=CR^1$, $C\equiv C$, $S_1(R^1)_2$, $C=O$, $C=S$, $C=NR^1$, $P(=O)(R^1)$, SO, $SO_2$, $NR^1$, O, S or $CONR^1$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$, or a crosslinkable group Q, where two or more radicals R may also form a mono- or polycyclic, aliphatic, aromatic and/or benzo-fused ring system with one another;
  $R^1$ is on each occurrence, identically or differently, H, D, F or an aliphatic hydrocarbon radical having 1 to 20 C atoms, an aromatic and/or a heteroaromatic hydrocarbon radical having 5 to 20 C atoms, in which, in addition, one or more H atoms may be replaced by F; where two or more substituents $R^1$ may also form a mono- or polycyclic, aliphatic or aromatic ring system with one another; and the dashed lines represent bonds to adjacent structural units in the polymer, and where at least one of $Ar^1$, $Ar^2$ and/or $Ar^3$ is substituted by a radical R comprising at least 2 C atoms, preferably at least 4 C atoms and more preferably at least 6 C atoms. Advantageously, R exhibit a C=C-Doppelbond or R is a part of a mono- or polycyclic, aromatic or heteroaromatic ring system with 5 to 60 aromatic ring atoms.

In a preferred embodiment, $Ar^3$ according to formula (I) is in at least one, preferably in one of the two ortho-positions relating to the Nitrogen atom represented in formula (I), substituted by $Ar^4$, where $Ar^4$ is a mono- or polycyclic, aromatic or heteroaromatic ring system with 5 to 60 aromatic ring atoms, which may be substituted by one or more radical R, where R can adopt the meanings indicated above.

$Ar^4$ here may either be linked directly, i.e. via a single bond, to $Ar^3$, or alternatively via a linking group X.

The compound of formula (I) thus preferably has the following formula (Ia).

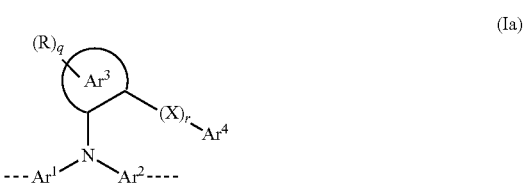
(Ia)

where $Ar^1$, $Ar^2$, $Ar^3$, $Ar^4$ and R can adopt the meanings indicated above,
q=0, 1, 2, 3, 4, 5 or 6, preferably 0, 1, 2, 3 or 4,
X=$CR_2$, NR, $SiR_2$, O, S, C=O or P=O, preferably $CR_2$, NR, O or S, and
r=0 or 1, preferably 0.

According to the invention, structural units of formula (I) can be comprised In the main chain or in the side chain. Structural units of formula (I) are preferably comprised in the main chain of the polymer. When present in the side chain, structural units of formula (I) are either mono- or bivalent, i.e. they either exhibit one or two bonds to the adjacent structural units in the polymer.

The term "mono- or polycyclic, aromatic ring system" in the present application is taken to mean an aromatic ring system having 6 to 60, preferably 6 to 30 and particularly preferably 6 to 24 aromatic ring atoms, which does not necessarily contain only aromatic groups, but instead in which a plurality of aromatic units may also be interrupted by a short non-aromatic unit (<10% of the atoms other than H, preferably <5% of the atoms other than H), such as, for example, an $sp^3$-hybridised C atom or O or N atom, a CO group, etc. Thus, for example, systems such as, for example, 9,9'-spirobifluorene, 9,9-diarylfluorene and 9,9-dialkylfluorene are also intended to be taken to be aromatic ring systems.

The aromatic ring systems may be mono- or polycyclic, i.e. they may contain one ring (for example phenyl) or a plurality of rings, which may also be condensed (for example naphthyl) or covalently linked (for example biphenyl), or contain a combination of condensed and linked rings.

Preferred aromatic ring systems are, for example, phenyl, biphenyl, terphenyl, [1,1':3',1"]terphenyl-2'-yl, quaterphenyl, naphthyl, anthracene, binaphthyl, phenanthrene, dihydrophenanthrene, pyrene, dihydropyrene, chrysene, perylene, tetracene, pentacene, benzopyrene, fluorene, indene, indenofluorene and spirobifluorene.

The term "mono- or polycyclic, heteroaromatic ring system" in the present application is taken to mean an aromatic ring system having 5 to 60, preferably 5 to 30 and particularly preferably 5 to 24 aromatic ring atoms, where one or more of these atoms is (are) a heteroatom. The "mono- or polycyclic, heteroaromatic ring system" does not necessarily contain only aromatic groups, but instead may also be interrupted by a short non-aromatic unit (<10% of the atoms other than H, preferably <5% of the atoms other than H), such as, for example, an $sp^3$-hybridised C atom or O or N atom, a CO group, etc.

The heteroaromatic ring systems may be mono- or polycyclic, i.e. they may contain one ring or a plurality of rings, which may also be condensed or covalently linked (for example pyridylphenyl), or contain a combination of condensed and linked rings. Preference is given to fully conjugated heteroaryl groups.

Preferred heteroaromatic ring systems are, for example, 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or groups having a plurality of rings, such as carbazole, indenocarbazole, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazothiophene or combinations of these groups.

The mono- or polycyclic, aromatic or heteroaromatic ring system may be unsubstituted or substituted. Substituted in the present application means that the mono- or polycyclic, aromatic or heteroaromatic ring system contains one or more substituents R.

R is on each occurrence preferably, identically or differently, H, D, F, Cl, Br, I, $N(R^1)_2$, CN, $NO_2$, $S_1(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 C atoms or an alkenyl or alkynyl group having 2 to 40 C atoms or a branched or cyclic alkyl, alkoxy or thioalkoxy group having 3 to 40 C atoms, each of which may be substituted by one or more radicals $R^1$, where one or more non-adjacent $CH_2$ groups may be replaced by $R^1C=CR^1$, $C≡C$, $S_1(R^1)_2$, $C=O$, $C=S$, $C=NR^1$, $P(=O)(R^1)$, SO, $SO_2$, $NR^1$, O, S or $CONR^1$ and where one or more H atoms may be replaced by D, F, Cl, Br, I or CN, or an aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$, or a crosslinkable group Q; two or more radicals R here may also form a mono- or polycyclic, aliphatic, aromatic and/or benzo-fused ring system with one another.

R is on each occurrence particularly preferably, identically or differently, H, D, F, Cl, Br, I, $N(R^1)_2$, $S_1(R^1)_3$, $B(OR^1)_2$, $C(=O)R^1$, $P(=O)(R^1)_2$, a straight-chain alkyl or alkoxy group having 1 to 20 C atoms or an alkenyl or alkynyl group having 2 to 20 C atoms or a branched or cyclic alkyl or alkoxy group having 3 to 20 C atoms, each of which may be substituted by one or more radicals $R^1$, where one or more non-adjacent $CH_2$ groups may be replaced by $R^1C=CR^1$, $C≡C$, $S_1(R^1)_2$, $C=O$, $C=NR^1$, $P(=O)(R^1)$, $NR^1$, O or $CONR^1$ and where one or more H atoms may be replaced by F, Cl, Br or I, or an aromatic or heteroaromatic ring system having 5 to 30 aromatic ring atoms, which may in each case be substituted by one or more radicals $R^1$, or an aryloxy or heteroaryloxy group having 5 to 30 aromatic ring atoms, which may be substituted by one or more radicals $R^1$, or an aralkyl or heteroaralkyl group having 5 to 30 aromatic ring atoms, which may be substituted by one or more radicals $R^1$, or a diarylamino group, diheteroarylamino group or arylheteroarylamino group having 10 to 20 aromatic ring atoms, which may be substituted by one or more radicals $R^1$, or a crosslinkable group Q; two or more radicals R here may also form a mono- or polycyclic, aliphatic, aromatic and/or benzo-fused ring system with one another.

R is on each occurrence very particularly preferably, identically or differently, H, a straight-chain alkyl or alkoxy group having 1 to 10 C atoms or an alkenyl or alkynyl group having 2 to 10 C atoms or a branched or cyclic alkyl or alkoxy group having 3 to 10 C atoms, each of which may be substituted by one or more radicals $R^1$, where one or more non-adjacent $CH_2$ groups may be replaced by $R^1C=CR^1$, $C≡C$, $C=O$, $C=NR^1$, $NR^1$, O or $CONR^1$, or an aromatic or heteroaromatic ring system having 5 to 20 aromatic ring atoms, which may in each case be substituted by one or more radicals $R^1$, or an aryloxy or heteroaryloxy group having 5 to 20 aromatic ring atoms, which may be substituted by one or more radicals $R^1$, or an aralkyl or heteroaralkyl group having 5 to 20 aromatic ring atoms, which may be substituted by one or more radicals $R^1$, or a diarylamino group, diheteroarylamino group or arylheteroarylamino group having 10 to 20 aromatic ring atoms, which may be substituted by one or more radicals $R^1$, or a crosslinkable group Q; two or more radicals R here may also form a mono- or polycyclic, aliphatic, aromatic and/or benzo-fused ring system with one another.

In another preferred embodiment of the present invention, the compound of formula (I) is characterised in that $Ar^3$ is substituted by $Ar^4$ in one of the two ortho positions, and $Ar^3$ is additionally linked to $Ar^4$ in the meta position that is adjacent to the substituted ortho position.

The compound of formula (I) thus preferably has the following formula (Ib):

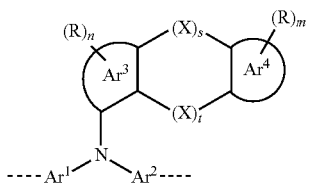

(Ib)

where $Ar^1$, $Ar^2$, $Ar^3$, $Ar^4$ and R can adopt the meanings indicated above,
m=0, 1, 2, 3 or 4,
n=0, 1, 2 or 3,
X=$CR_2$, NR, $SiR_2$, O, S, C=O or P=O, preferably $CR_2$, NR, O or S, and
s and t are each 0 or 1, where the sum (s+t)=1 or 2, preferably 1.

In a first more preferred embodiment, the compound of formula (I) is selected from the following formulae (II), (III) and (IV):

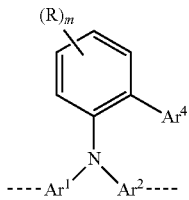

(II)

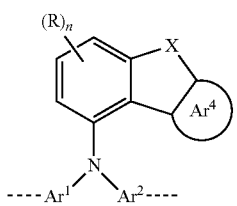

(III)

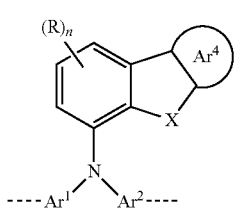

(IV)

where $Ar^1$, $Ar^2$, Ar and R can adopt the meanings indicated above,
m=0, 1, 2, 3 or 4,
n=0, 1, 2 or 3, and
X=$CR_2$, NR, $SiR_2$, O, S, C=O or P=O, preferably $CR_2$, NR, O or S.

In a particularly preferred embodiment, the compound of formula (II) is selected from the following formula (V):

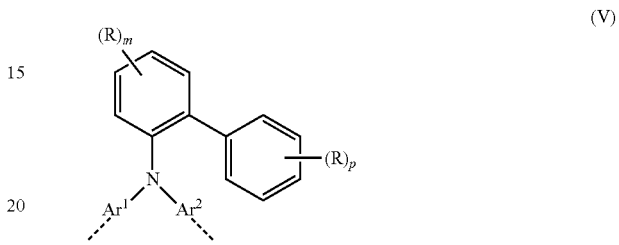

(V)

where $Ar^1$, $Ar^2$, R and m can adopt the meanings indicated above, and
p=0, 1, 2, 3, 4 or 5.

Examples of preferred structural units of formula (V) are depicted in the following table:

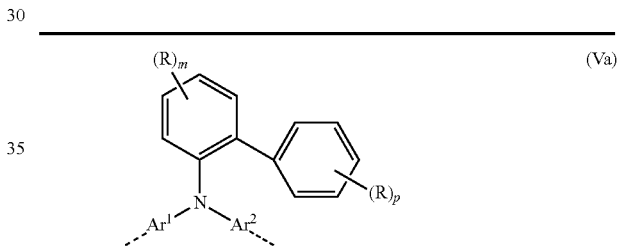

(Va)

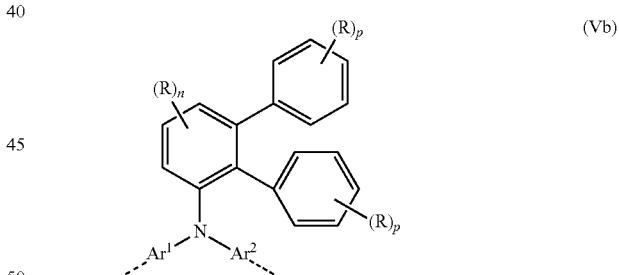

(Vb)

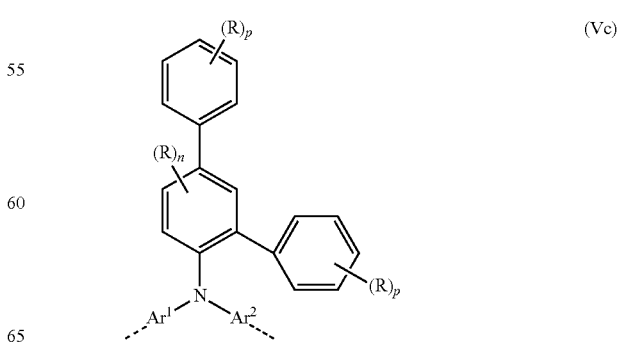

(Vc)

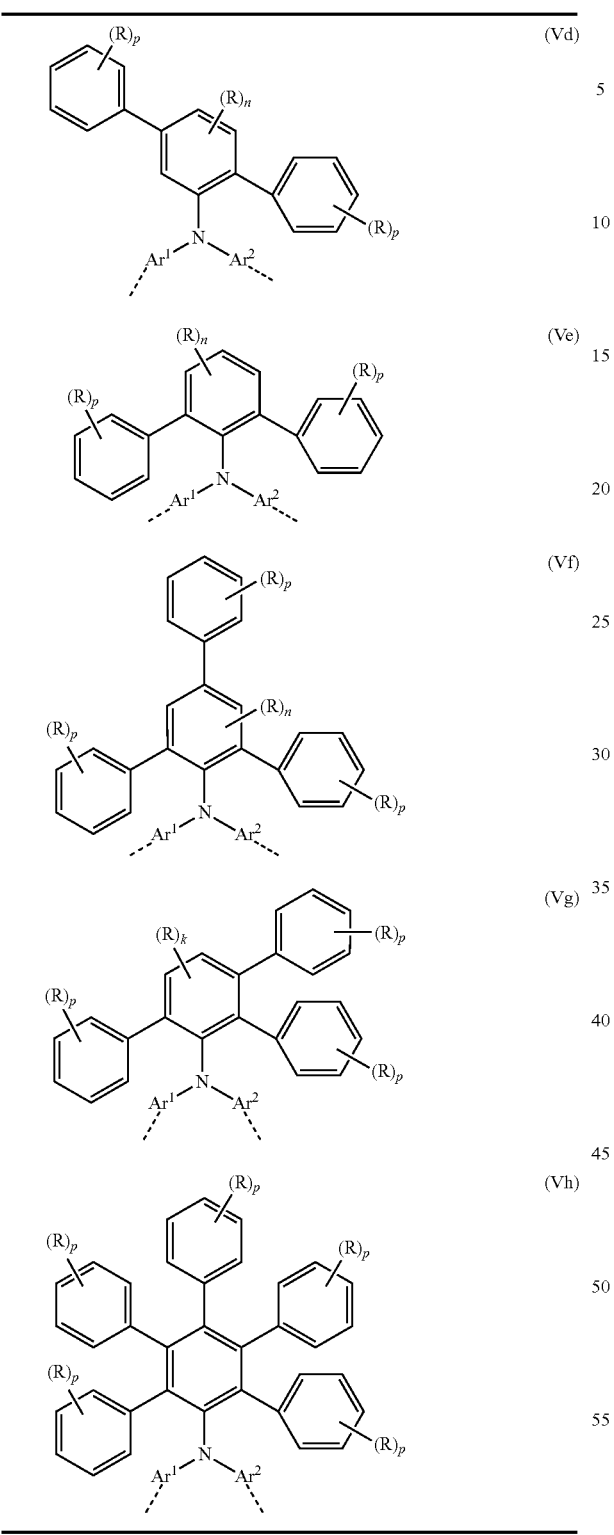
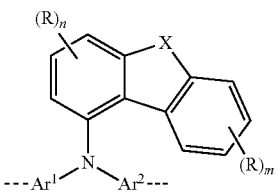
where Ar¹, Ar², R, m and n can adopt the meanings indicated above.
Examples of preferred structural units of formula (VI) are depicted in the following table:
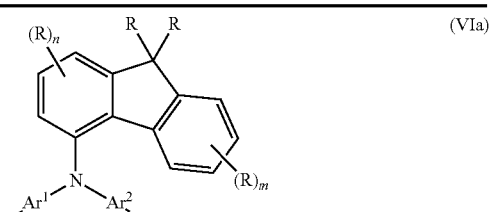
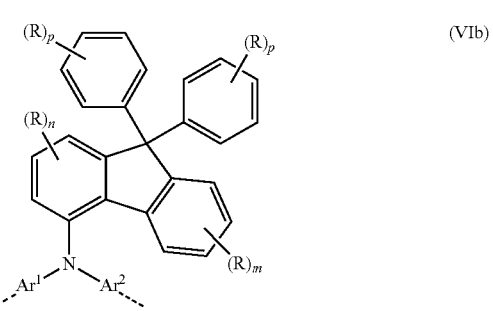
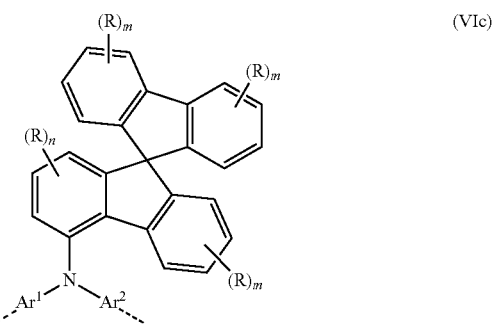
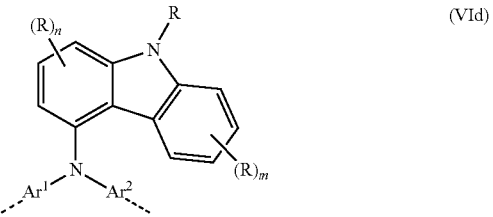
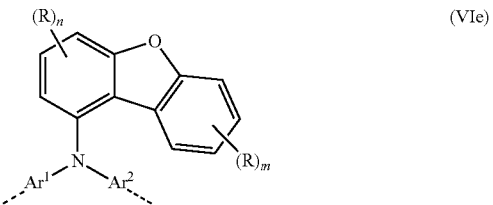
where Ar¹, Ar², R, m, n and p can adopt the meanings indicated above, and
k=0, 1 or 2.
In a further particularly preferred embodiment, the compound of formula (III) is selected from the following formula (VI):

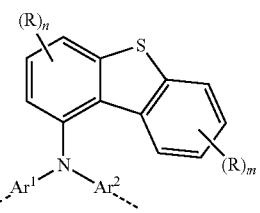

(VIf)

where Ar¹, Ar², R, m, n and p can adopt the meanings indicated above.

In still a further particularly preferred embodiment, the compound of formula (IV) is selected from the following formula (VII):

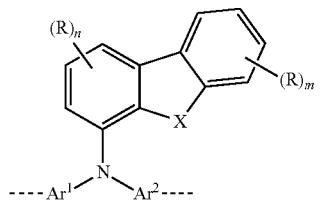

(VII)

where Ar¹, Ar², R, m and n can adopt the meanings indicated above.

Examples of preferred structural units of formula (VII) are depicted in the following table:

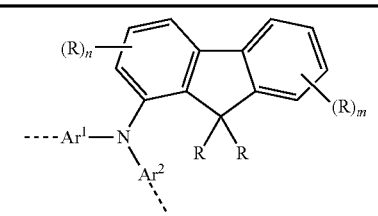

(VIIa)

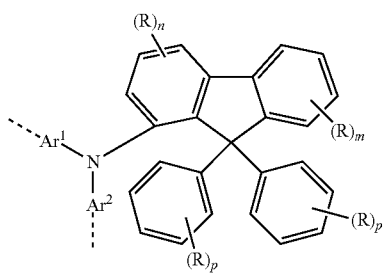

(VIIb)

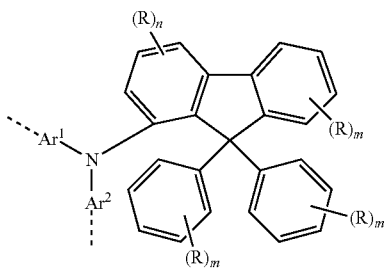

(VIIc)

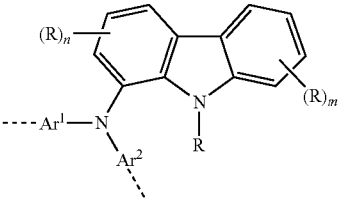

(VIId)

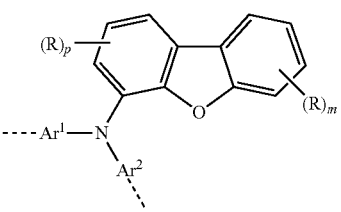

(VIIe)

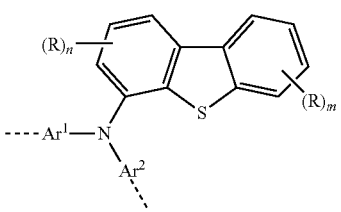

(VIIf)

where Ar¹, Ar², R, m, n and p can adopt the meanings indicated above.

In a very particularly preferred embodiment, the compound of formula (V) is selected from the following formula (Vg):

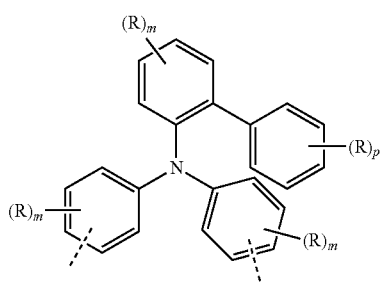

(Vg)

where R, m and p can adopt the meanings indicated above.

Examples of preferred structural units of formula (Vg) are depicted in the following table:

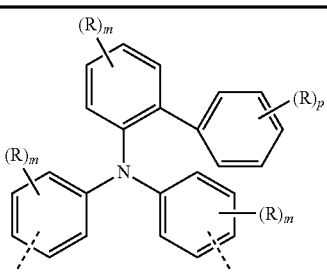

(Vg-1)

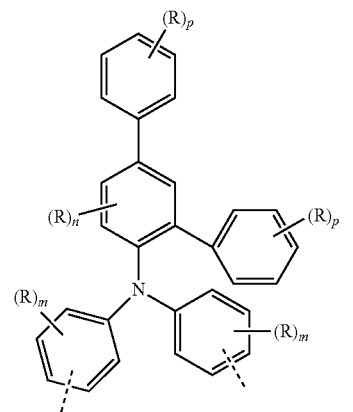 (Vg-2)
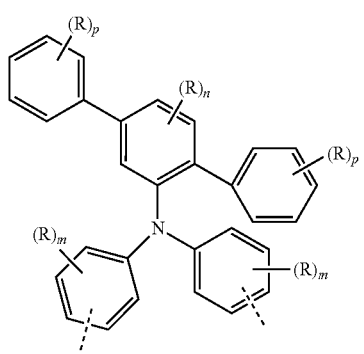 (Vg-3)
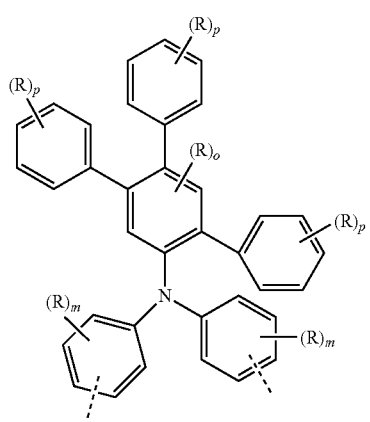 (Vg-4)
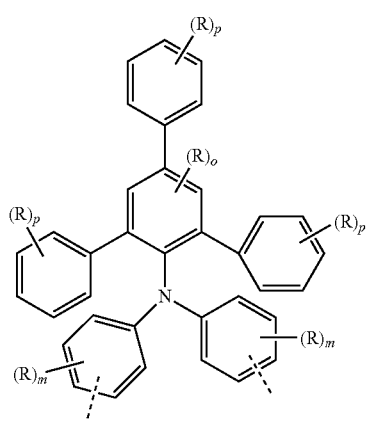 (Vg-5)
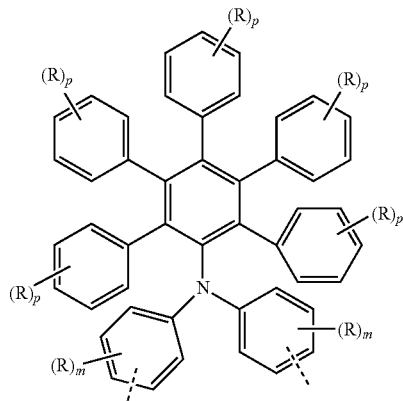 (Vg-6)
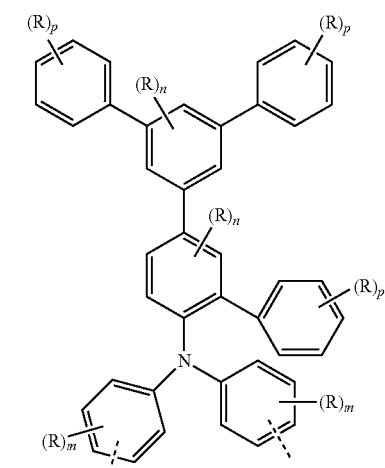 (Vg-7)
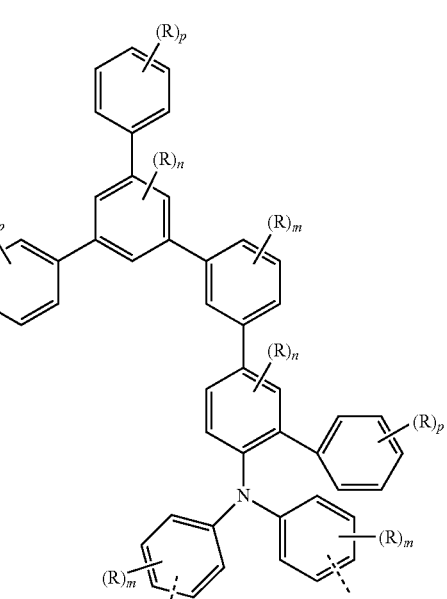 (Vg-8)
where R, k, m, n and p can adopt the meanings indicated above and o is 0, 1 or 2
In a further very particularly preferred embodiment, the compound of formula (VI) is selected from the following formula (VIg):

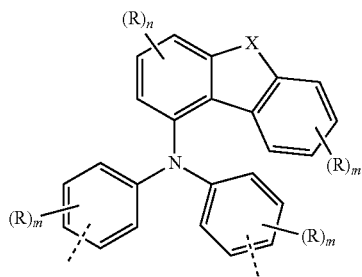

(VIg)

where R, X, m and n can adopt the meanings indicated above.

Examples of preferred structural units of formula (IX) are depicted in the following table:

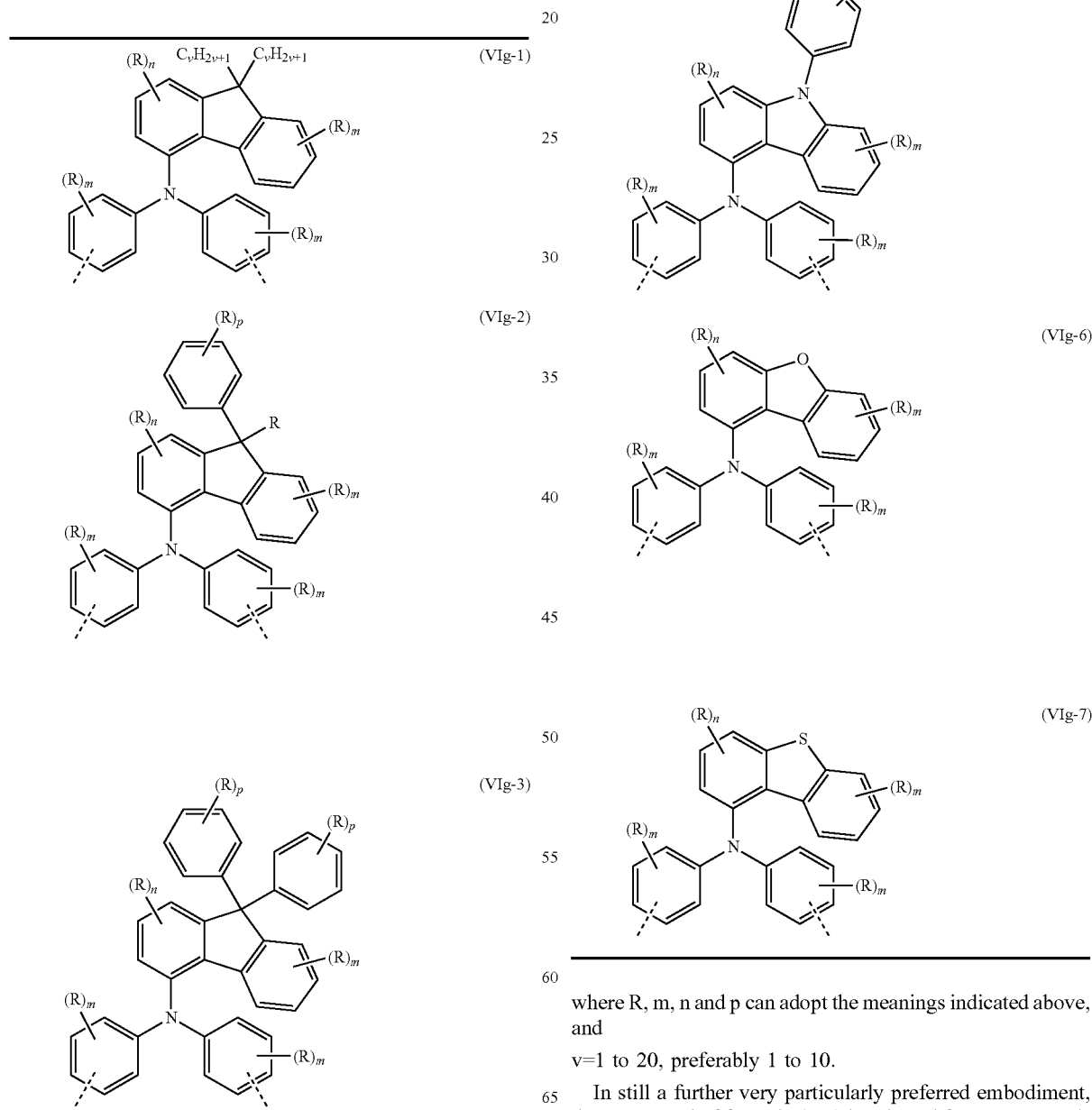

where R, m, n and p can adopt the meanings indicated above, and v=1 to 20, preferably 1 to 10.

In still a further very particularly preferred embodiment, the compound of formula (VII) is selected from compounds of the following formula (VIIg):

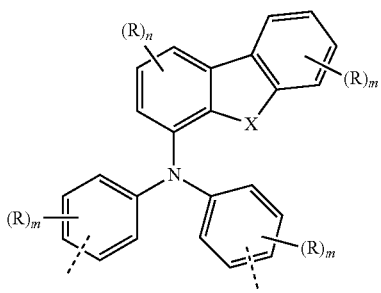

(VIIg)

where R, X, m and n can adopt the meanings indicated above.

Examples of preferred structural units of formula (VIIg) are depicted in the following table:

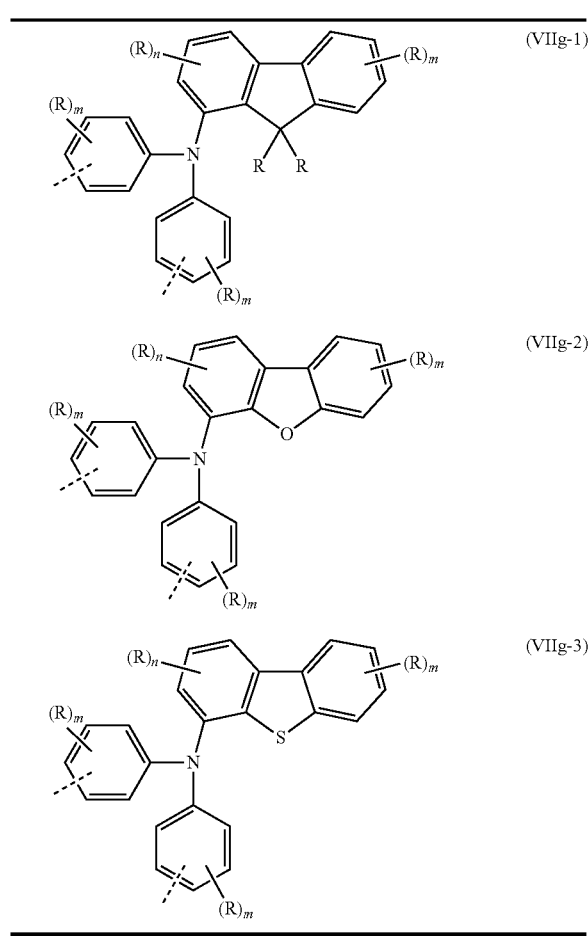

where R, m and n can adopt the meanings indicated above.

In formulae (Ia), (Ib), (II), (III), (IV), (V) and preferred compound of formula (V), (VI) and preferred compounds of formula (VI), (VII) and preferred compounds of formula (VII), (Vg) and preferred compounds of formula (Vg), (VIg) and preferred compounds of formula (VIg), (VIIg) and preferred compounds of formula (VIIg), the dashed lines represent bonds to adjacent structural units in the polymer. They can be, independently from each other, identically or differently, in ortho-, meta- or para-position, preferably identically in ortho-, meta- or para-position, more preferably in meta- or para-position and most preferably in para-position.

According to an alternative preferred embodiment of the invention, the polymer comprises at least one structural unit of formula (I), selected from structural units of the following formula (VIIIa):

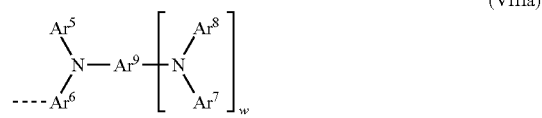

(VIIIa)

or from structural units of the following formula (VIIb):

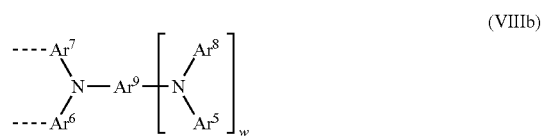

(VIIIb)

where w is 1, 2 or 3, $Ar^5$ to $Ar^9$ is on each occurrence, in each case identically or differently, a mono- or polycyclic, aromatic or heteroaromatic ring system having 5 to 60 aromatic ring atoms, which may be substituted by one or more radicals R; where R can adopt the meaning indicated in formula (I); the dashed lines represent bonds to adjacent structural units in the polymer; and at least one of $Ar^5$ to $Ar^9$ is substituted by a radical R comprising at least 2 C atoms, preferably at least 4 C atoms and more preferably at least 6 C atoms.

At least one of $Ar^5$ and/or $Ar^8$ according to formulae (VIIIa) and/or (VIIIb) is substituted by $Ar^4$ in at least one, preferably in one of the two ortho-positions relating to the Nitrogen atom represented in formula (VIIIa) and/or (VIIIb), where $Ar^4$ is a mono- or polycyclic, aromatic or heteroaromatic ring system having 5 to 60 aromatic ring atoms, which may be substituted by one or more radicals R, where R can adopt the meaning indicated above, in particular for formula (I).

$Ar^4$ here may either be linked directly, i.e. via a single bond, to $Ar^5$ and/or $Ar^8$ according to formulae (VIIIa) and/or (VIIIb) or alternatively via a linking group X.

The structural unit of formula (VIIIa) and/or (VIIIb) is therefore preferably selected from the structures of following formulae (VIIIa-1a), (VIIIa-1b), (VIIIa-1c) and/or (VIIIa-Id).

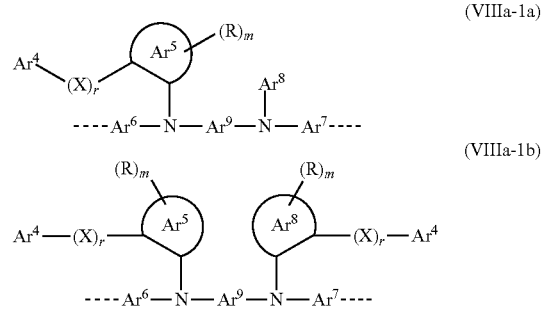

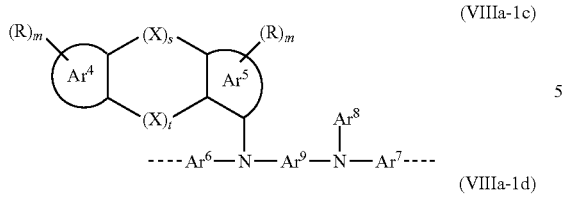
(VIIIa-1c)

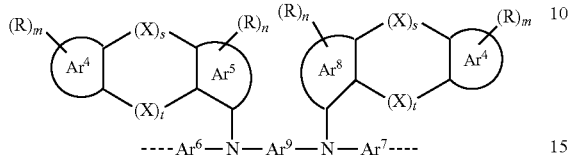
(VIIIa-1d)

where Ar⁴, Ar⁵, Ar⁶, Ar⁷, Ar⁸, Ar⁹, X, m, n, r, s, t and R can adopt the meaning indicated above, in particular for formulae (I), (Ia), (Ib), (VIIIa) and/or (VIIIb).

Moreover, the structural unit of formulae (VIIIa) and/or (VIIIb) can be selected from the structural units of formulae (VIIIb-a), (VIIIb-b), (VIIIb-c) and/or (VIIIb-d).

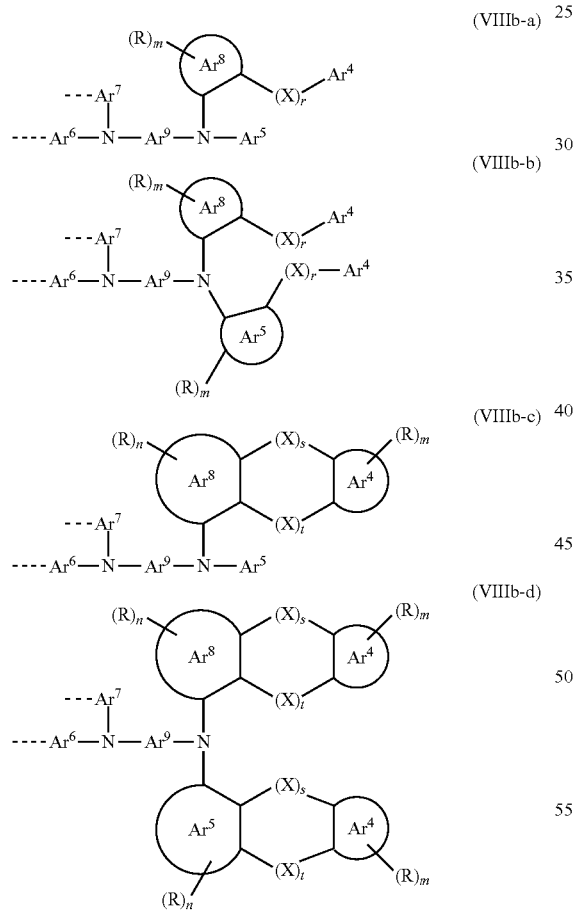

where Ar⁴, Ar⁵, Ar⁶, Ar⁷, Ar⁸, Ar⁹, X, m, n, s, t and R can adopt the meaning indicated above, in particular for formulae (I), (Ia), (Ib), (VIIIa) and/or (VIIIb).

In a preferred embodiment, the at least one structural unit of formula (VIIIa) is selected from the structural units of the following formulae (IX), (X), (XI), (XII), (XIII), (XIV), (XV) and (XVI):

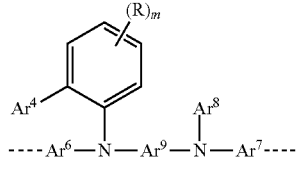
(IX)

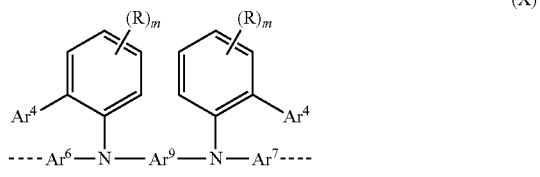
(X)

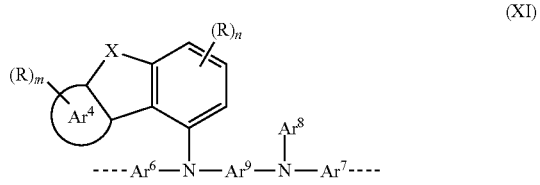
(XI)

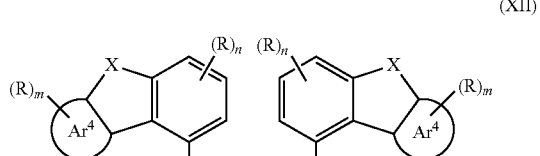
(XII)

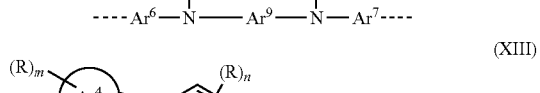
(XIII)

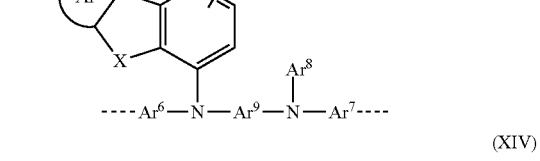
(XIV)

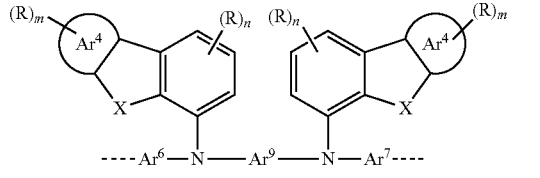
(XV)

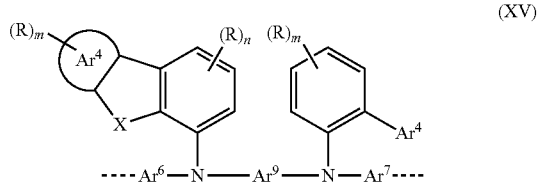
(XVI)

$Ar^4$, $Ar^5$, $Ar^6$, $Ar^7$, $Ar^6$, $Ar^9$, X, m, n, p, R and the dashed lines can adopt the meaning indicated above, in particular for formulae (I), (Ia), (Ib), (VIIIa) and/or (VIIIb).

In a particularly preferred embodiment, the structural units of formulae (IX) and (X) are selected from the structural units of the following formulae (IXa) and (Xa):

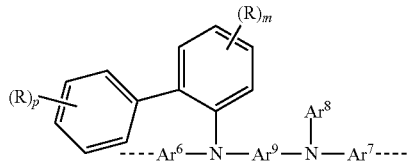
(IXa)

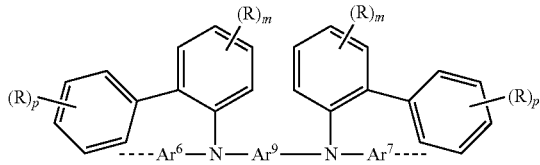
(Xa)

where $Ar^e$, $Ar^7$, Ar, $Ar^9$, R, m, p and the dashed lines can adopt the meaning indicated above, in particular for formulae (I), (Ia), (Ib), (VIIIa) and/or (VIIIb).

Examples of preferred structural units of formulae (IXa) and (Xa) are depicted in the following table:

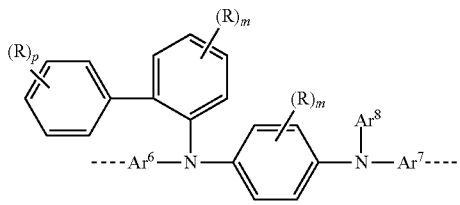

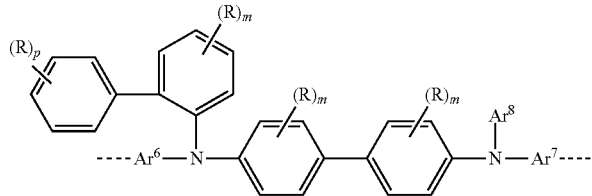

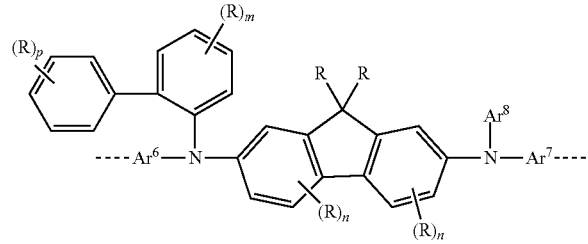

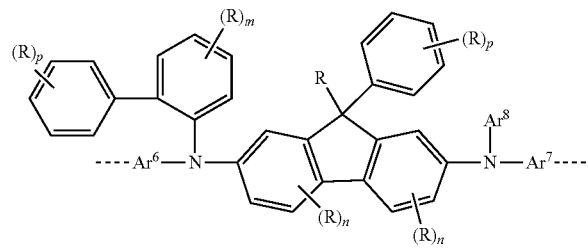

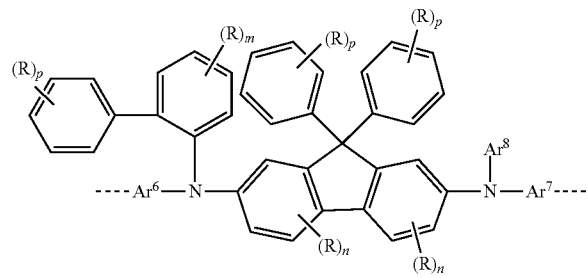

-continued
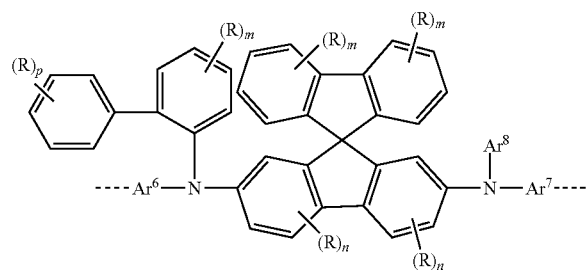
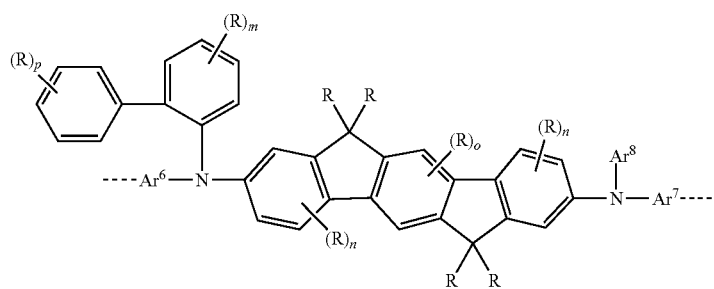
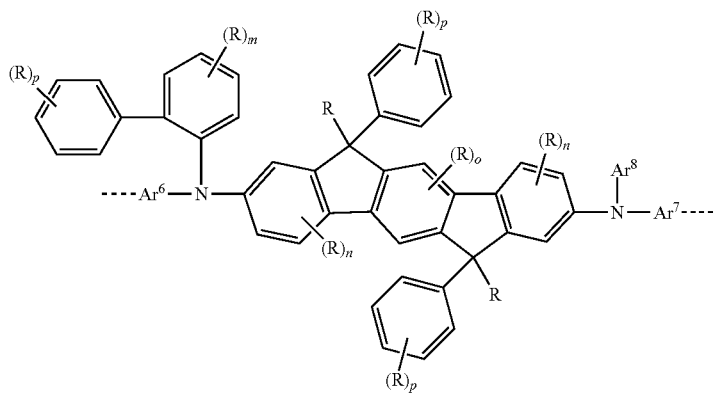
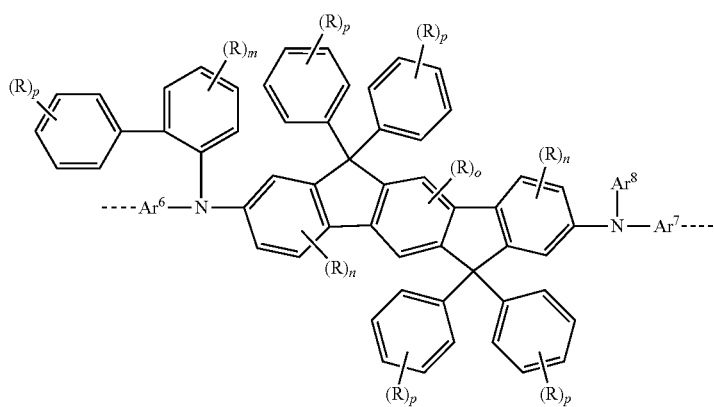

-continued
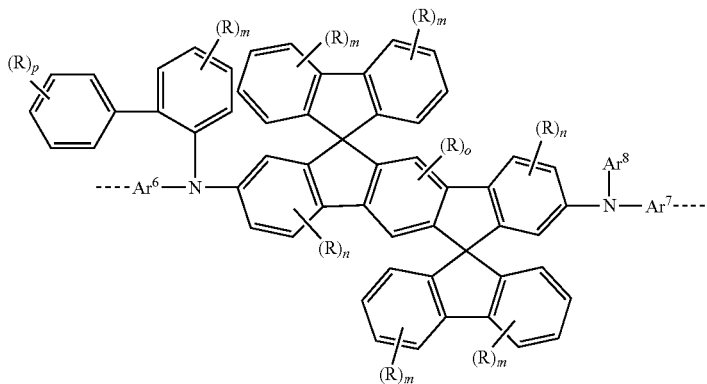
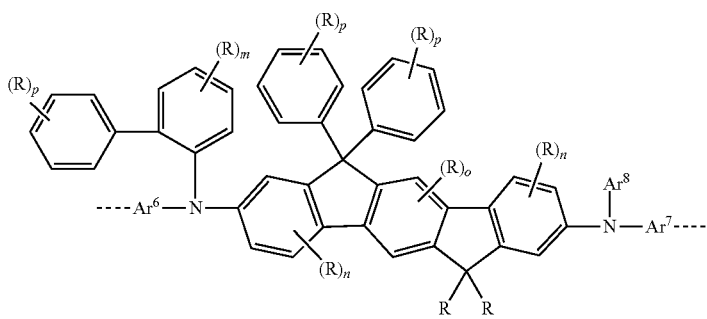
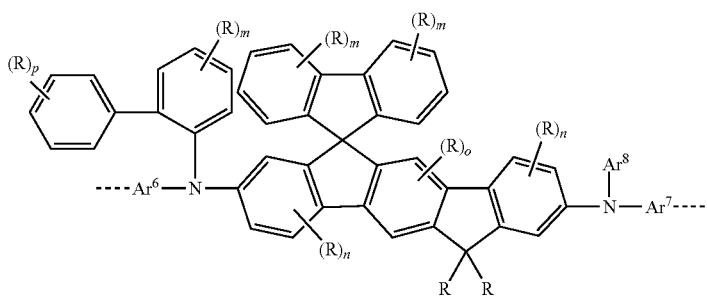
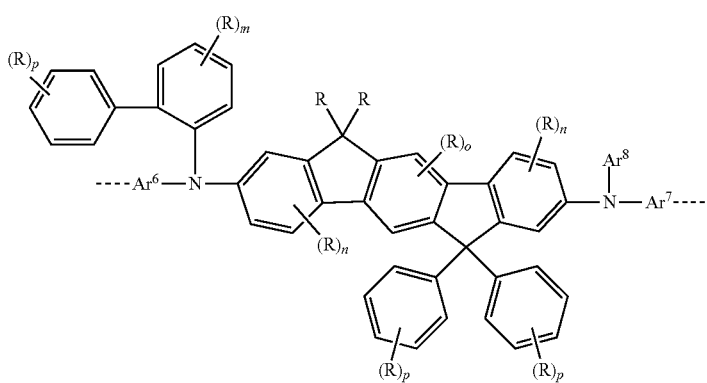

-continued
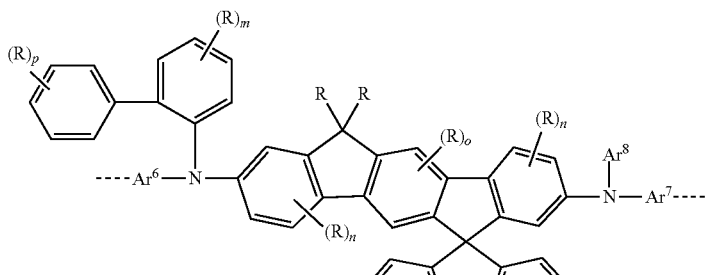
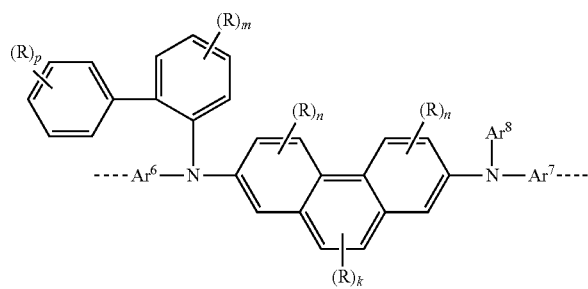
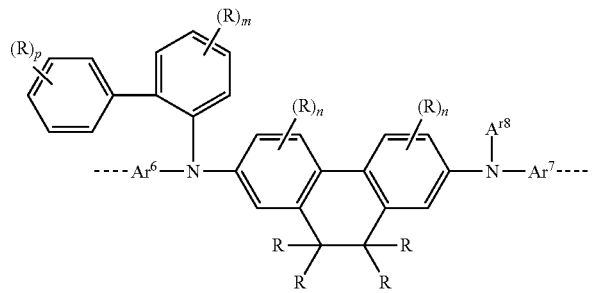
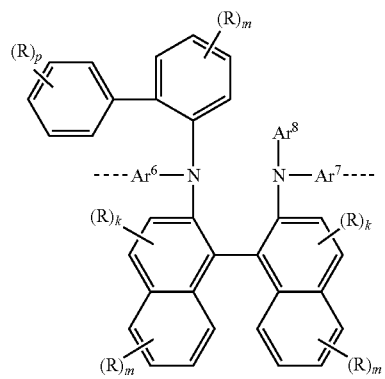
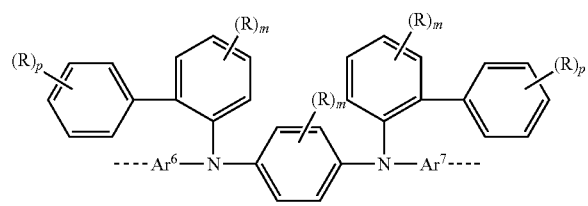

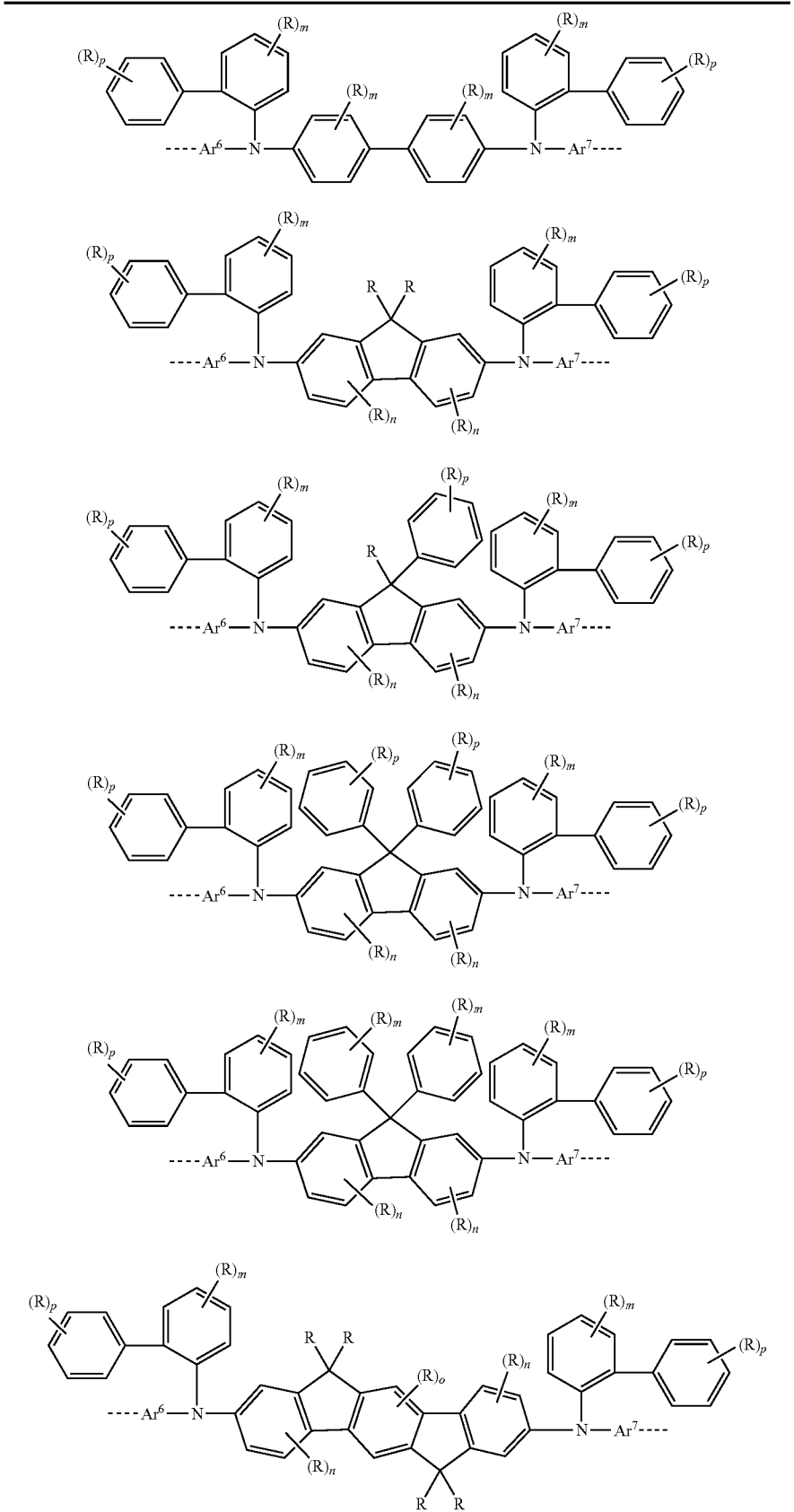

-continued
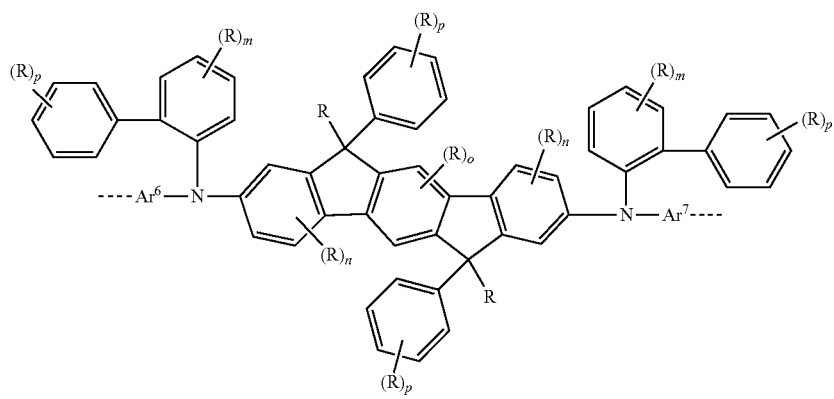
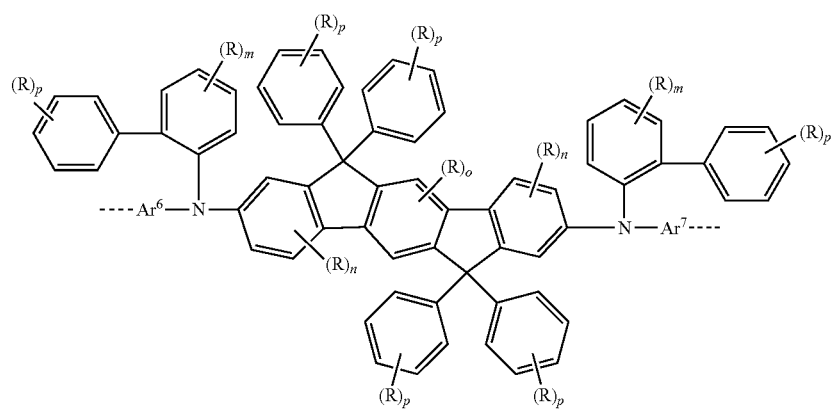
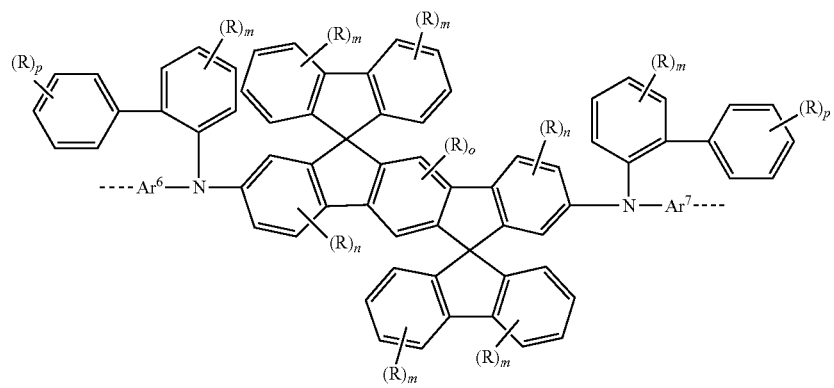
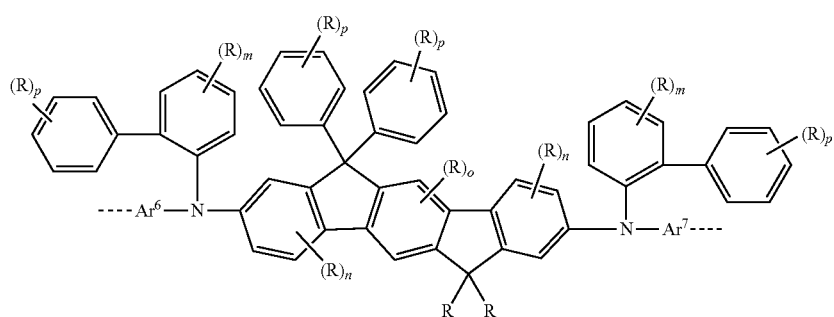

-continued
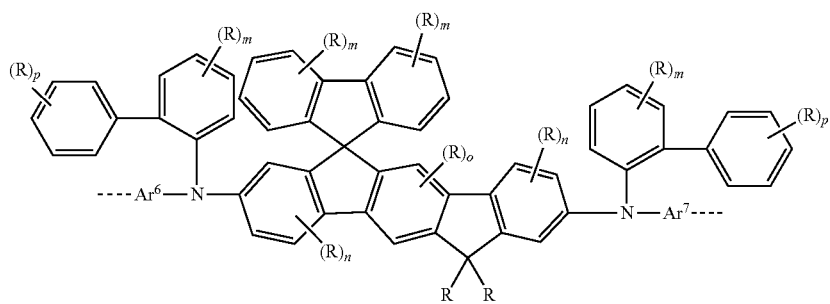
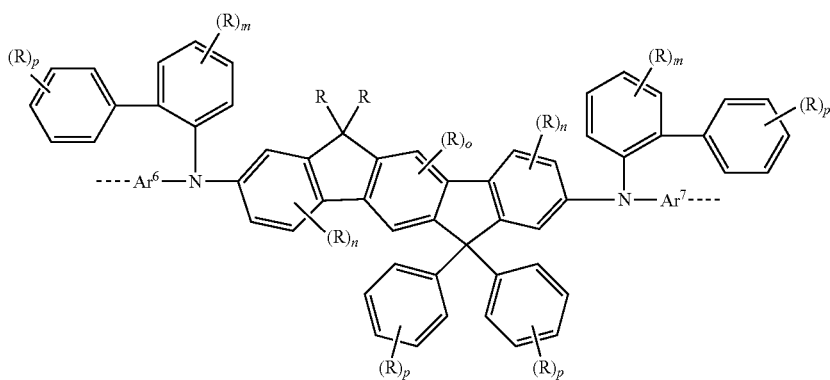
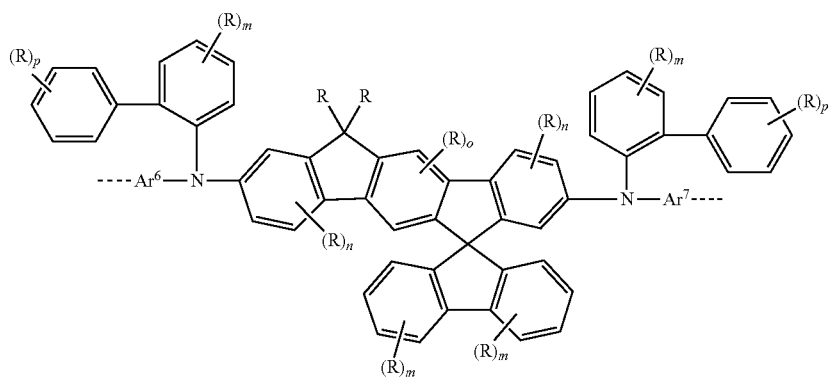
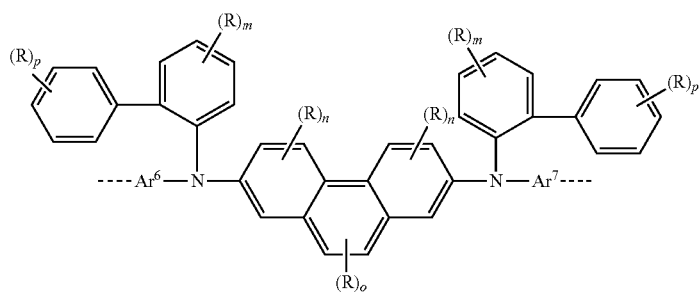

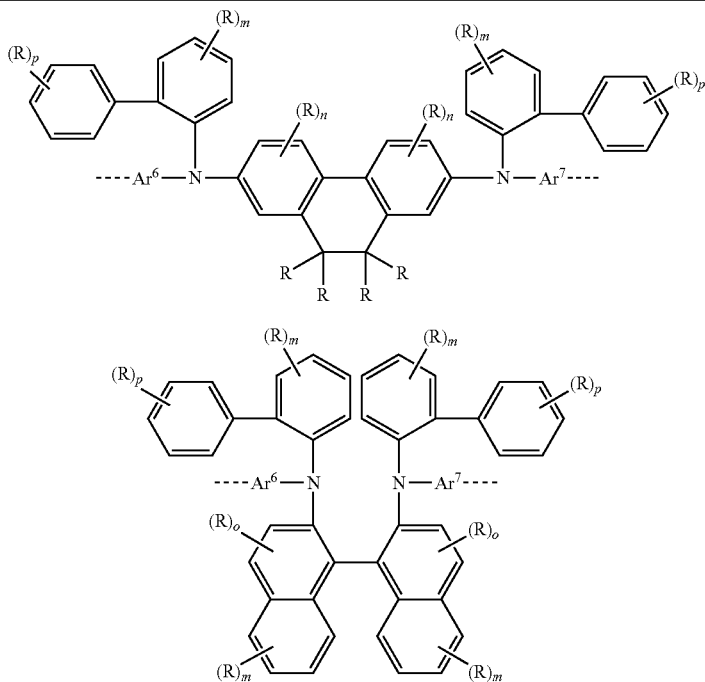

where $Ar^6$, $Ar^7$, $Ar^8$, R, m, n, p and the dashed lines can adopt the meaning indicated above, in particular for formulae (I), (Ia), (Ib), (VIIIa) and/or (VIIIb), and o is 0, 1 or 2.

In a further particularly preferred embodiment, the structural units of formulae (XI) and (XII) are selected from the structural units of the following formulae (XIa) and (XIIa):

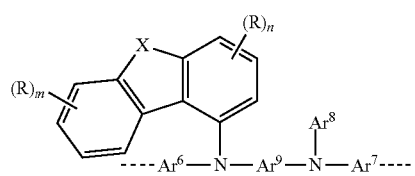

(XIa)

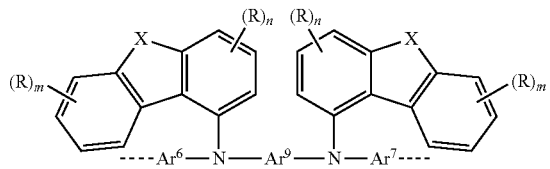

(XIIa)

where $Ar^6$, $Ar^7$, $Ar^8$, $Ar^9$, R, m, n and X can adopt the meaning indicated above, in particular for formulae (I), (Ia), (Ib), (VIIIa) and/or (VIIIb).

Examples of preferred structural units of formulae (XIa) and (XIIa) are depicted in the following table:

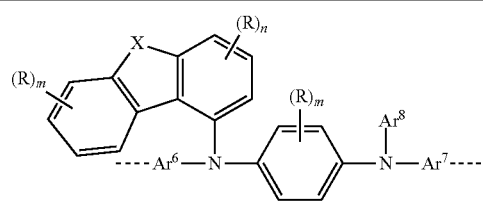

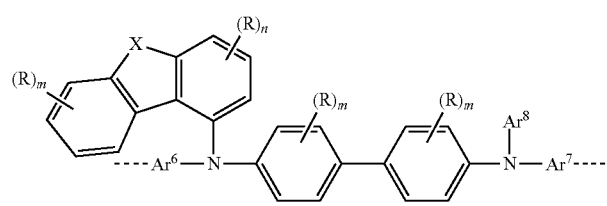

-continued
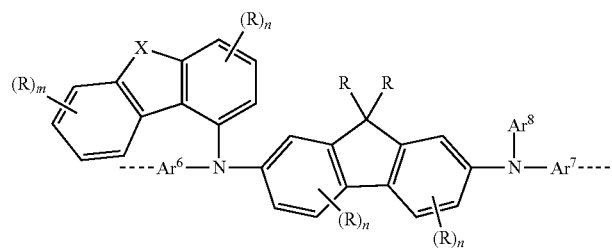
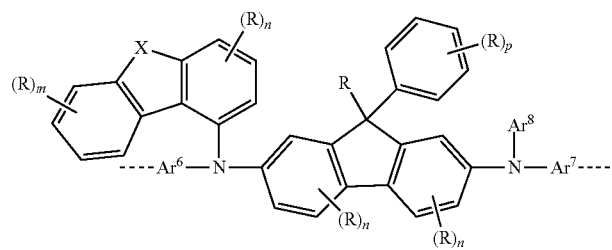
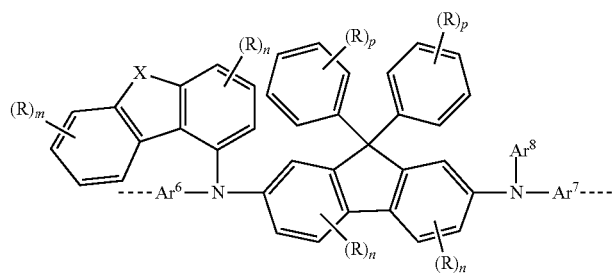
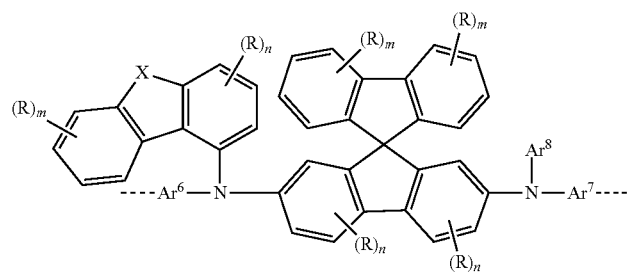
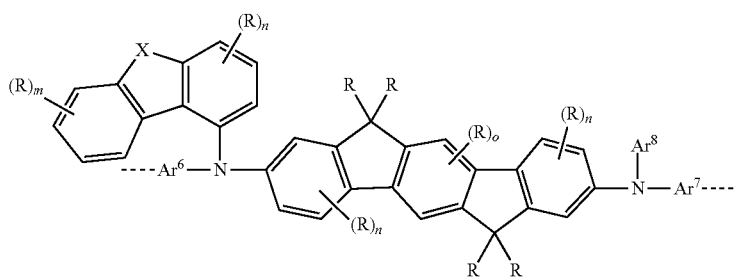

-continued
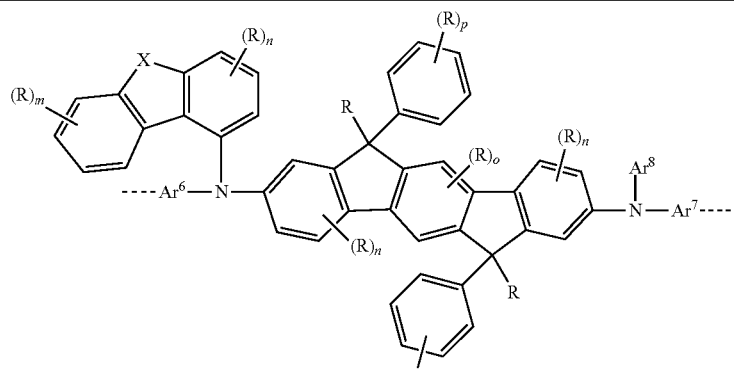
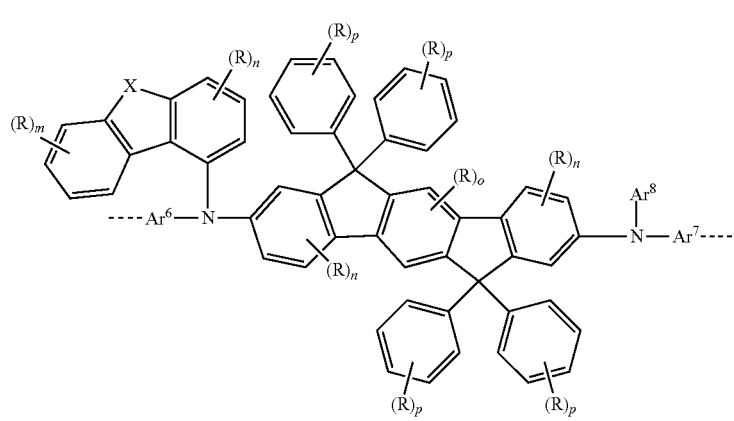
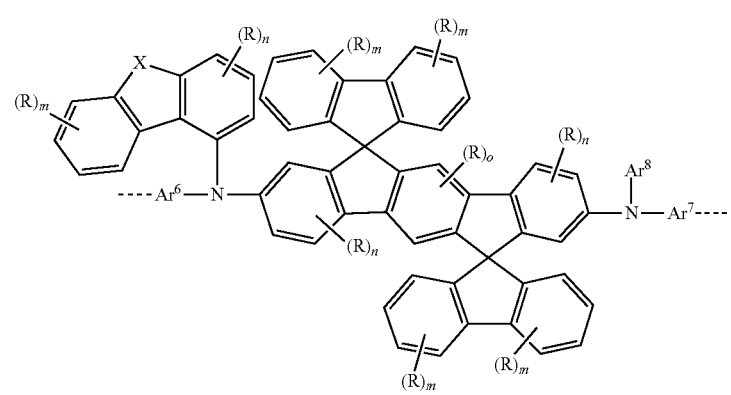
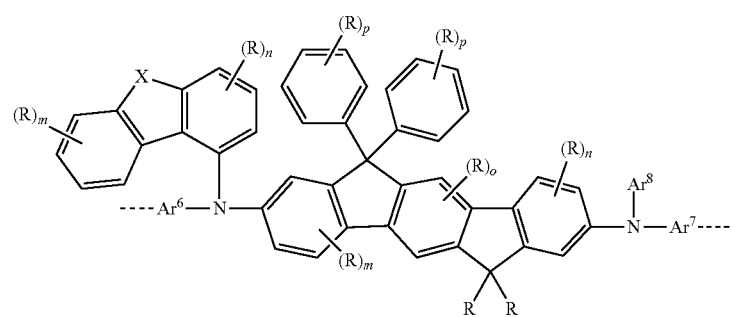

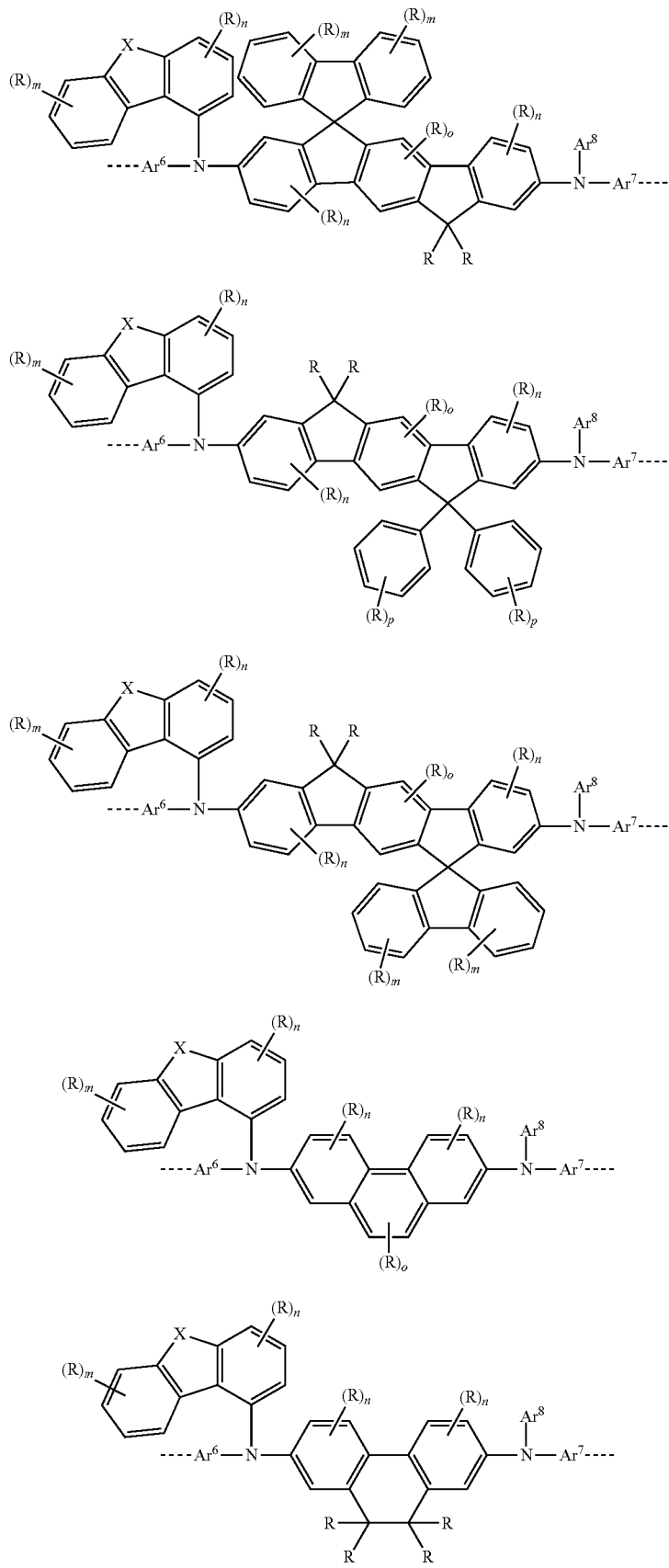

-continued
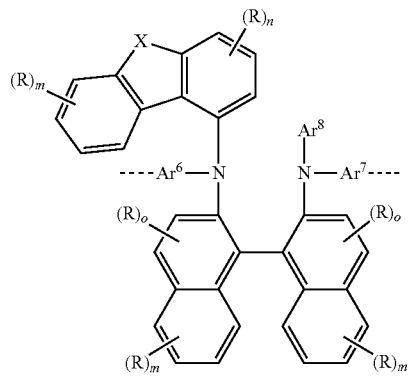
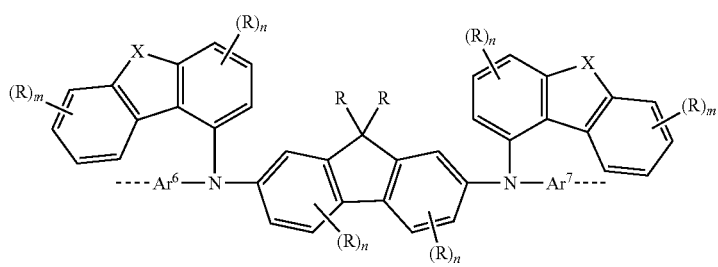
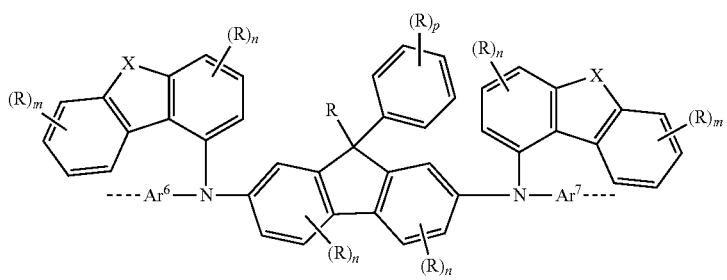
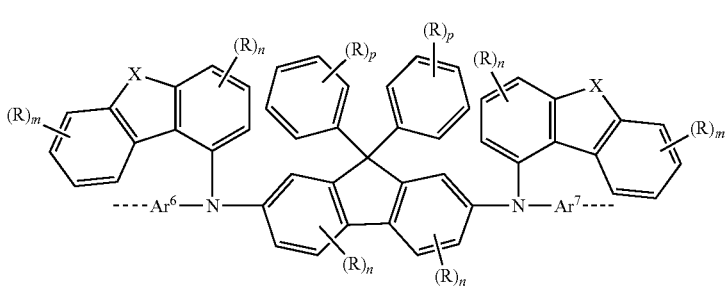
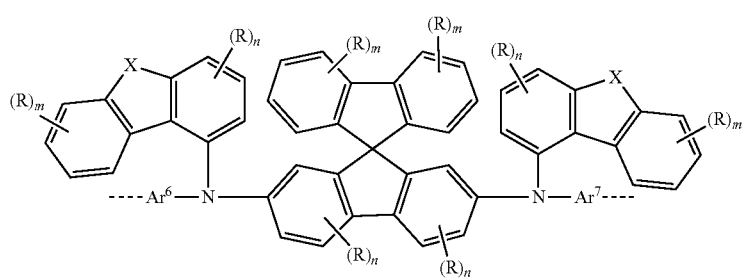

-continued
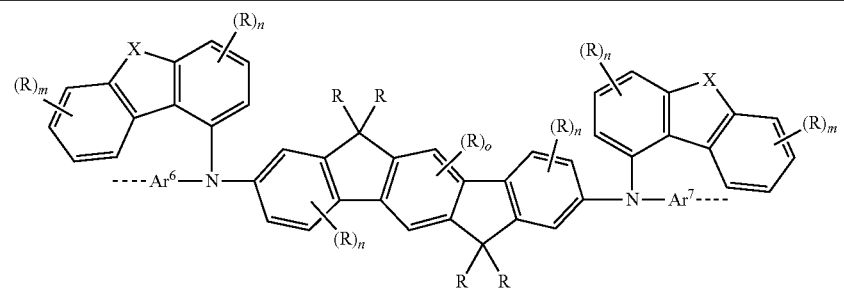
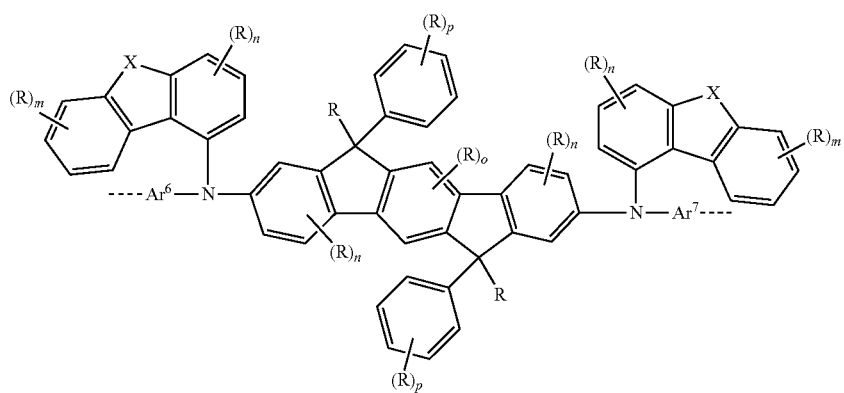
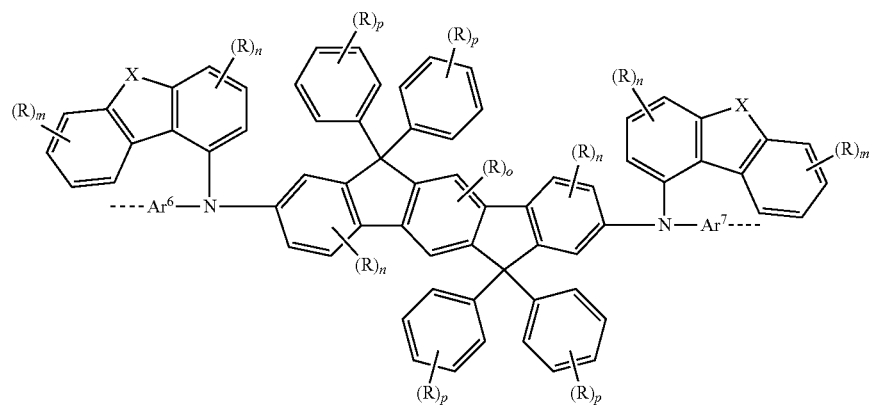
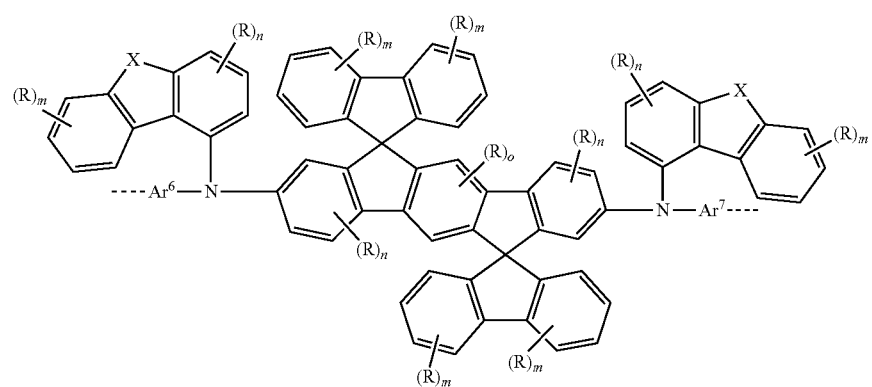

-continued
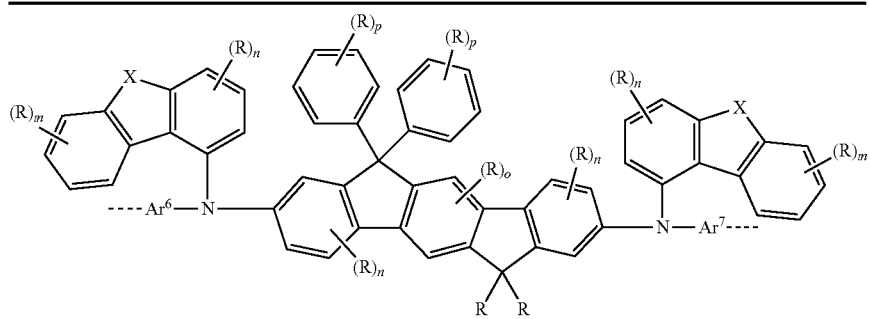
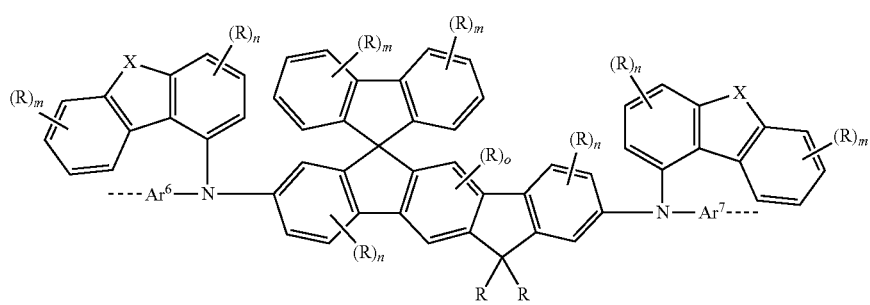
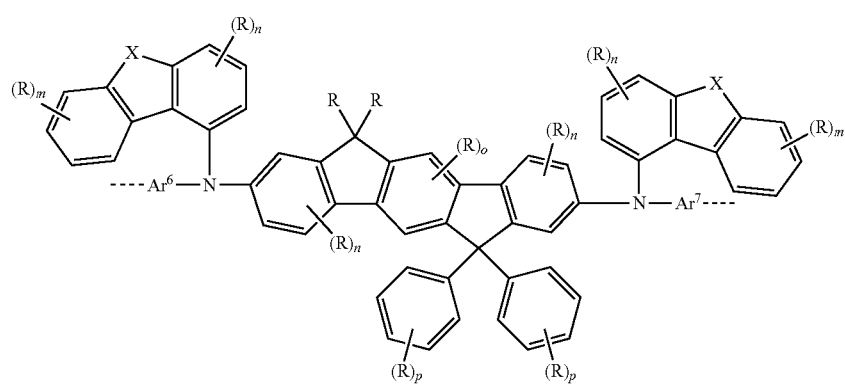
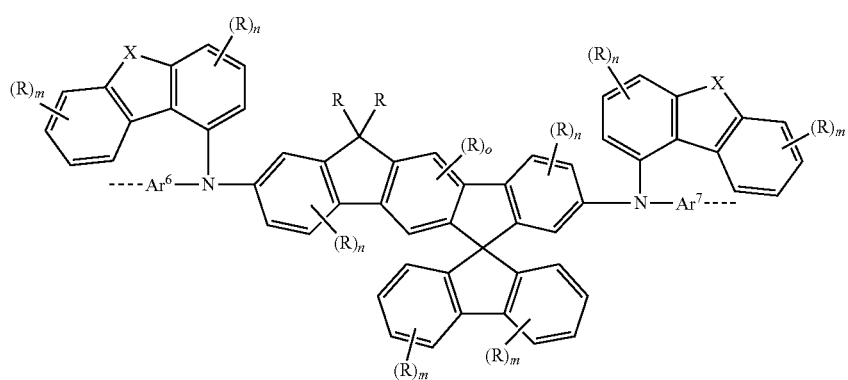

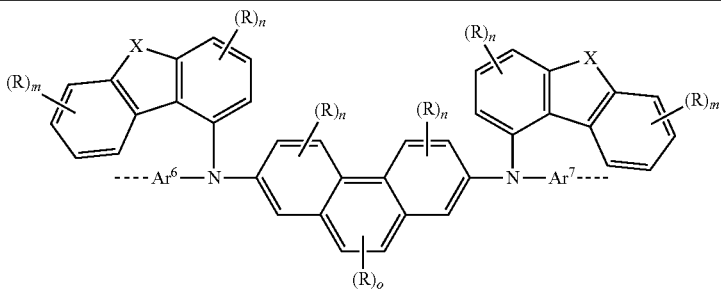

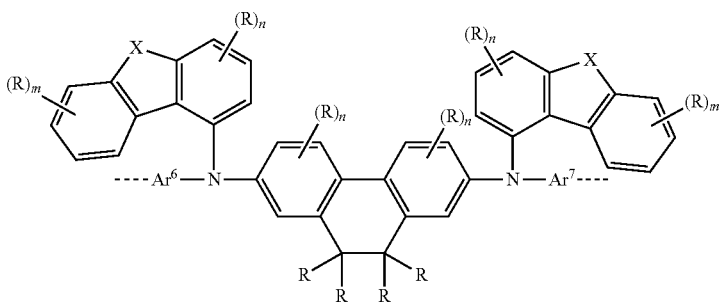

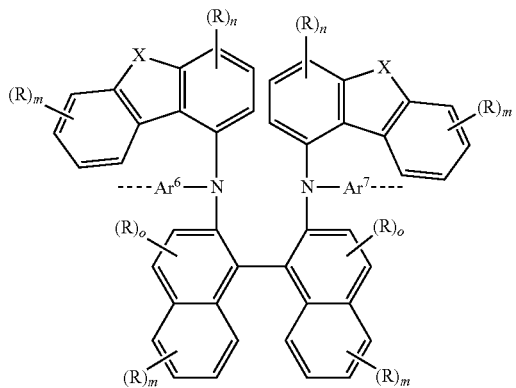

where Ar$^6$, Ar$^7$, Ar$^8$, R, m, n and p can adopt the meaning indicated above, in particular for formulae (I), (Ia), (Ib), (VIIIa) and/or (VIIIb), and o is 0, 1 or 2.

In a further particularly preferred embodiment, the structural units of formulae (XIII) and (XIV) are selected from the structural formulae of the following formulae (XIIIa) and (XIVa):

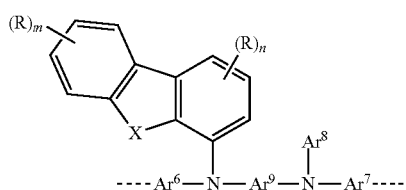

(XIIIa)

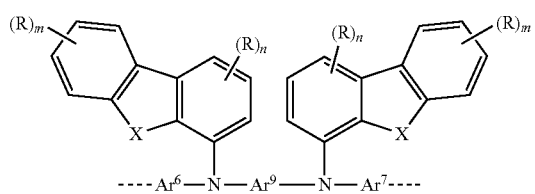

(XIVa)

where Ar$^6$, Ar$^7$, Ar$^8$, Ar$^9$, R, m, n and X can adopt the meaning indicated above, in particular for formulae (I), (Ia), (Ib), (VIIIa) and/or (VIIIb).

Examples of preferred structural units of formulae (XIIIa) and (XIVa) are depicted in the following table:

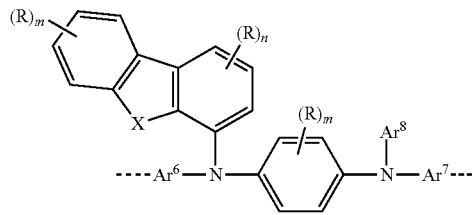
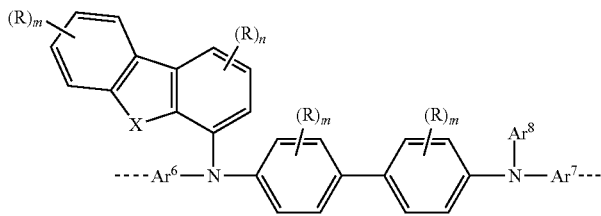
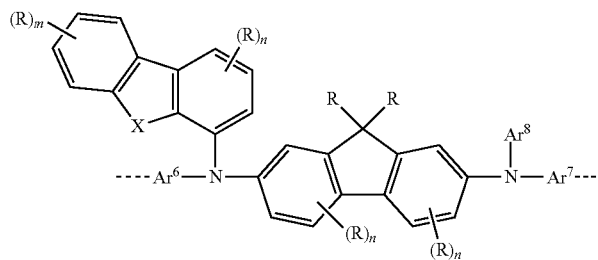
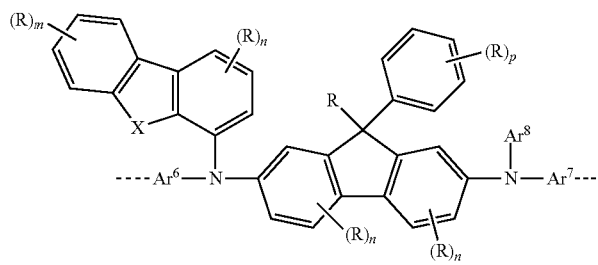
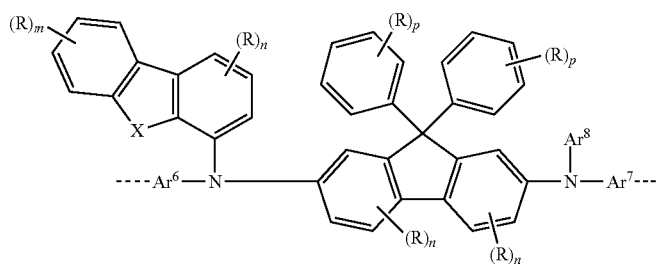
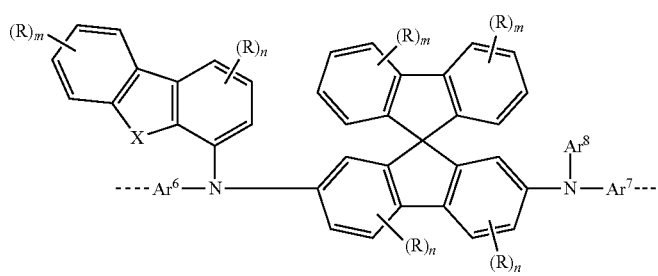

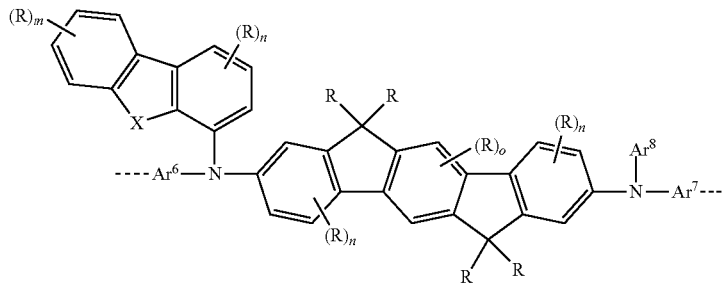
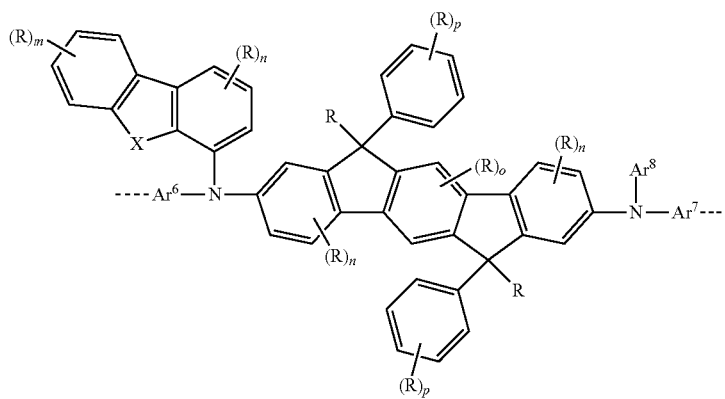
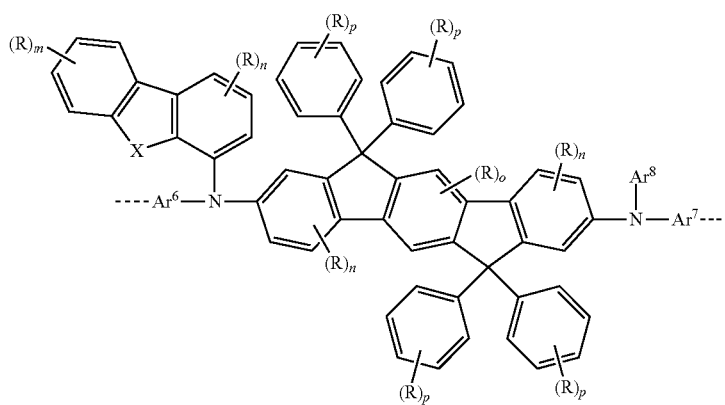
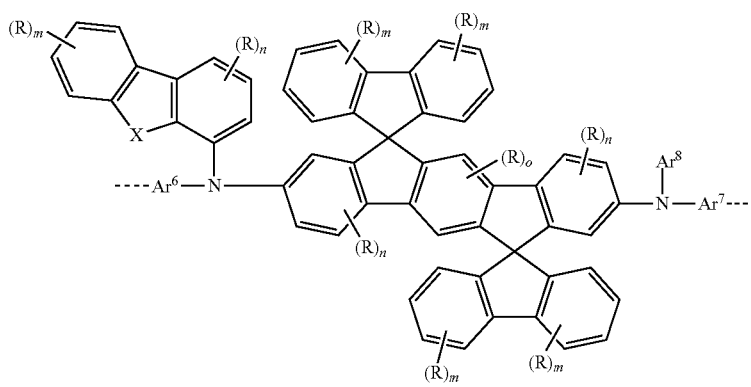

-continued
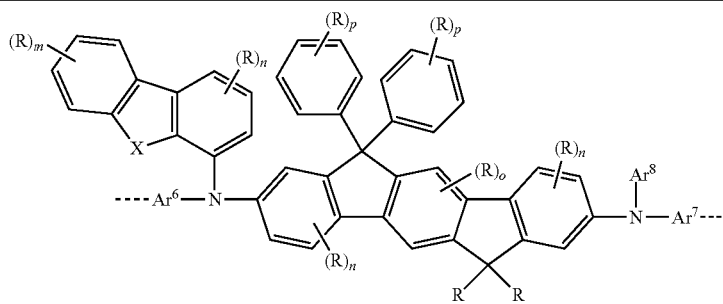
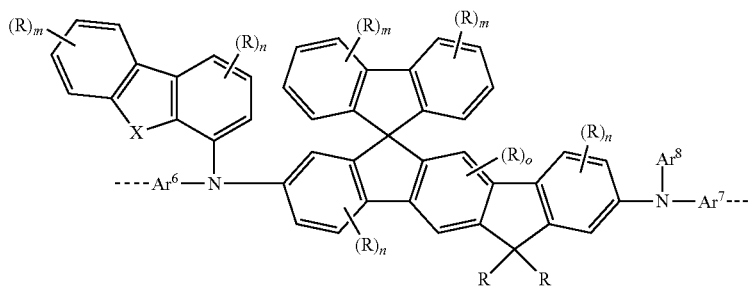
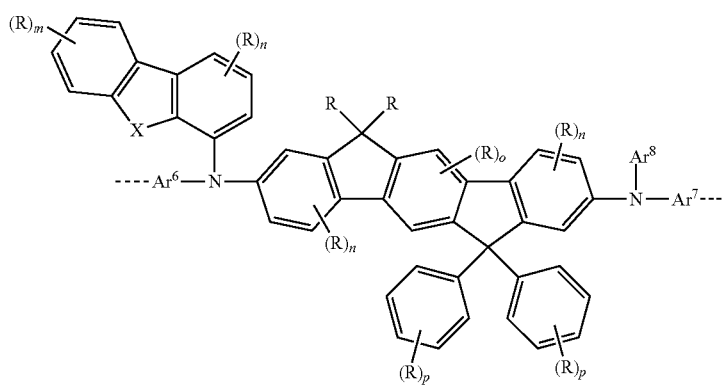
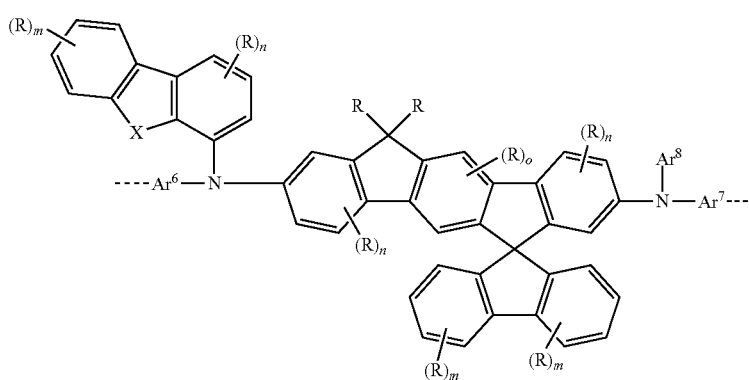
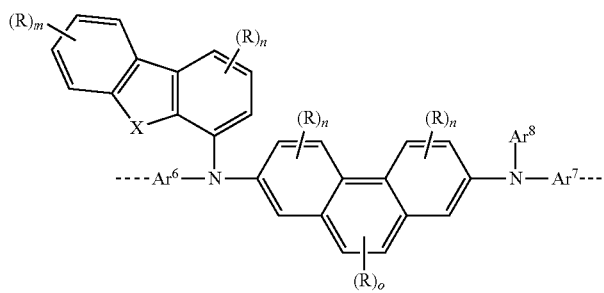

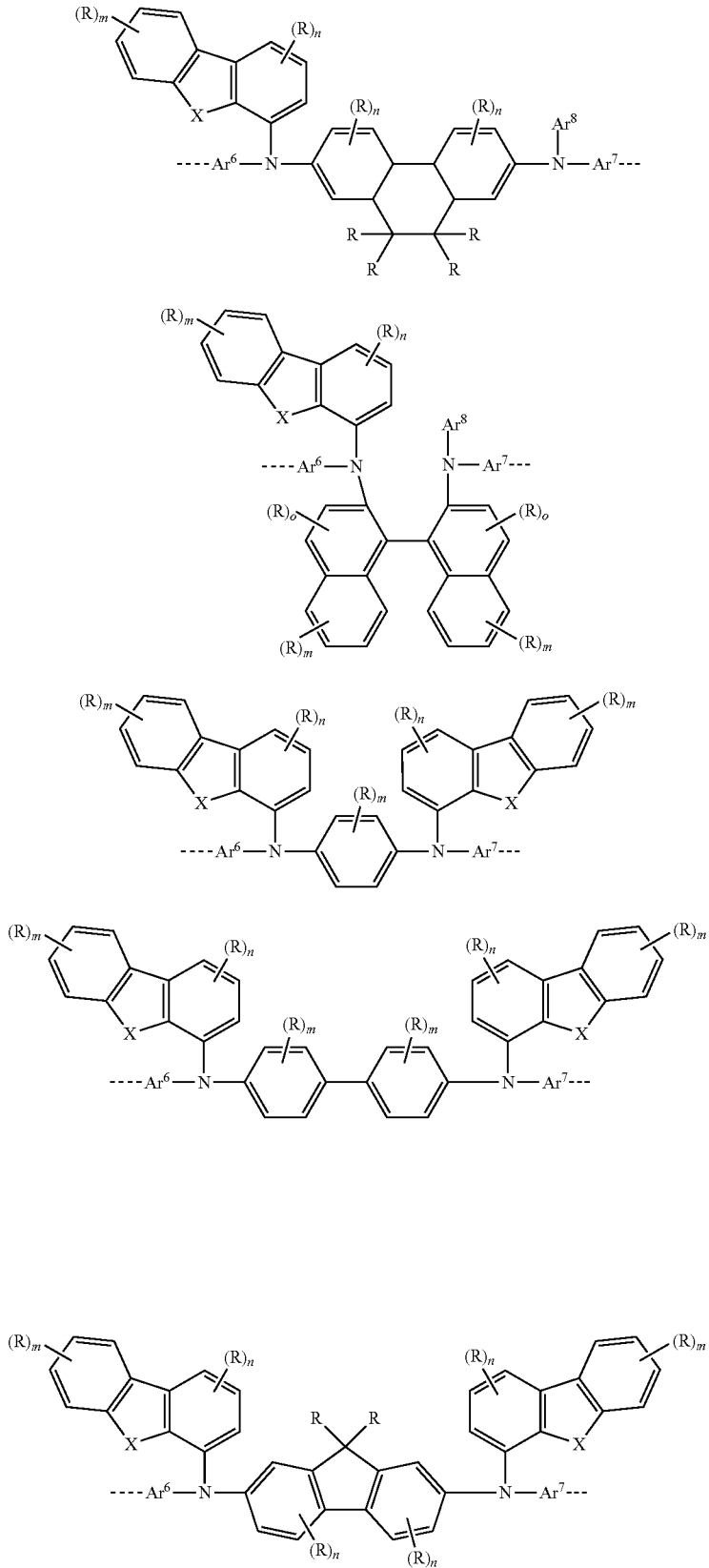

-continued
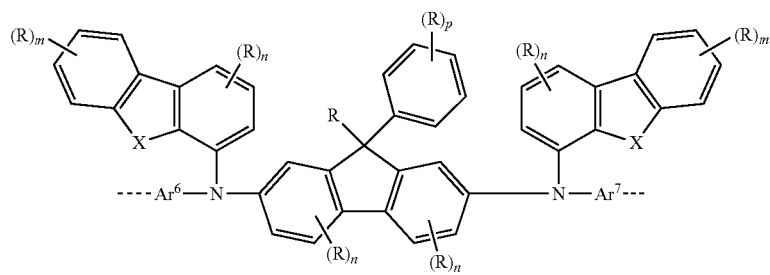
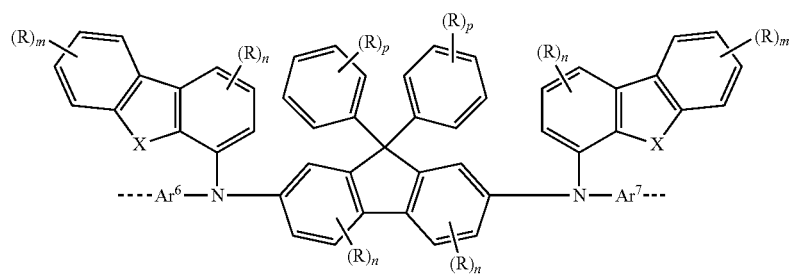
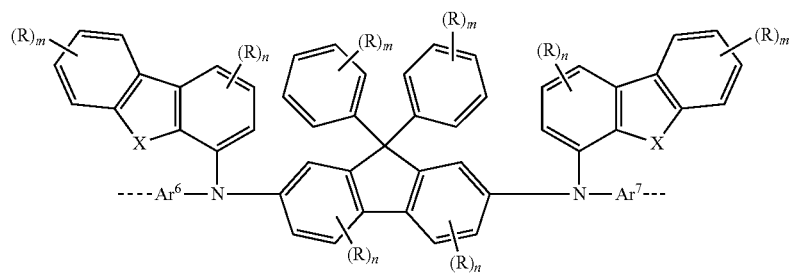
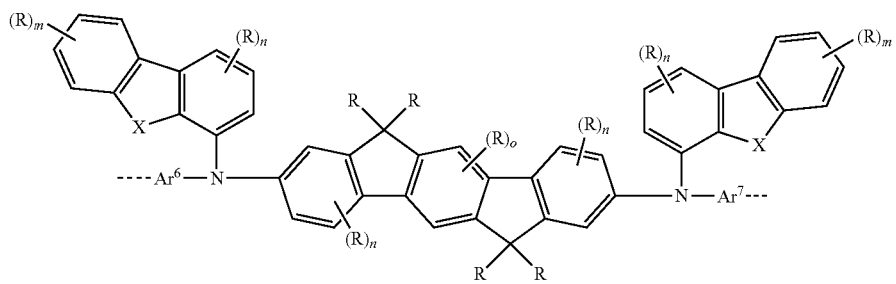
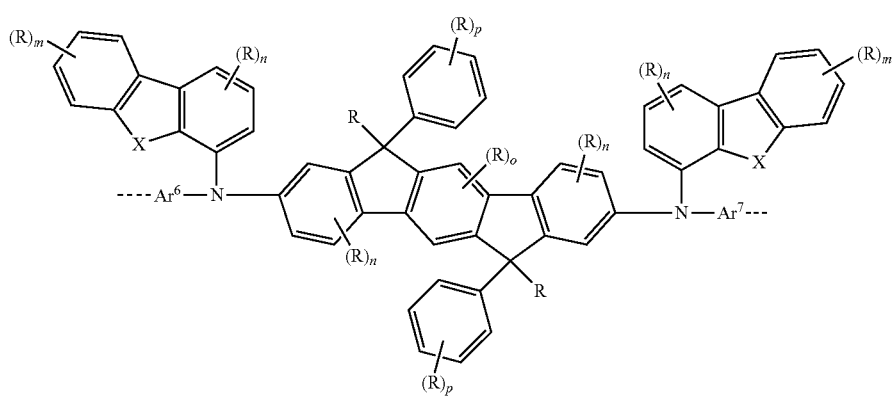

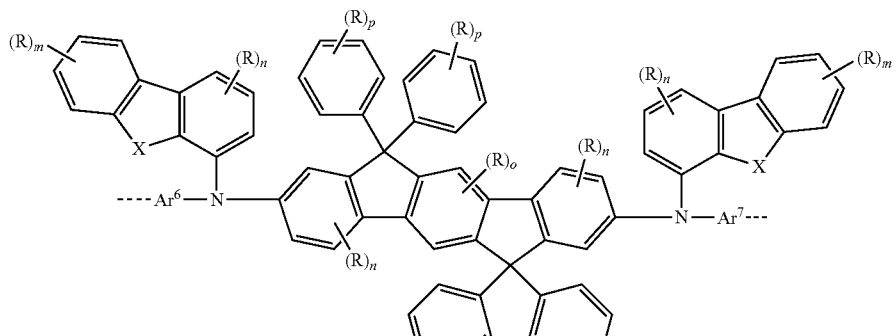
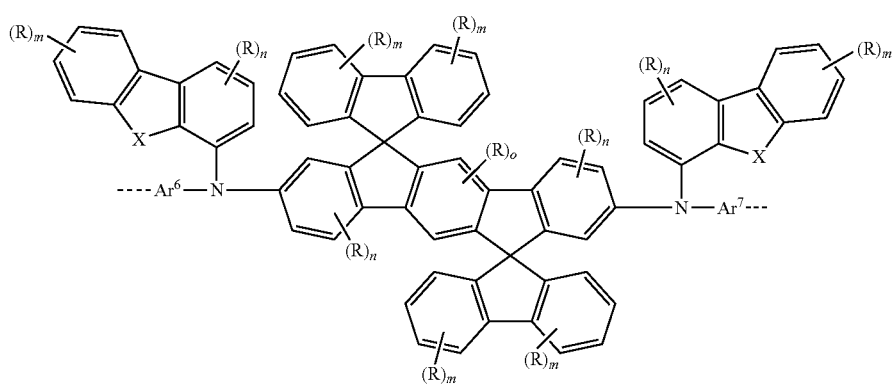
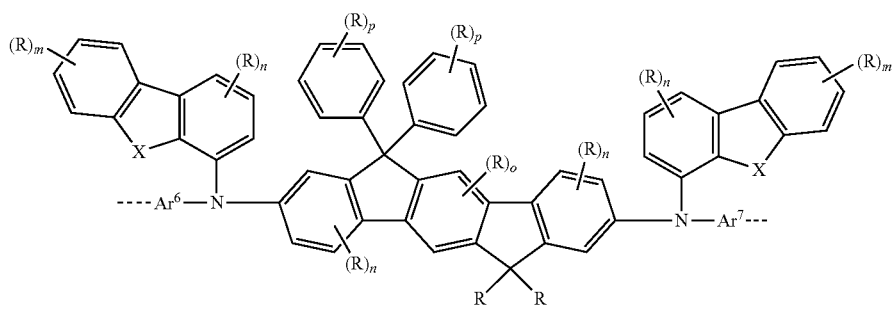
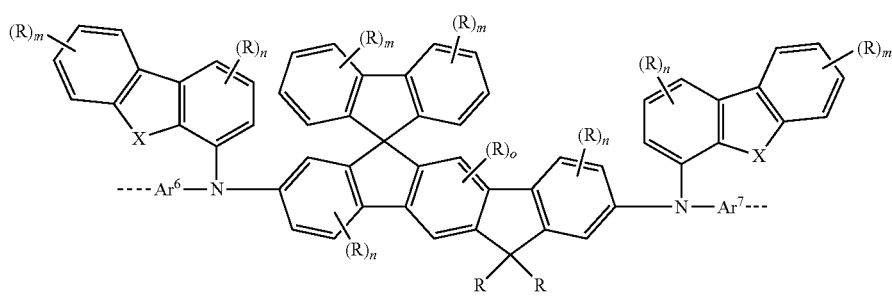

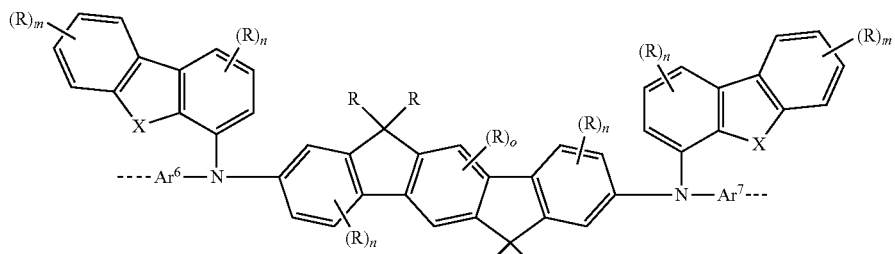
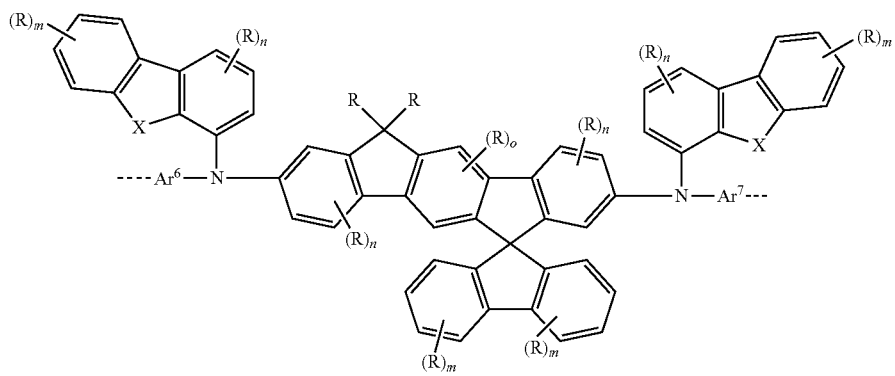
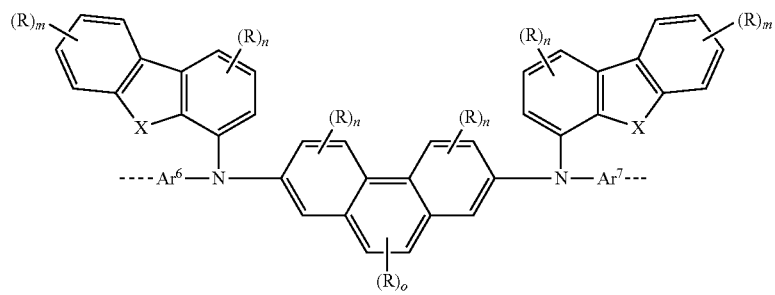
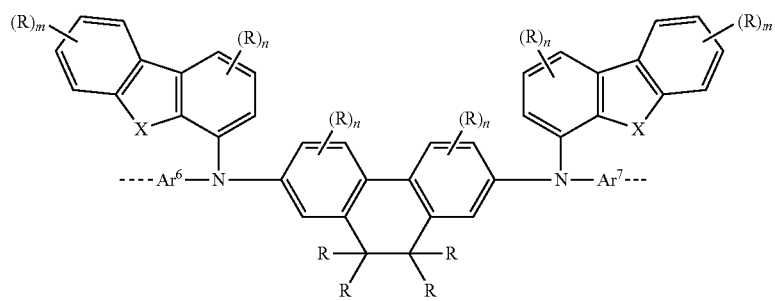

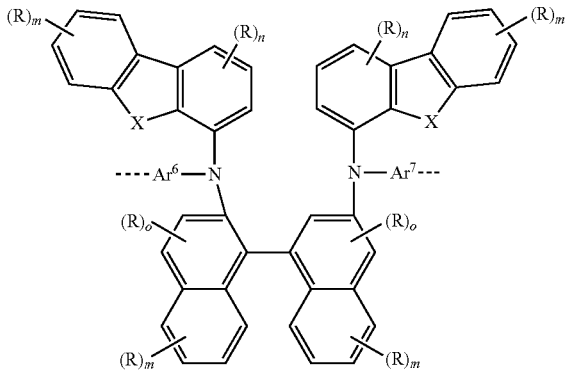

where Ar⁶, Ar⁷, Ar⁸, R, m, n and p can adopt the meaning indicated above, in particular for formulae (I), (Ia), (Ib), (VIIIa) and/or (VIIIb) and, o is 0, 1 oder 2.

In a very particularly preferred embodiment, the structural units of formulae (IXa) and (Xa) are selected from the structural units of the following formulae (IXb) and (Xb):

(IXb)

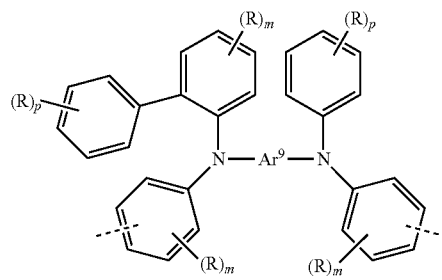

(Xb)

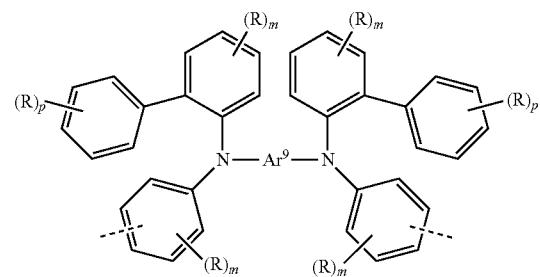

where Ar⁹, R, m and p can adopt the meaning indicated above, in particular for formulae (I), (Ia), (Ib), (VIIIa) and/or (VIIIb).

Example of preferred structural units of formulae (IXb) and (Xb) are depicted in the following table:

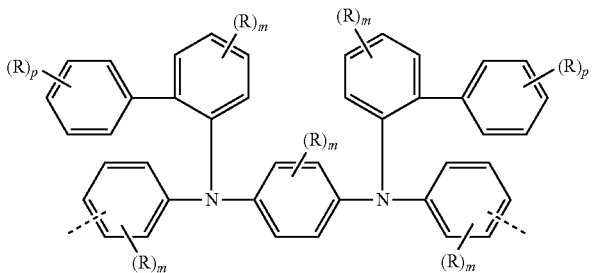

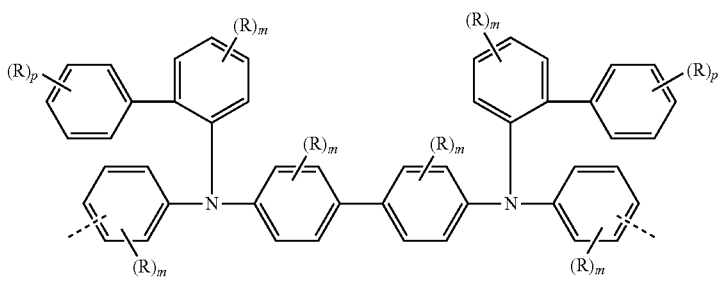

-continued
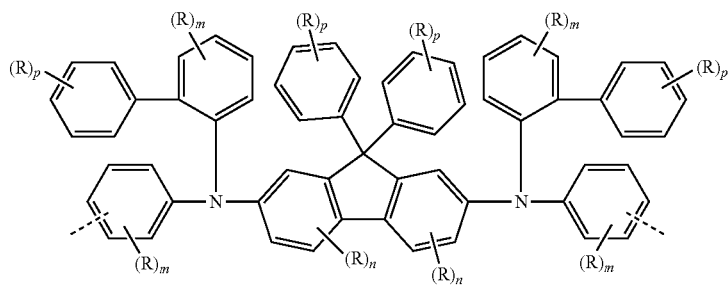
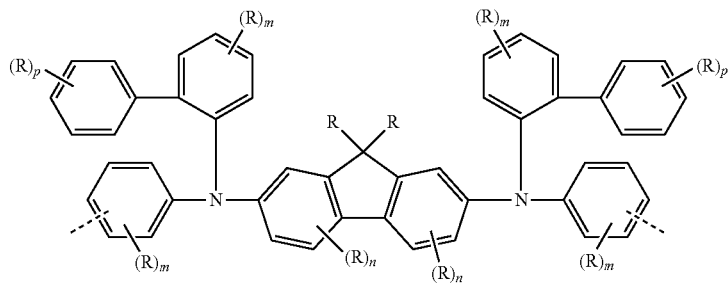
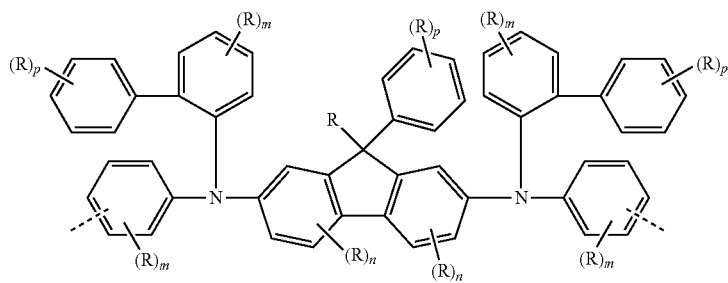
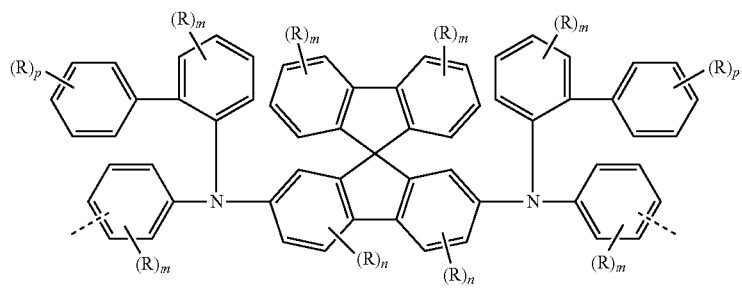
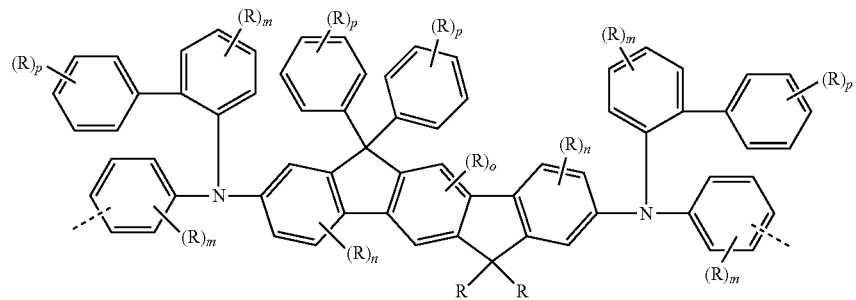

-continued
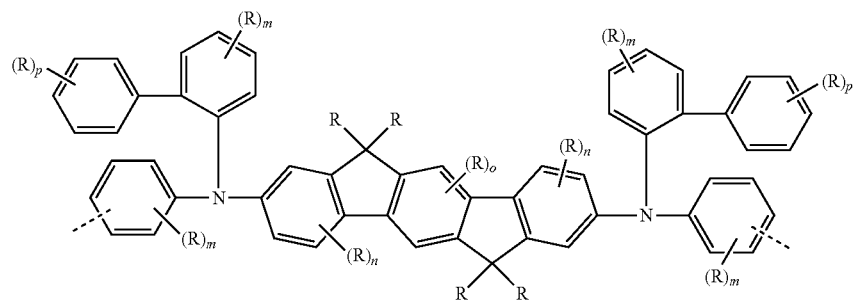
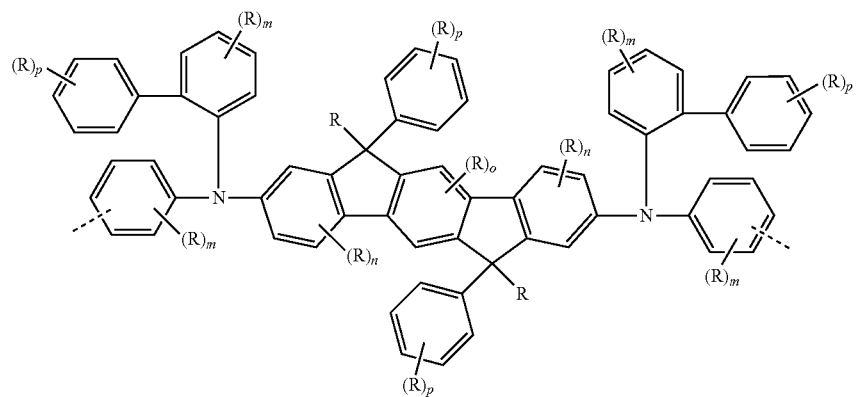
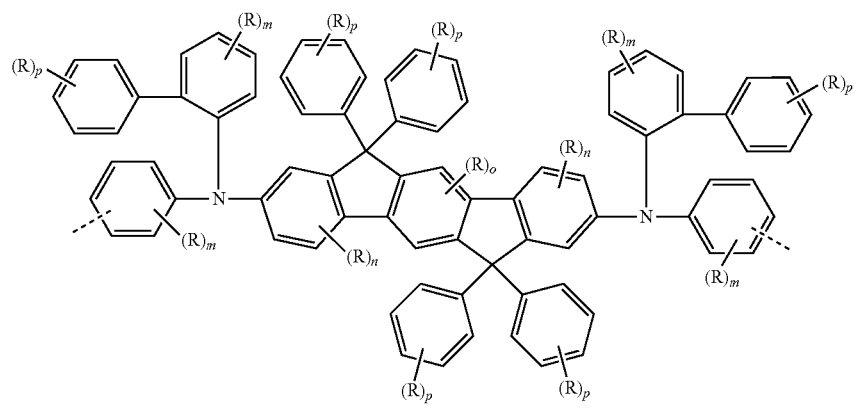
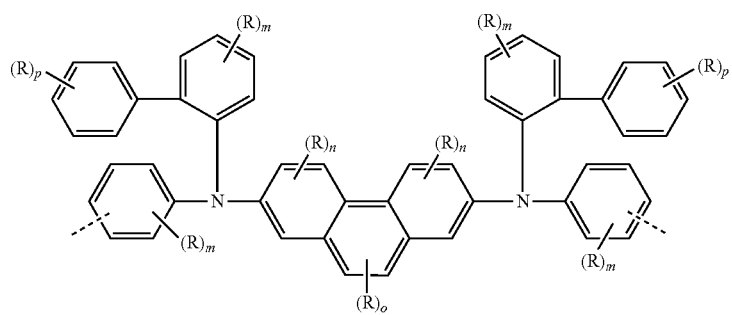

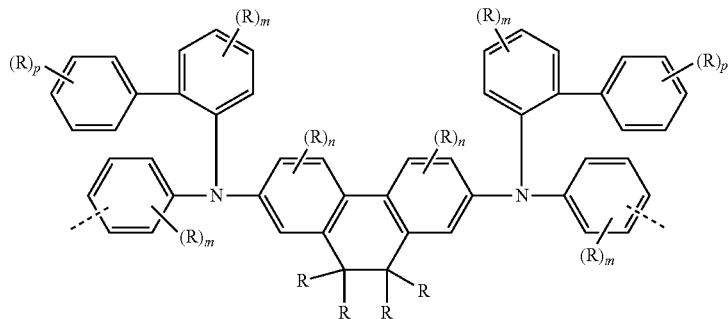

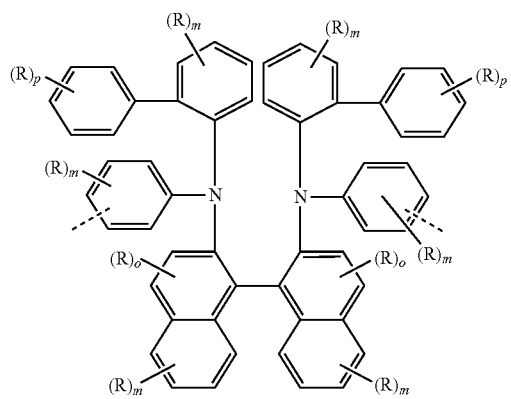

where R, m, n and p can adopt the meaning indicated above, in particular for formulae (I), (Ia), (Ib), (VIIIa) and/or (VIIIb) and, o is 0, 1 or 2.

In a further very particularly preferred embodiment, the structural units of formulae (XIa) and (XIIa) are selected from the structural units of the following formulae (XIb) and (XIIb):

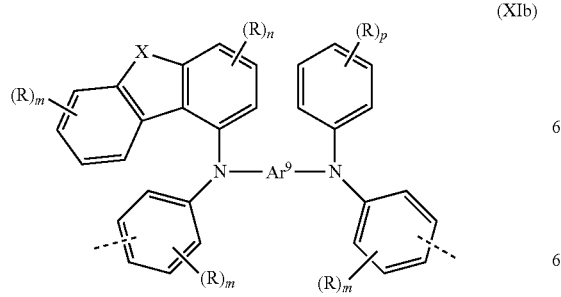
(XIb)

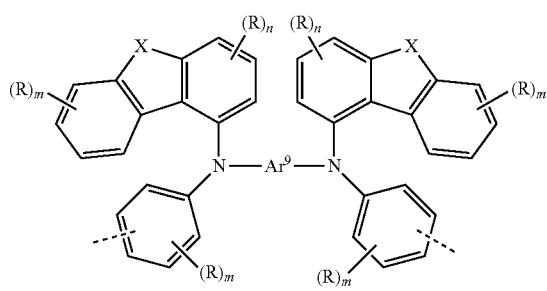
(XIIb)

where $Ar^9$, R, X, m, n and p can adopt the meaning indicated above, in particular for formulae (I), (Ia), (Ib), (VIIIa) and/or (VIIIb).

Examples of preferred structural units of formulae (XIb) and (XIIb) are depicted in the following table:

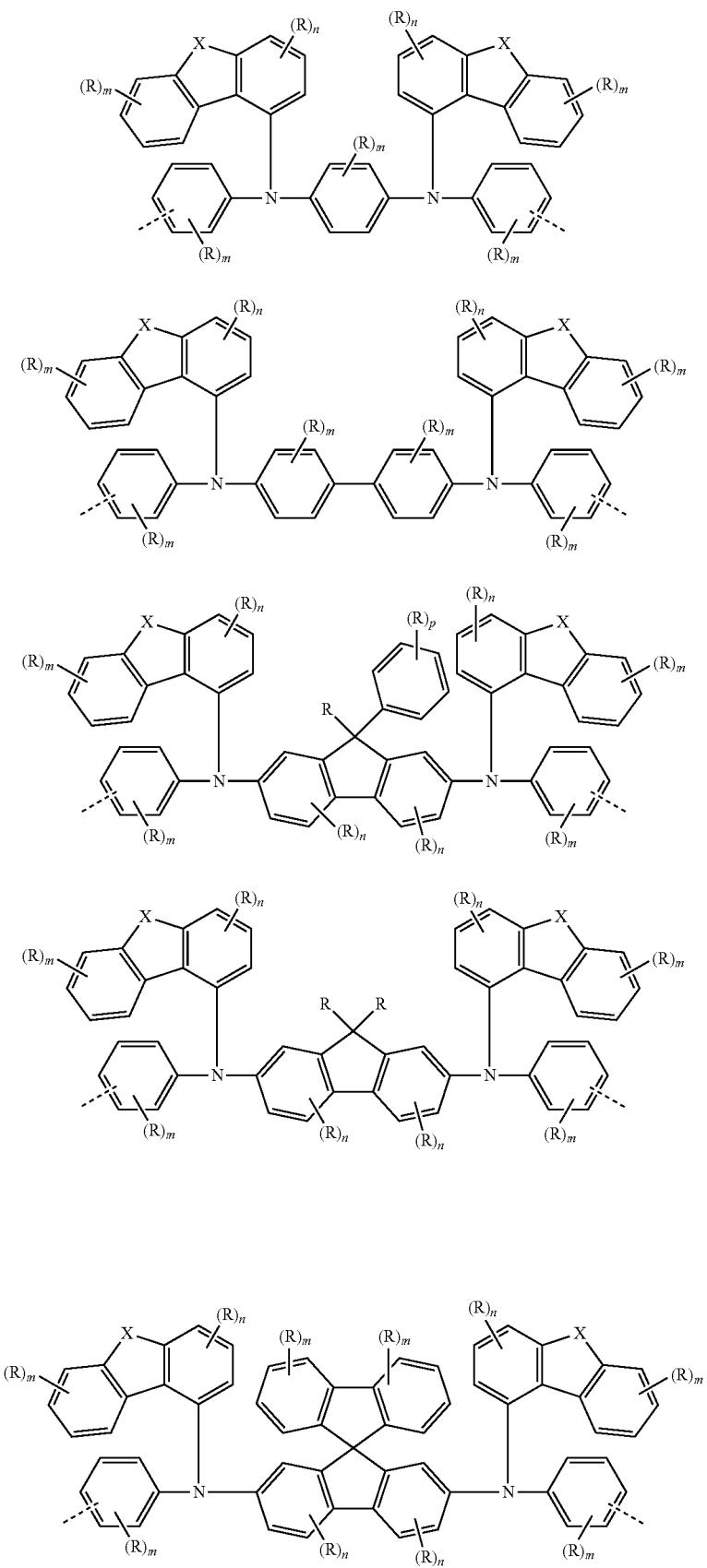

-continued
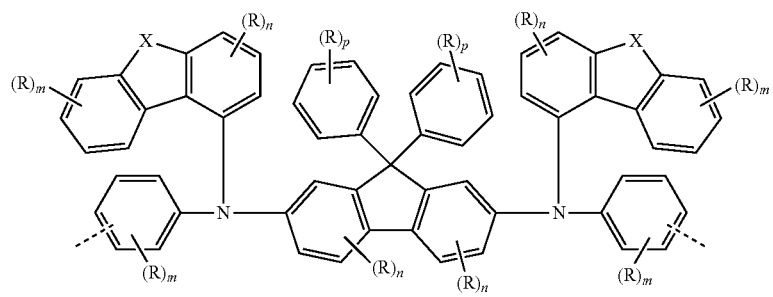
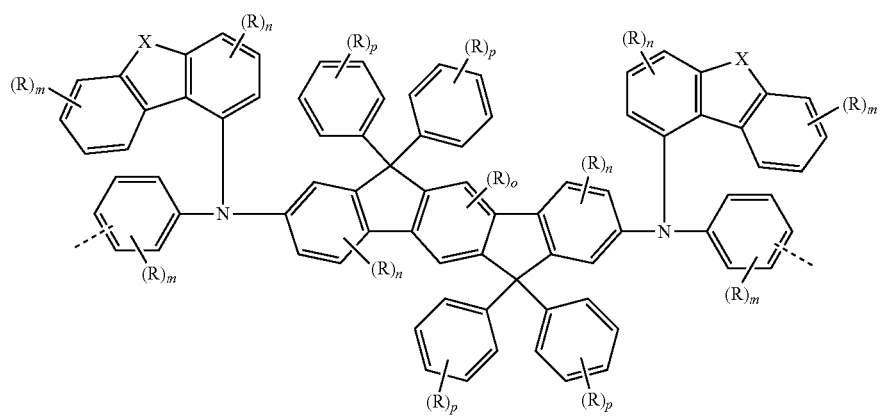
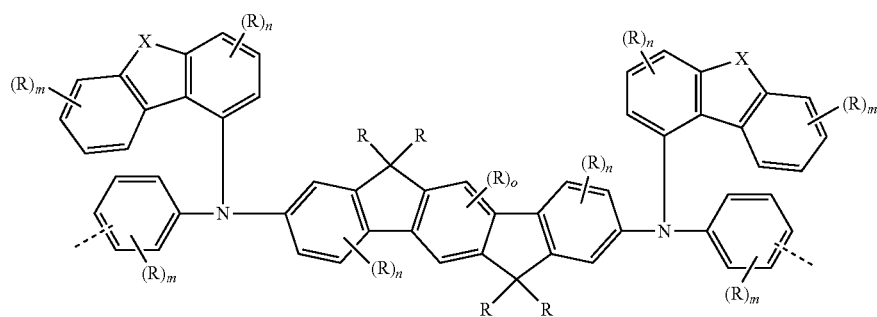
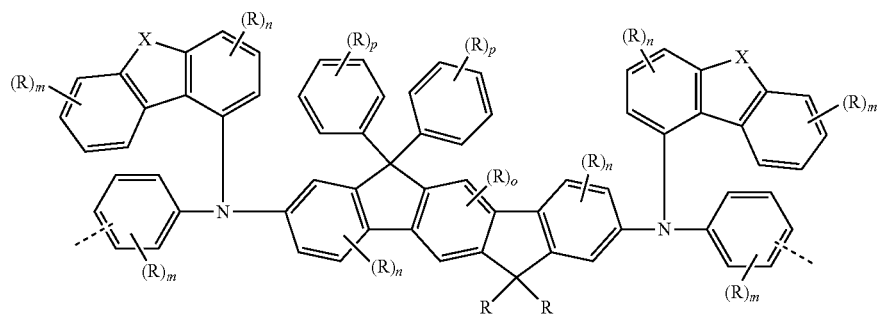

-continued
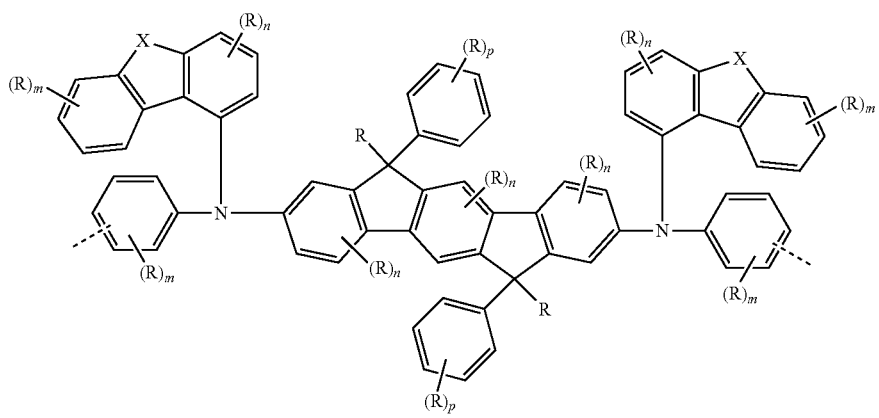
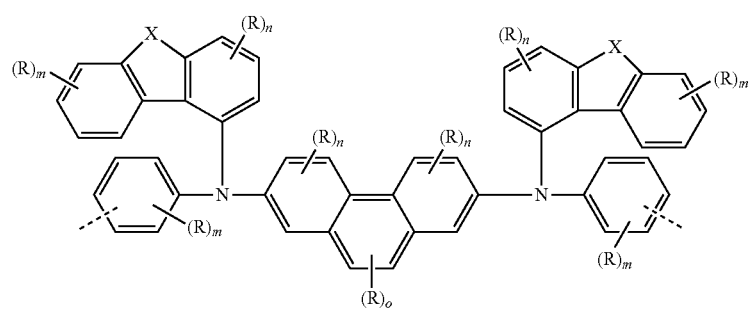
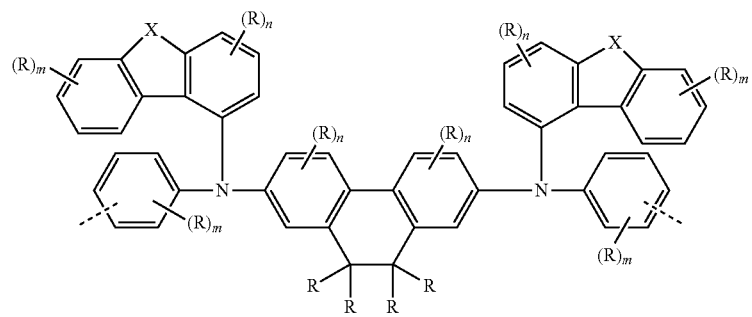
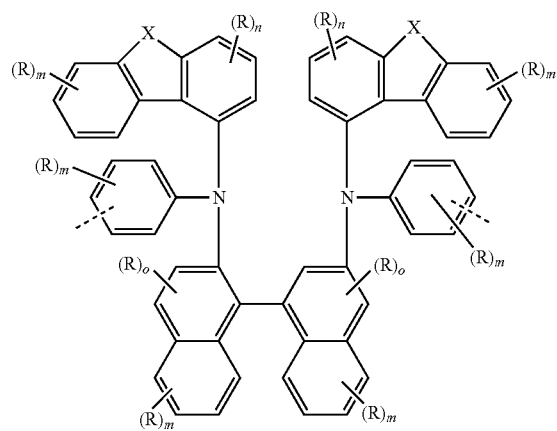

where R, X, m, n and p can adopt the same meaning indicated above, in particular for formulae (I), (Ia), (Ib), (VIIIa) and/or (VIIIb), and o is 0, 1 or 2.

In a further very particularly preferred embodiment, the structural units of formulae (XIIa) and (XIVa) are selected from the structural units of the following formulae (XIIIb) and (XIVb):

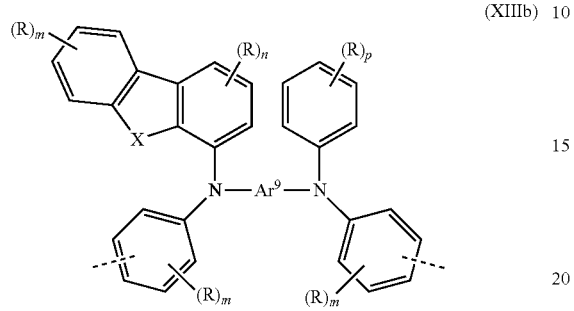

(XIIIb)

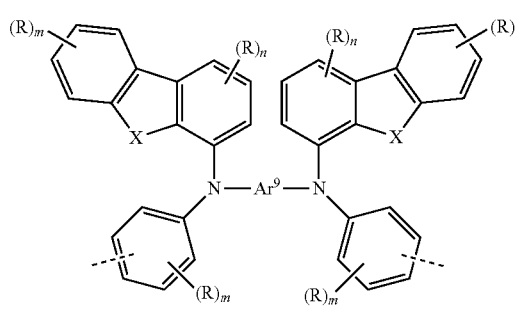

(XIVb)

where R, X, m, n and p can adopt the meaning indicated above, in particular for formulae (I), (Ia), (Ib), (VIIIa) and/or (VIIIb).

Examples of preferred structural units of formulae (XIIIb) and (XIVb) are depicted in the following table:

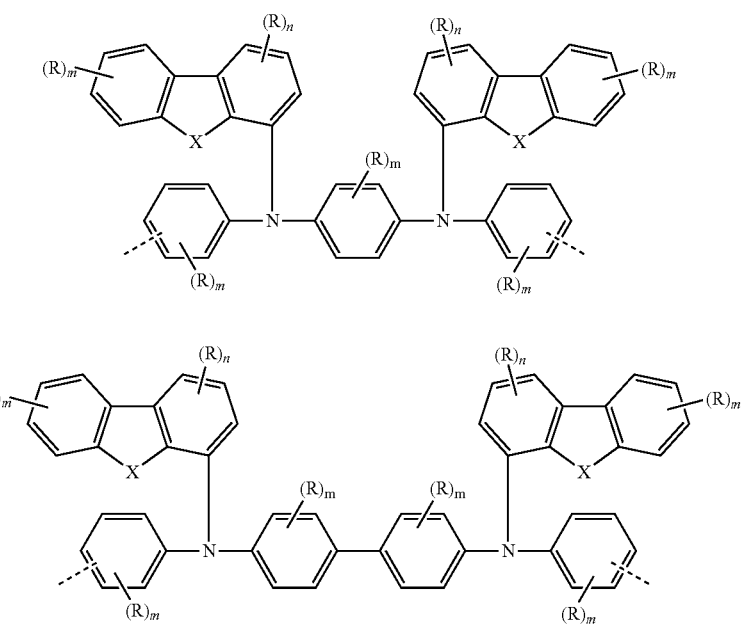

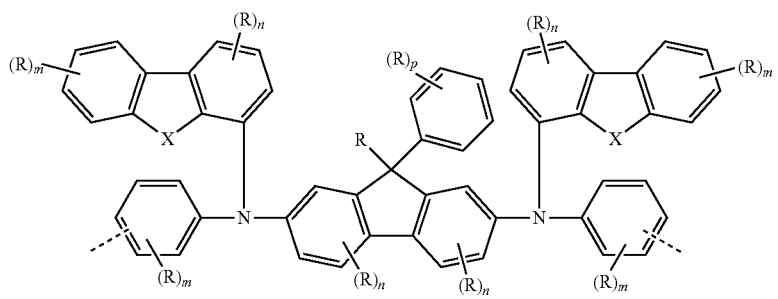

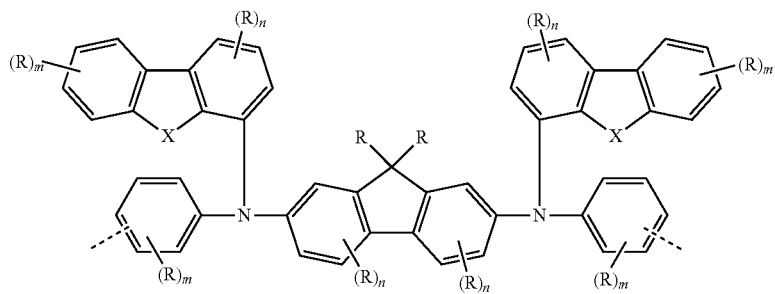
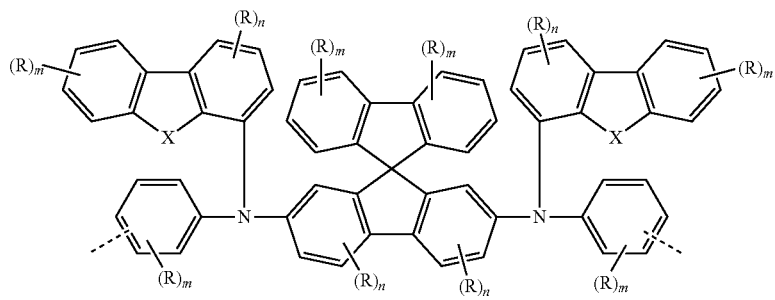
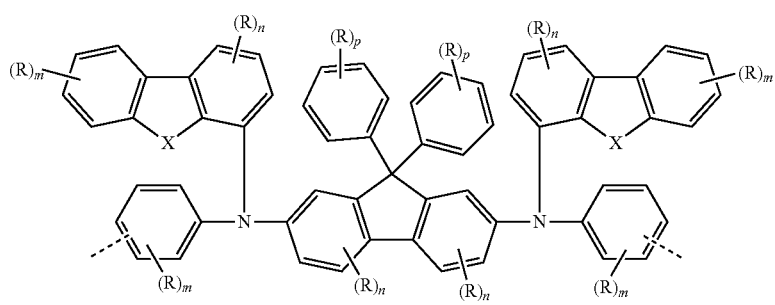
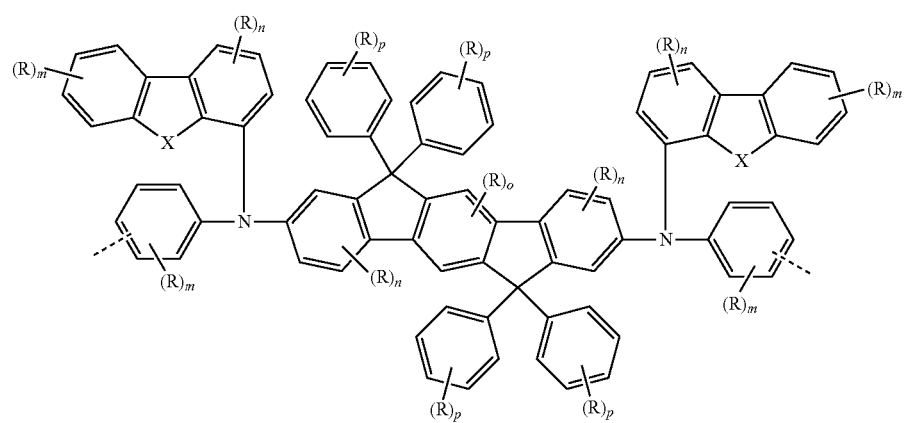

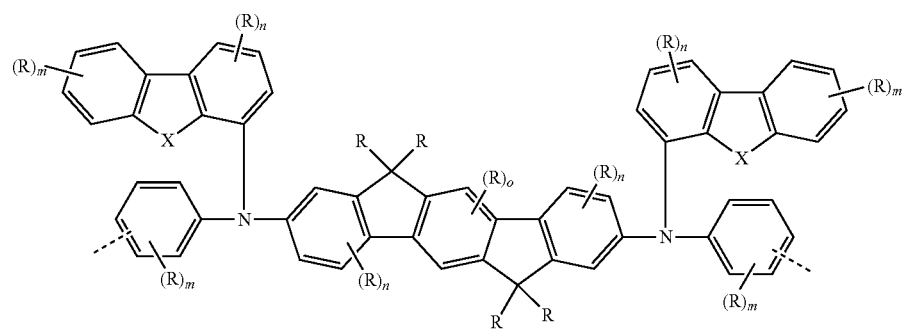
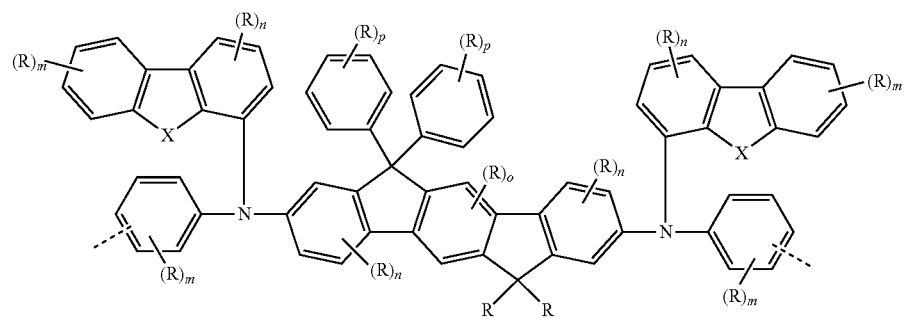
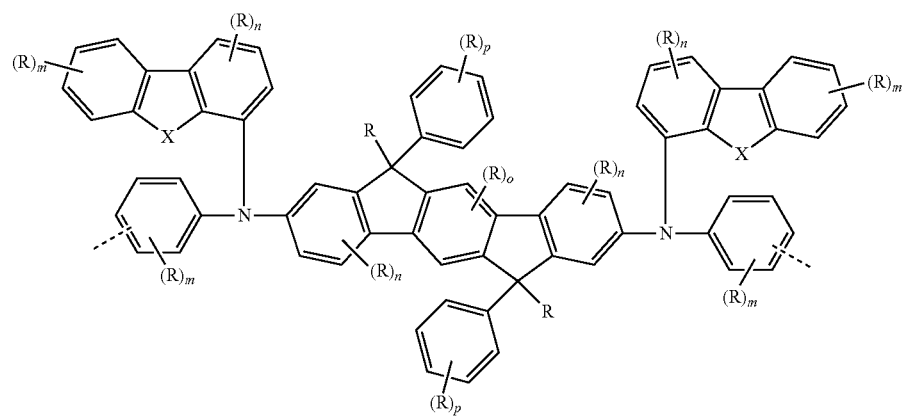
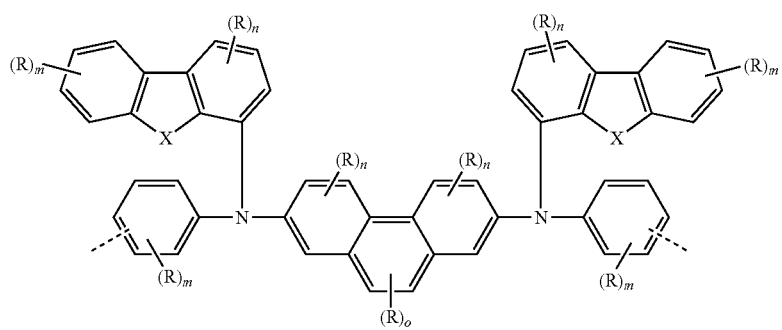

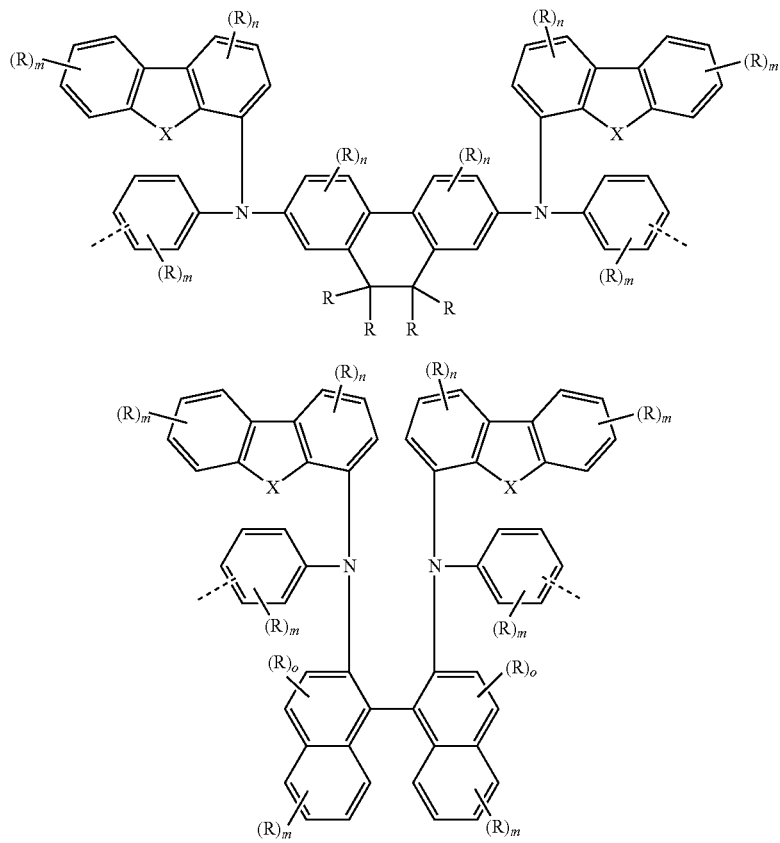

where R, X, m, n and p can adopt the meaning indicated above, in particular for the formulae (I), (Ia), (Ib), (VIIIa) and/or (VIIIb), and o is 0, 1 or 2.

In formulae (IXa) to (XIVa) and (IXb) to (XIVb), the dashed lines represent bonds to adjacent structural units in the polymer. They can be, independently from each other, identically or differently, in ortho-, meta- or para-position, preferably identically in ortho-, meta- or para-position, more preferably in meta- or para-position and most preferably in para-position.

According to a further alternative preferred embodiment of the invention, at least one of the structural units of formulae (I), (Ia), (Ib), (II), (III), (IV), (V), (VI), (VII), (VIIIa), (VIIIb), (IX), (X), (XI), (XII), (XIII), (XIV), (XV), (XVI) and/or one preferred embodiment of these structural units has at least one group Q, which is crosslinkable.

According to the invention, a "crosslinkable group Q" is a functional group, which is able to react and to form a non-soluble bond. The reaction can take place with a further, identical group Q, a further, different group Q or any other part of the same or of another polymer chain. Crosslinkable groups are this reactive groups. The result of the reaction of the crosslinkable groups is a corresponding crosslinked compound. The chemical reaction can also take place in the layer, where an unsoluble layer is produced as a result. The crosslinking can usually be supported with heat or with UV-, microwave-, X-Ray- or electron radiation, optionally in the presence of an initiator. "Unsoluble" in the context of the present invention means preferably, that the polymer according to the present invention exhibits, after the crosslinking reaction, thus after the reaction of the crosslinkable groups, a solubility at room temperature in an organic solvent, which is at least reduced with a factor 3, preferably with a factor 10, in comparison with the corresponding non-crosslinked polymer of the invention in the same organic solvent.

In the context of the invention, at least one crosslinkable group means that one structural unit has one or more crosslinkable groups. One structural unit preferably has exactly one crosslinkable group.

If the structural unit of formula (I) has a crosslinkable group, then this group can be linked to $Ar^1$, $Ar^2$ or $Ar^3$. Preferably, the crosslinkable group is linked to the monovalent linked, mono- or polycyclic, aromatic or heteroaromatic $Ar^3$.

If a structural unit of formulae (VIIIa) or (VIIIb) has a crosslinkable group, then this group can be linked to $Ar^5$, $Ar^6$, $Ar^7$, $Ar^8$ or $Ar^9$. The crosslinkable group is preferably linked to one of the monovalent linked, mono- or polycyclic, aromatic or heteroaromatic ring system, that is $Ar^5$ or $Ar^6$.

Preferred mono- or polycyclic, aromatic or heteroaromatic groups $Ar^3$ in formula (I), $Ar^4$ in formulae (Ia), (Ib), (II), (III), (IV), (V), (VI), (VII), (VIIIa), (VIIIb), (IX), (X), (XI), (XII), (XIII), (XIV), (XV) and/or (XVI), $Ar^5$ and $Ar^8$ in formulae (VIIIa) and/or (VIIIb), as well as the corresponding preferred embodiment are the following:

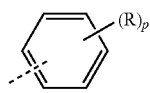

E1

-continued

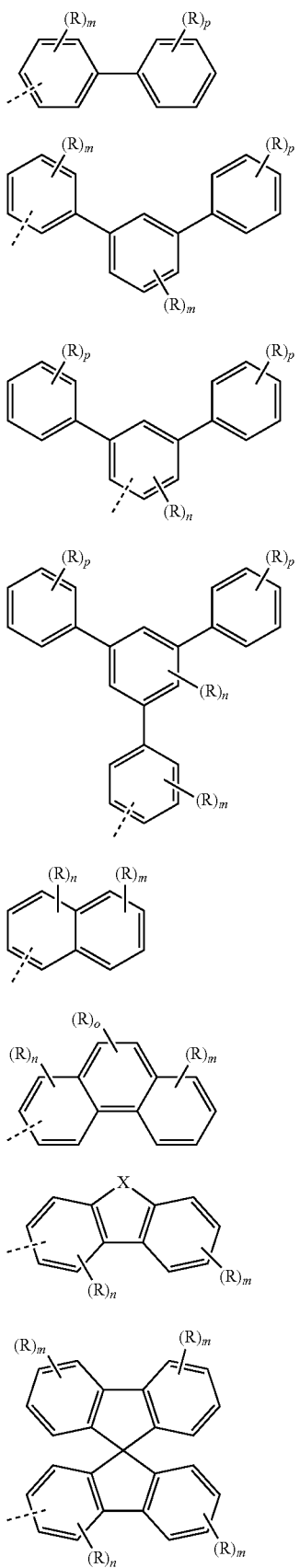

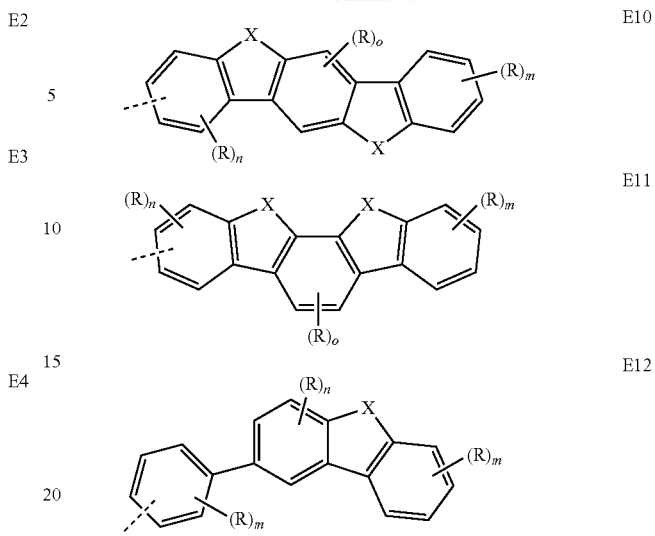

where R in formulae E1 to E12 can adopt the meaning indicated above for formula (I), X can adopt the meaning indicated for formulae (Ia) and/or (Ib), and the indices have the following meaning:

m=0, 1, 2, 3 or 4;

n=0, 1, 2 or 3;

o=0, 1 or 2; and p=0, 1, 2, 3, 4 or 5.

Preference is given to mono- or polycyclic, aromatic or heteroaromatic groups $Ar^1$ and $Ar^2$ in formula (I), $Ar^6$, $Ar^7$ and $Ar^9$ in formula (VIIIa) and/or (VIIIb), which have the following formulae:

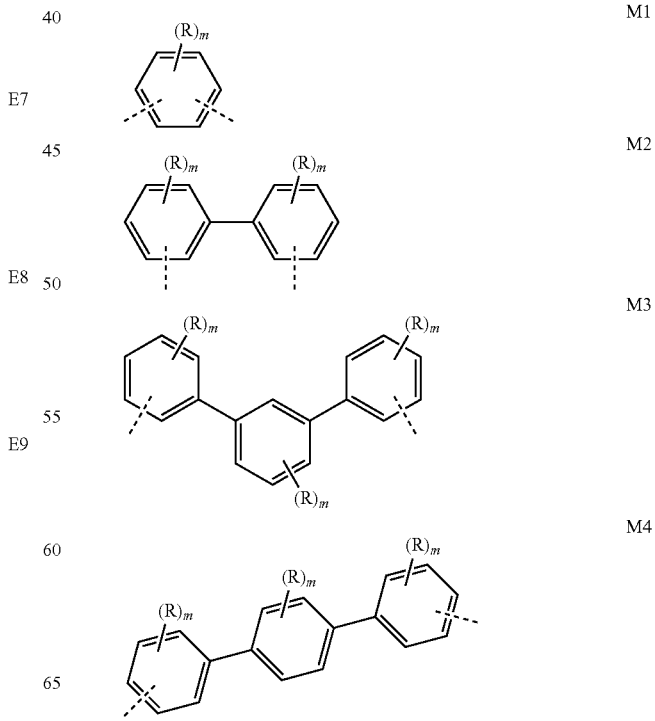

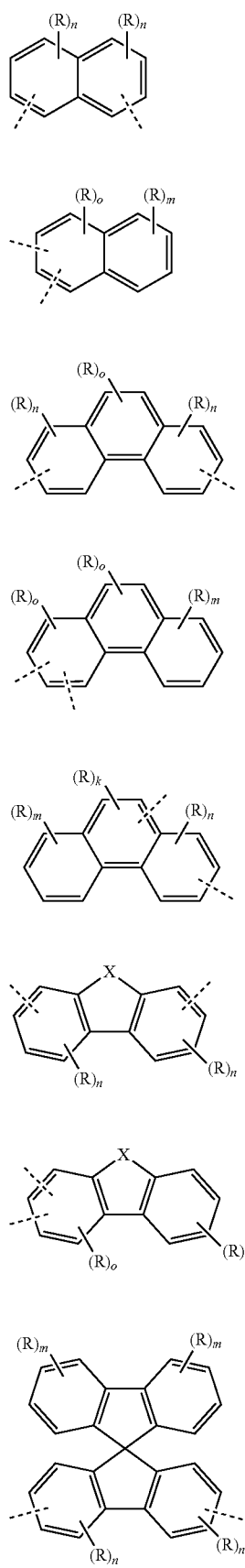
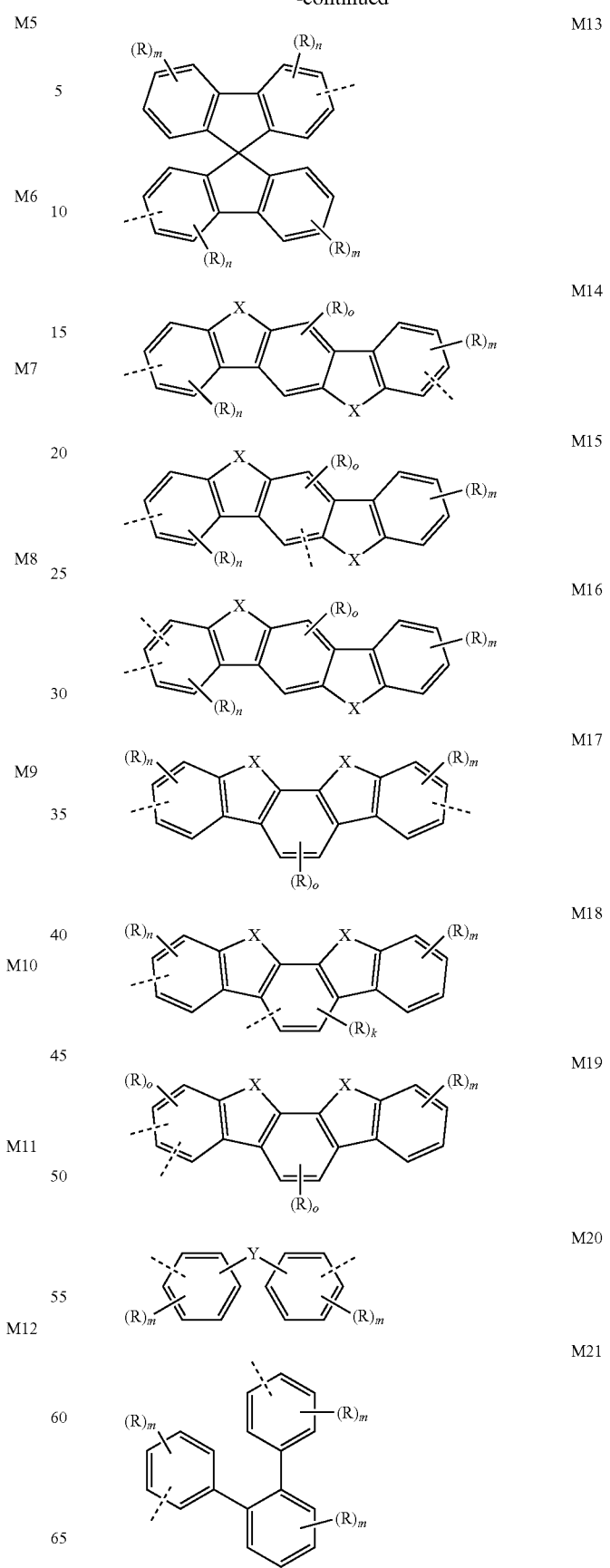

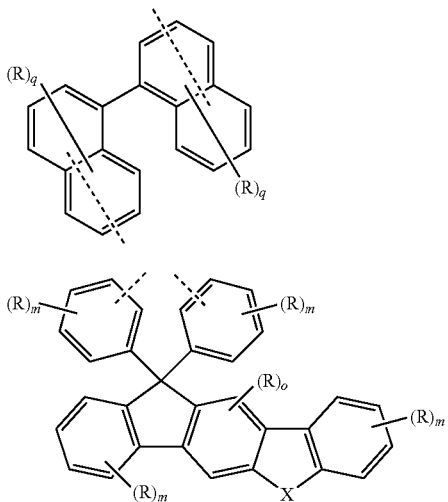

M22

M23

R in formulae M1 to M23 can adopt the meaning indicated for formula (I), X can adopt the meaning indicated for formulae (Ia) and/or (Ib).

Y can be $CR_2$, $SiR_2$, O, S, a straight or branched alkyl group having 1 to 20 C atoms, or an alkenyl or alkynyl group having 2 to 20 C atoms, which may in each case be substituted by one or more radicals $R^1$, where one or more non-adjacent $CH_2$ groups may be replaced by $S_1(R^1)_2$, C=O, C=S, C=$NR^1$, P(=O)($R^1$), SO, $SO_2$, $NR^1$, O, S or $CONR^1$ or an aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroalkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$, wherein R and $R^1$ can adopt the same meaning as indicated for formula (I).

The indices have the following meaning:
k=0 or 1;
m=0, 1, 2, 3 or 4;
n=0, 1, 2 or 3;
o=0, 1 or 2; and
q=0, 1, 2, 3, 4, 5 or 6.

Particular preference is given to mono- or polycyclic, aromatic or heteroaromatic groups $Ar^3$ in formula (I), $Ar^4$ in formulae (Ia), (Ib), (II), (III), (IV), (V), (VI), (VII), (VIIIa), (VIIIb), (IX), (X), (XI), (XII), (XIII), (XIV), (XV) and/or (XVI); $Ar^5$ and $Ar^8$ in formulae (VIIIa) and/or (VIIIb), as well as the corresponding preferred embodiment of following formulae:

E1a

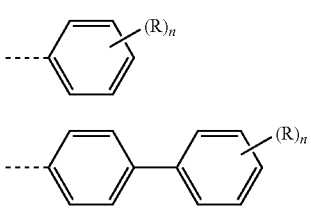

E2a

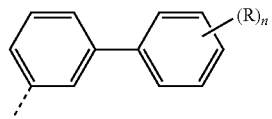

E2b

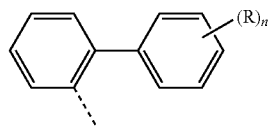

E2c

E3a

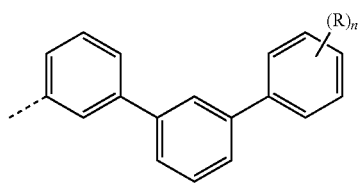

E4a

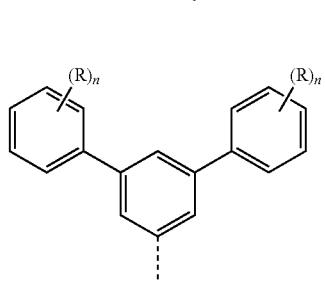

E5a

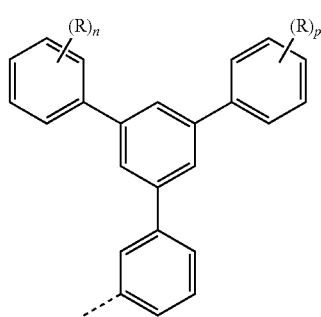

E6a

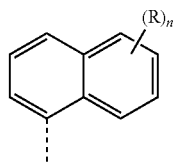

E6b

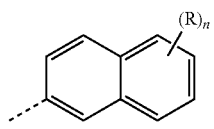

E7a

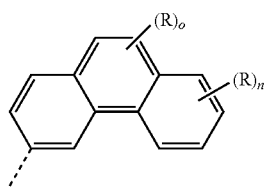

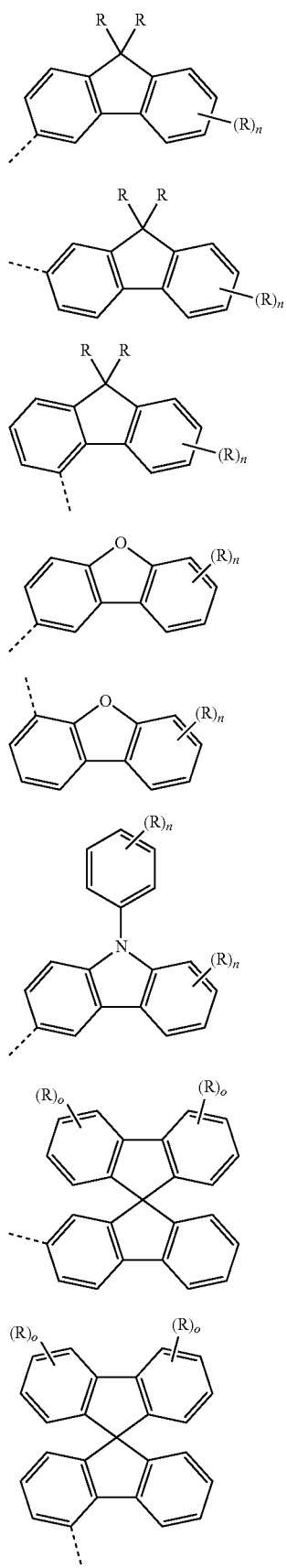
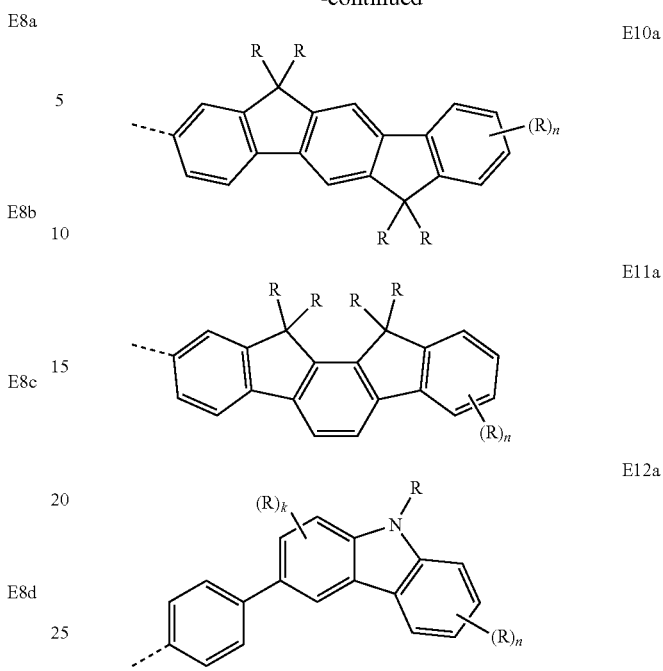

R in formulae E1a to E12a can adopt the same meaning as indicated for formula (I).

The indices have the following meaning:

o=0 or 1; and n=0, 1, 2 or 3.

Particular preference is given to mono- or polycyclic, aromatic or heteroaromatic groups $Ar^2$ and $Ar^3$ in formula (I), $Ar^5$, $Ar^7$ and $Ar^8$ in formulae (IIa), $Ar^4$, $Ar^5$ and $Ar^8$ in formulae (IIb), as well as $Ar^9$ in formula (III), which have following formulae:

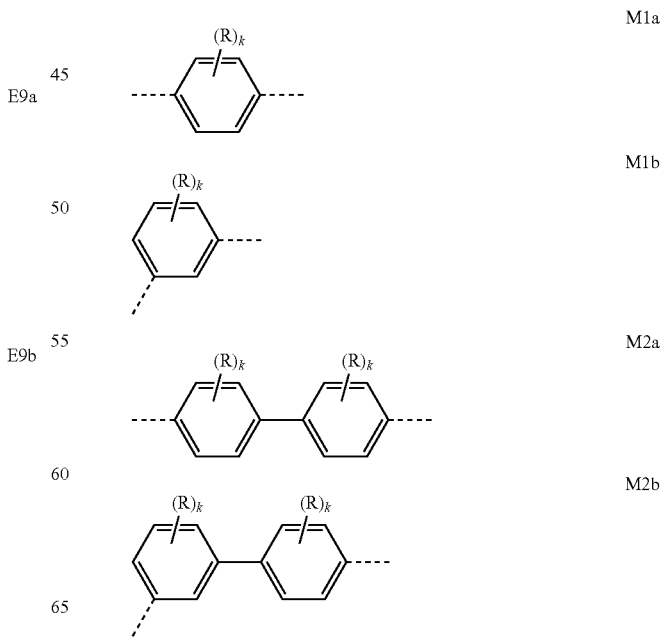

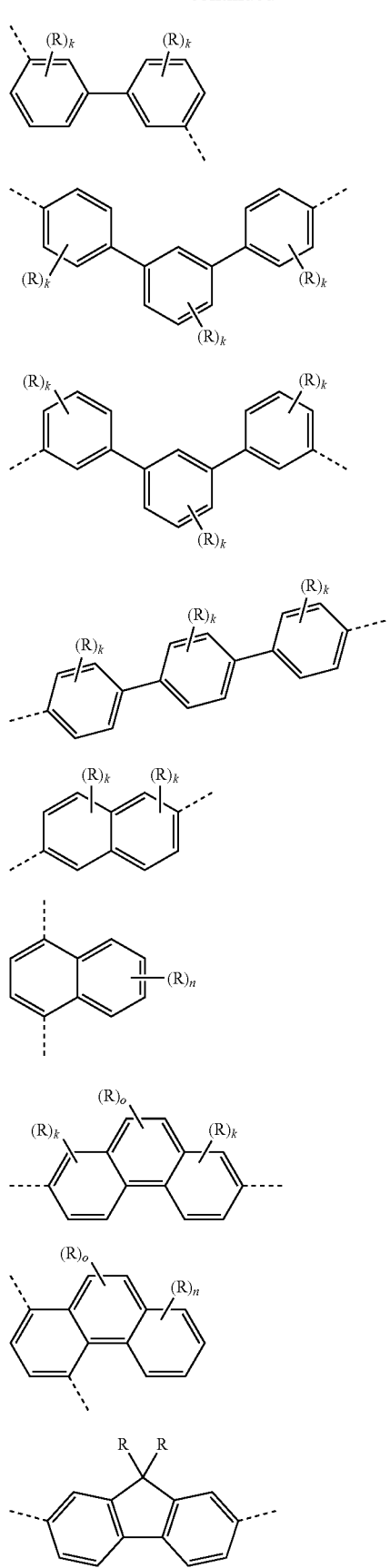
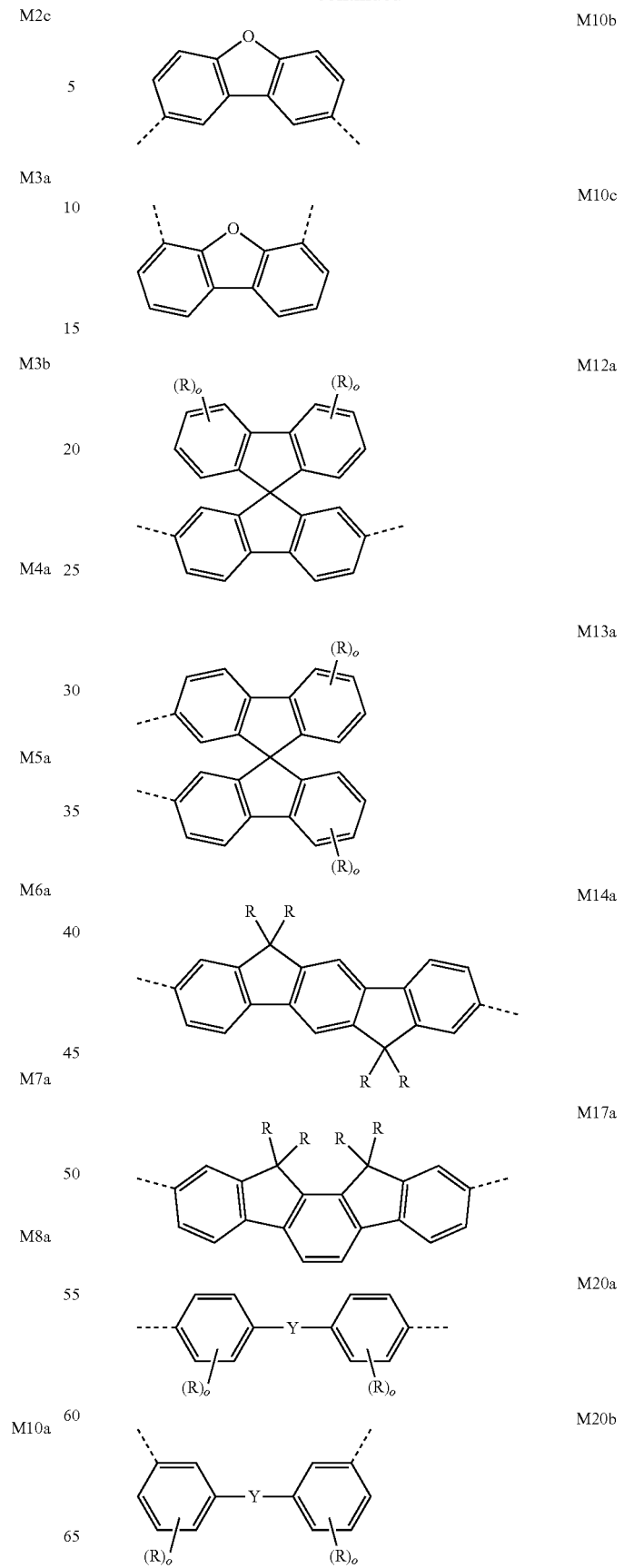

M20c

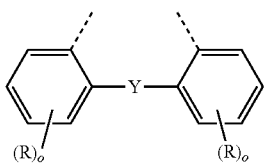

M21a

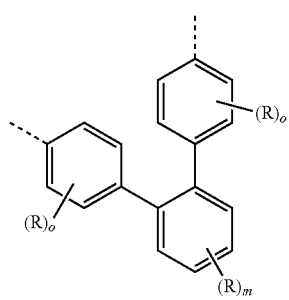

M21b

M22a

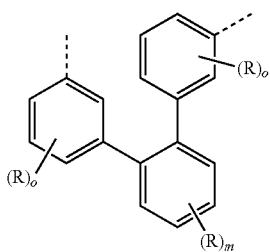

M22b

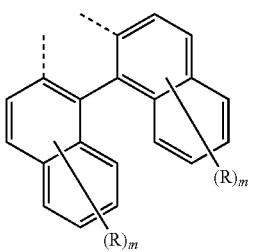

M23a

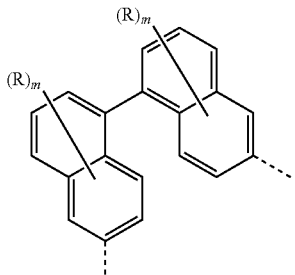

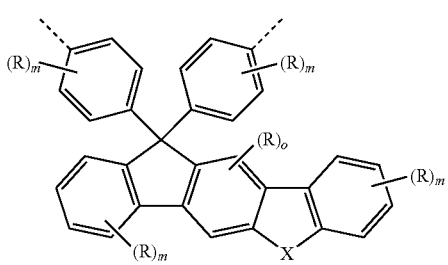

M20c

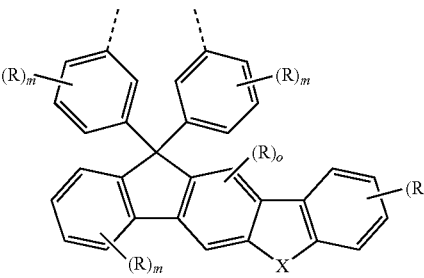

M23b

R in formulae M1a to M23b can adopt the meaning indicated for formula (I), X can adopt the meaning indicated for formulae (Ia) and/or (Ib).

Y can be $CR_2$, $SiR_2$, O, S, a straight alkyl group having 1 to 10 C atoms, or an alkenyl or alkynyl group having 2 to 10 C atoms, which may in each case be substituted by one or more radicals $R^1$, where one or more non-adjacent $CH_2$ groups, CH-groups or C atoms of the alkyl, alkenyl or alkinyl group group may be replaced by $S_1(R^1)_2$, C=O, C=$NR^1$, P(=O)($R^1$), $NR^1$, O, $CONR^1$ or an aromatic or heteroaromatic ring system having 5 to 30 aromatic ring atoms, which may in each case be substituted by one or more radicals $R^1$, or an aryloxy or heteroaryloxy group having 5 to 30 aromatic ring atoms, which may be substituted by one or more radicals $R^1$, or an aralkyl or heteroaralkyl group having 5 to 30 aromatic ring atoms, which may be substituted by one or more radicals $R^1$, or a diarylamino group, diheteroarylamino group or arylheteroarylamino group having 10 to 20 aromatic ring atoms, which may be substituted by one or more radicals $R^1$, wherein R and $R^1$ can adopt the same meaning as indicated for formula (I).

The indices have the following meaning:
k=0 or 1;
m=0, 1, 2, 3 or 4;
n=0, 1, 2 or 3;
o=0, 1 or 2.

The concentration of the polymer in the formulation according to the invention is preferably in the range of from 10 g/l to 100 g/l, more preferably 15 g/l to 80 g/l, and most preferably 20 g/l to 60 g/l, based on the total formulation.

In a second preferred embodiment, the organic semiconductor according to the invention is a low-molecular hole-transport material and/or hole-injection material having a molecular weight of ≤5000 g/mol, preferably ≤3000 g/mol, and more preferably ≤2000 g/mol.

Preferably, the low molecular hole-transport material and/or hole-injection material is a triarylamine compound having three aromatic or heteroaromatic ring systems $Ar^1$, $Ar^2$, $Ar^3$, wherein at least one of $Ar^1$, $Ar^2$, $Ar^3$ is substituted by $Ar^4$ in at least one, preferably in one of the two ortho positions, where $Ar^4$ is a mono- or polycyclic, aromatic or heteroaromatic ring system having 5 to 60 aromatic ring atoms, which may be substituted by one or more radicals R.

More preferably, the triarylamine compound has the following formula (I'):

(I')

where the symbols and indices can adopt the same meaning as for formula (I).

In a preferred embodiment, $Ar^3$ according to formula (I') is in at least one, preferably in one of the two ortho-positions relating to the Nitrogen atom represented in formula (I'), substituted by $Ar^4$, where $Ar^4$ is a mono- or polycyclic, aromatic or heteroaromatic ring system with 5 to 60 aromatic ring atoms, which may be substituted by one or more radical R, where R can adopt the meanings indicated above.

$Ar^4$ here may either be linked directly, i.e. via a single bond, to Ar, or alternatively via a linking group X.

The compound of formula (I) thus preferably has the following formula (Ia').

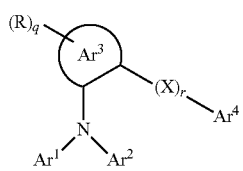
(Ia')

where $Ar^1$, $Ar^2$, $Ar^3$, $Ar^4$ and R can adopt the meanings indicated above, q=0, 1, 2, 3, 4, 5 or 6, preferably 0, 1, 2, 3 or 4, X=$CR_2$, NR, $SiR_2$, O, S, C=O or P=O, preferably $CR_2$, NR, O or S, and r=0 or 1, preferably 0.

In another preferred embodiment of the present invention, the compound of formula (I') is characterised in that $Ar^3$ is substituted by $Ar^4$ in one of the two ortho positions, and $Ar^3$ is additionally linked to $Ar^4$ in the meta position that is adjacent to the substituted ortho position.

The compound of formula (I') thus preferably has the following formula (Ib'):

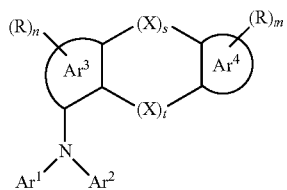
(Ib')

where $Ar^1$, $Ar^2$, $Ar^3$, $Ar^4$ and R can adopt the meanings indicated above, m=0, 1, 2, 3 or 4, n=0, 1, 2 or 3, X=$CR_2$, NR, $SiR_2$, O, S, C=O or P=O, preferably $CR_2$, NR, O or S, and s and t are each 0 or 1, where the sum (s+t)=1 or 2, preferably 1.

In a first more preferred embodiment, the compound of formula (I') is selected from the following formulae (II'), (III') and (IV'):

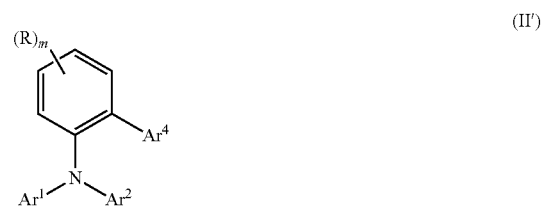
(II')

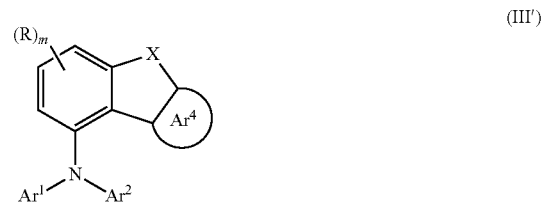
(III')

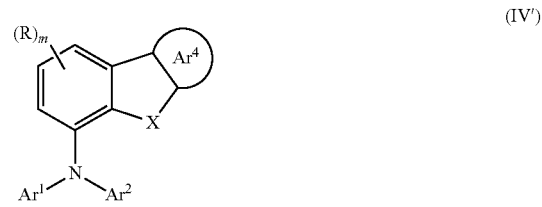
(IV')

where $Ar^1$, $Ar^2$, $Ar^4$ and R can adopt the meanings indicated above, m=0, 1, 2, 3 or 4, n=0, 1, 2 or 3, and X=$CR_2$, NR, $SiR_2$, O, S, C=O or P=O, preferably $CR_2$, NR, O or S.

In a particularly preferred embodiment, the compound of formula (II') is selected from the following formula (V'):

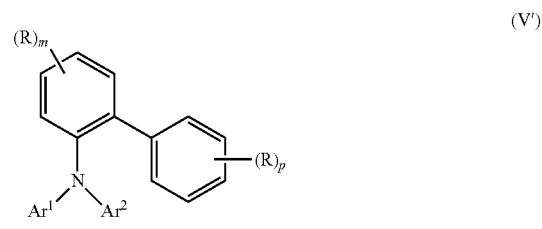
(V')

where $Ar^1$, $Ar^2$, R and m can adopt the meanings indicated above, and p=0, 1, 2, 3, 4 or 5.

Examples of preferred compounds of formula (V') are depicted in the following table:

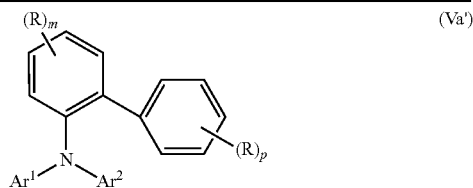
(Va')

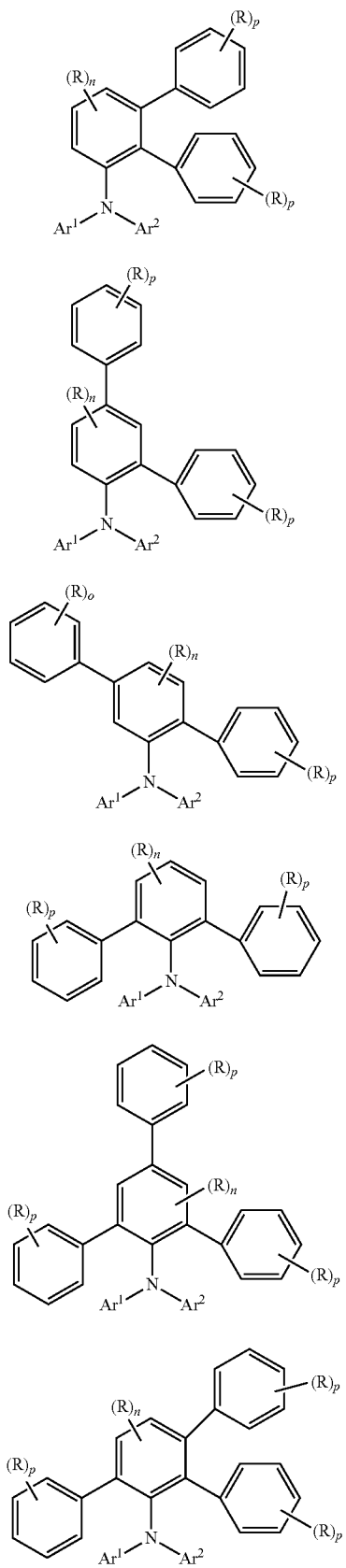
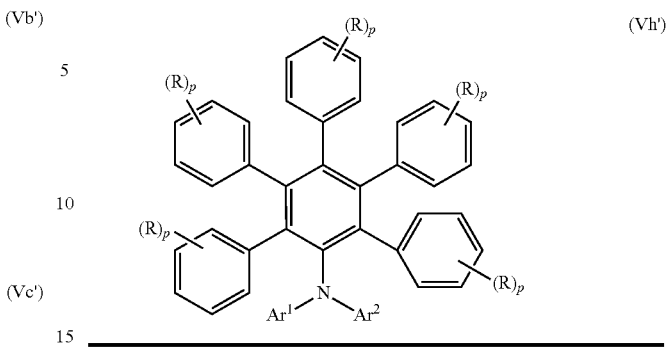
where Ar$^1$, Ar$^2$, R, m, n and p can adopt the meanings indicated above, and
k=0, 1 or 2.
In a further particularly preferred embodiment, the compound of formula (III') is selected from the following formula (VI'):
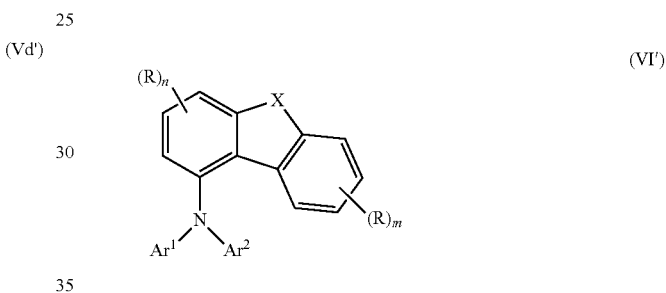
where Ar$^1$, Ar$^2$, R, m and n can adopt the meanings indicated above.
Examples of preferred compounds of formula (VI') are depicted in the following table:
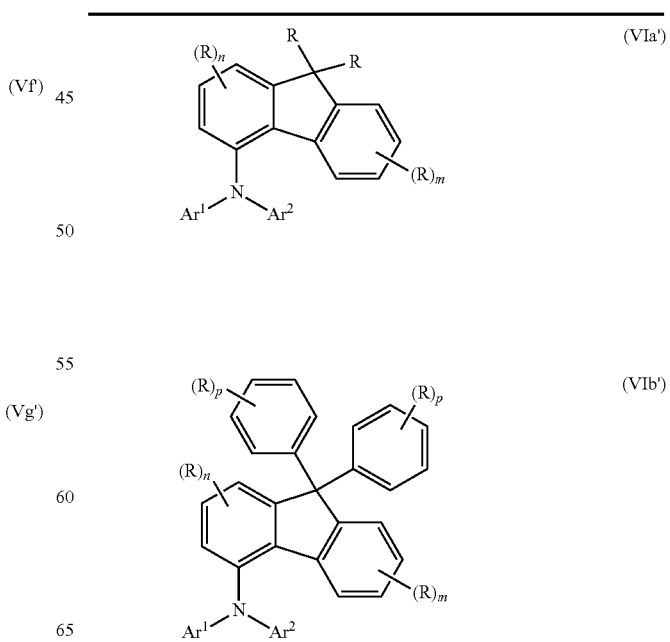

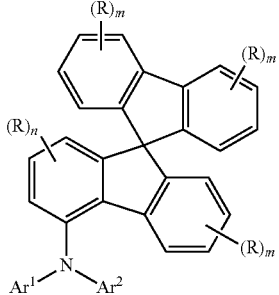 (VIc')

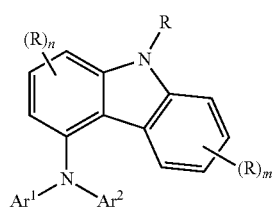 (VId')

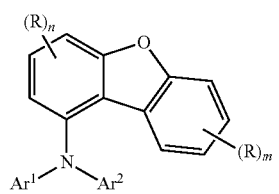 (VIe')

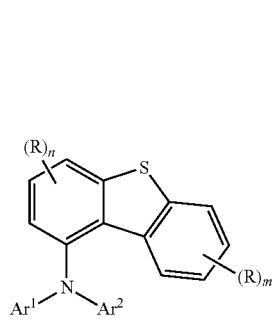 (VIf')

where Ar¹, Ar², R, m, n and p can adopt the meanings indicated above.

In still a further particularly preferred embodiment, the compound of formula (IV') is selected from the following formula (VII'):

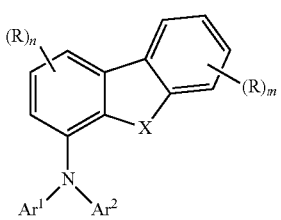 (VII')

where Ar¹, Ar², R, m and n can adopt the meanings indicated above.

Examples of preferred compounds of formula (VII') are depicted in the following table:

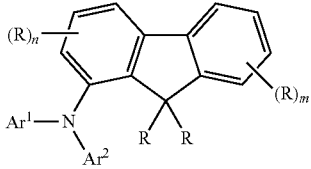 (VIIa')

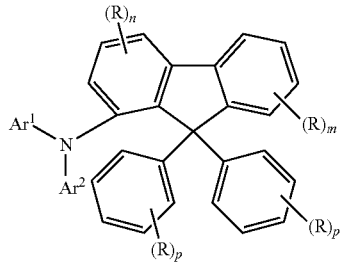 (VIIb')

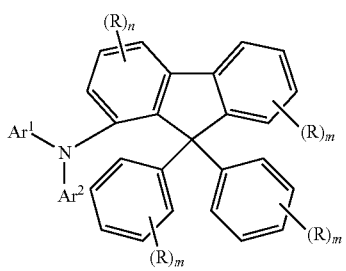 (VIIc')

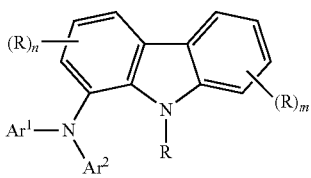 (VIId')

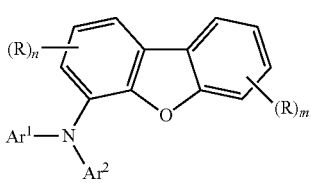 (VIIe')

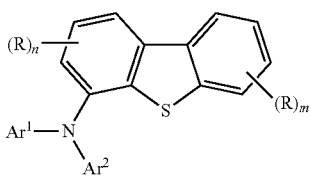 (VIIf')

where Ar¹, Ar², R, m, n and p can adopt the meanings indicated above.

In a very particularly preferred embodiment, the compound of formula (V') is selected from the following formula (Vg'):

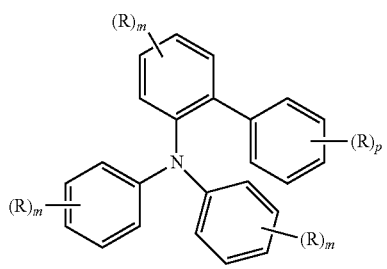
(Vg')
where R, m and p can adopt the meanings indicated above.
Examples of preferred compounds of formula (Vg') are depicted in the following table:
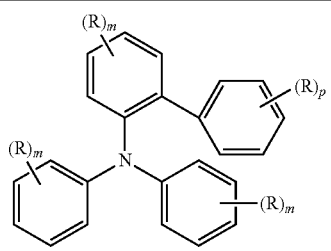
(Vg-1')
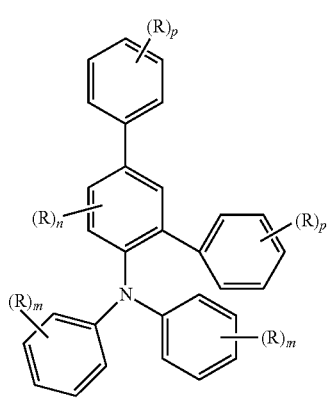
(Vg-2')
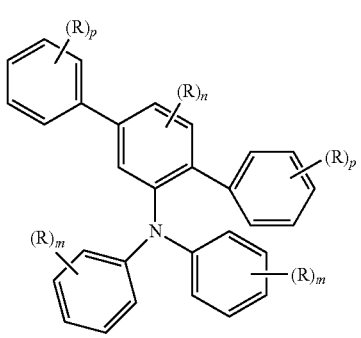
(Vg-3')
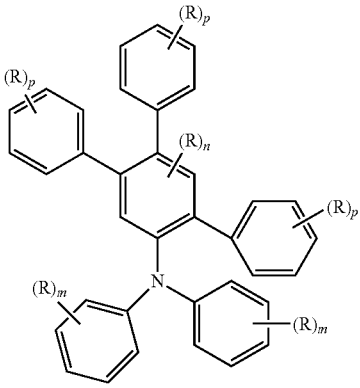
(Vg-4')
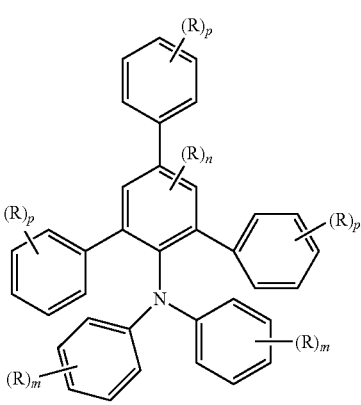
(Vg-5')
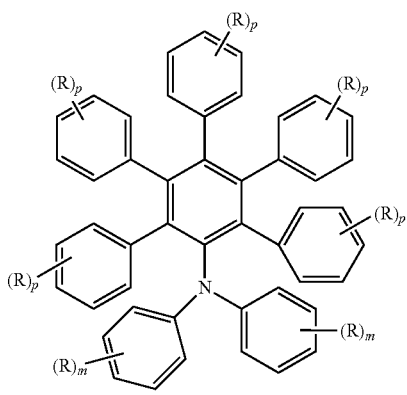
(Vg-6')
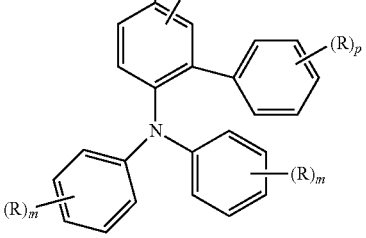
(Vg-7')

| | |
|---|---|
| 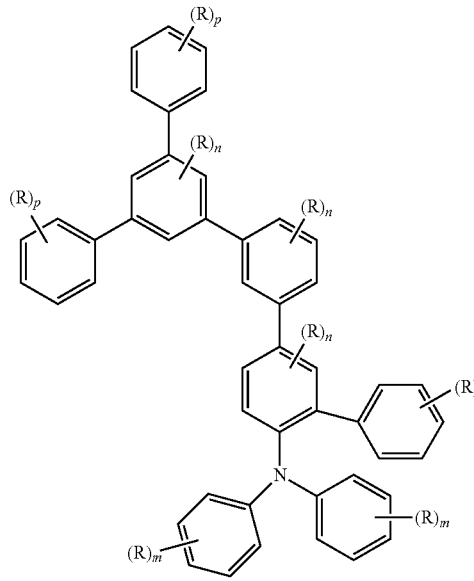 (Vg-8') | 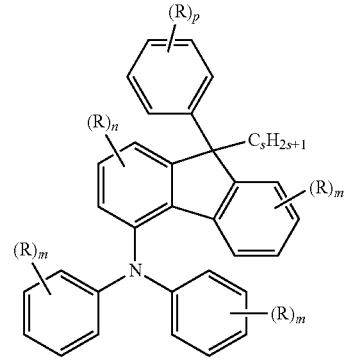 (VIg-2') |
where R, k, m, n and p can adopt the meanings indicated above.
In a further very particularly preferred embodiment, the compound of formula (VI') is selected from the following formula (VIg'):
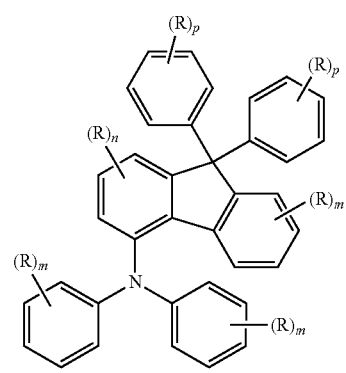
(VIg-3')
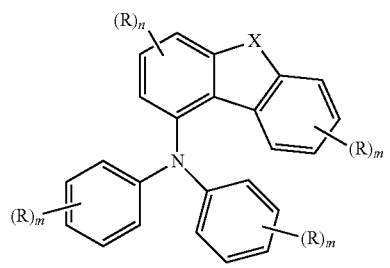
(VIg')
where R, X, m and n can adopt the meanings indicated above.
Examples of preferred compounds of formula (VIg') are depicted in the following table:
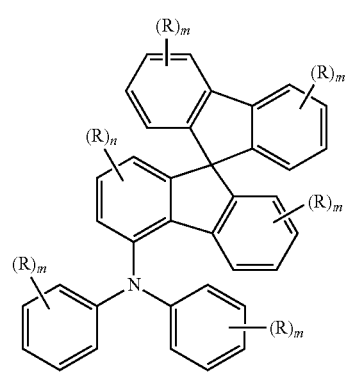
(VIg-4')
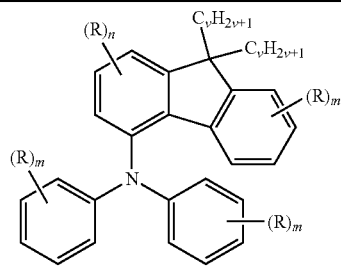
(VIg-1')
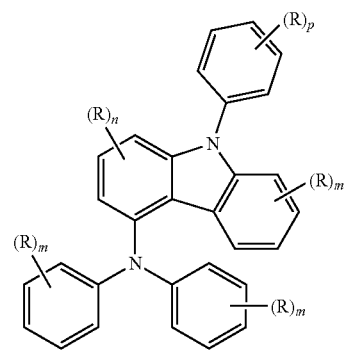
(VIg-5')

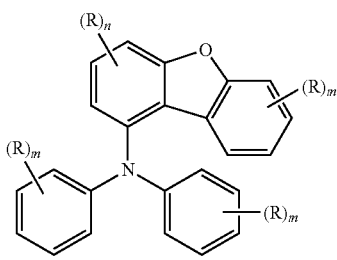

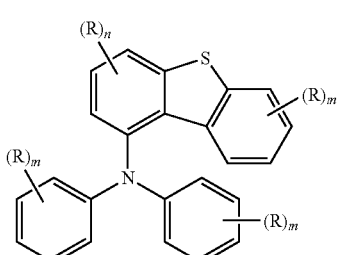

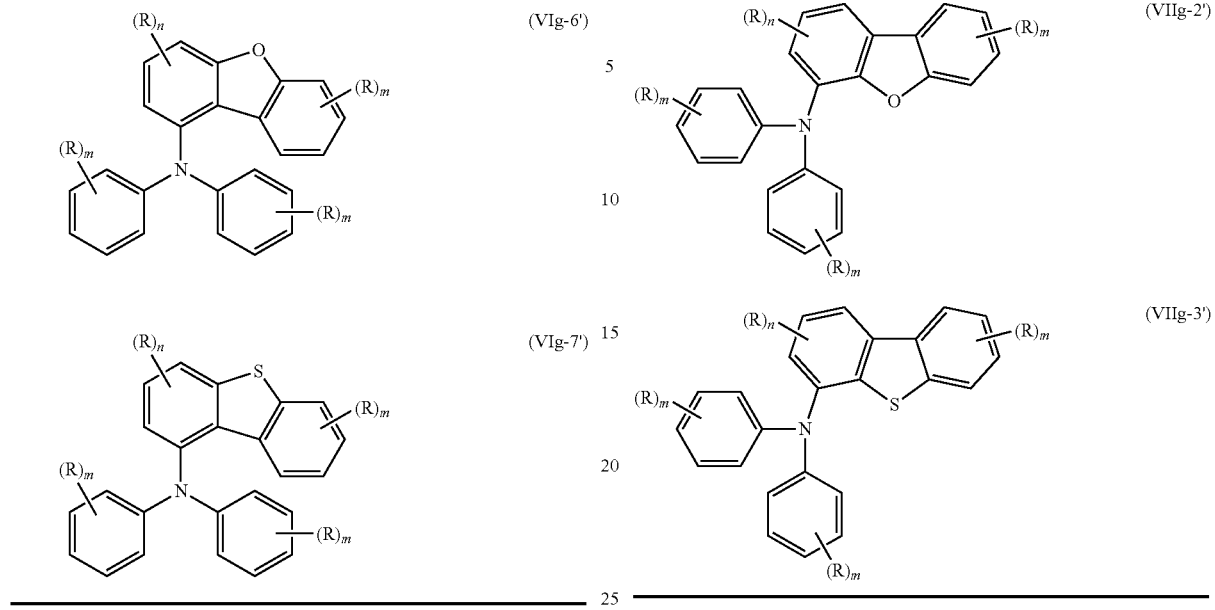

where R, m, n and p can adopt the meanings indicated above, and v=1 to 20, preferably 1 to 10.

In still a further very particularly preferred embodiment, the compound of formula (VII') is selected from compounds of the following formula (VIIg'):

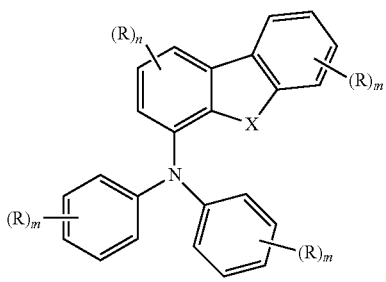

where R, X, m and n can adopt the meanings indicated above.

Examples of preferred compounds of formula (VIIg') are depicted in the following table:

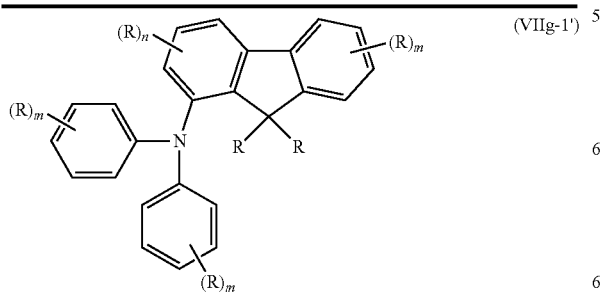

where R, m and n can adopt the meanings indicated above.

The concentration of the polymer in the formulation according to the invention is preferably in the range of from 10 g/l to 100 g/l, more preferably 15 g/l to 80 g/l, and most preferably 20 g/l to 60 g/l, based on the total formulation.

The formulations according to the present invention comprise at least one metal complex.

In a preferred embodiment, the metal complex comprises a metal atom of group 13 to 15 and a ligand of the following structure

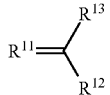

where $R^{11}$ and $R^{12}$ are selected, identically or differently, from the group consisting of O, S, Se, NH or $NR^{14}$, where $R^{14}$ is an alkyl or aryl group having preferably 1 to 40 C atoms, ore preferably 1 to 20 C atoms and most preferably 1 to 12 C atoms; where $R^{14}$ and $R^{13}$ may form a ring with one other; and $R^{13}$ is selected from the group consisting of a straight-chain alkyl, alkoxy or thioalkyl group having 1 to 40 C atoms or an alkenyl or alkinyl group having 2 to 40 C atoms or a branched or cyclic alkyl, alkoxy or thioalkyl group having 3 to 40 C atoms, each of which may be substituted by one or more radicals $R^1$, where in each case one or more non-adjacent $CH_2$ groups may be replaced by $R^1C=CR^1$, C≡C, $S_1(R^1)_2$, C=O, C=S, C=$NR^1$, P(=O)($R^1$), SO, $SO_2$, $NR^1$, O, S or $CONR^1$ and where one or more H atoms may be replaced by D, F, Cl, Br, I or CN, an aromatic or heteroaromatic ring system having 5 to 60 aromatic ring atoms, which may in each case be substituted by one or more radicals $R^1$, an aryloxy or heteroaryloxy group having 5 to 60 aromatic ring atoms, which may be substituted by one or more radicals $R^1$, or an aralkyl or heteroaralkyl group having 5 to 60 aromatic ring atoms, which may in each case be substituted by one or more radicals $R^1$, or a diarylamino group, diheteroarylamino group or arylheteroarylamino group having 10 to 40 aromatic ring atoms, which may be substituted by one or more radicals $R^1$; where $R^{13}$ may form a ring with at least one of the radical $R^{12}$; and $R^1$ is on each occurrence, identically or differently, H, D, F or an aliphatic hydrocarbon radical having 1 to 20 C atoms, an aromatic and/or a heteroaromatic hydrocarbon radical having 5 to 20 C atoms, in which, in addition, one or more H atoms may be replaced by F; where two or more substituents $R^1$ may also form a mono- or polycyclic, aliphatic or aromatic ring system with one another.

The metal complex is preferably a "p-dopant" material.

According to the present invention, "p-dopant" materials are materials, which exhibit a lewis-acidity and/or which are able to form a complex with the matrix material, in which these materials act as Lewis-acids (also wenn only formal).

$R^{13}$ in formula (L-I) is preferably selected from the group consisting of a straight-chain alkyl, long-chain alkyl, alkoxy, long-chain alkoxy, cycloalkyl, halogenalkyl, aryl, arylene, halogenoaryl, heteroaryl, heteroarylene, heterocycloalkylene, heterocycloalkyl, halogenoheteroaryl, alkenyl, halogenalkenyl, alkinyl, halogenalkinyl, ketoaryl, halogenoketoaryl, ketoheteroaryl, ketoalkyl, halogenoketoalkyl, ketoalkenyl, or halogenketoalkenyl, which preferably have 1 to 40 C atoms, more preferably 1 to 20 C atoms, where in each case one or more non-adjacent $CH_2$ groups may be replaced by —O—, —S—, —NH—, —NR—, —SiR$_2$—, —CO—, —COO—, —OCO—, —OCO—O—, —SO$_2$—, —S—CO—, —CO—S—, —CR=CR— or —C≡C— and in a way that O and/or S are not directly linked with each other, as well as by an aryl- or heteroaryl preferably having 1 to 30 C atoms (terminal $CH_3$ groups are understood as $CH_2$ groups in terms of $CH_2$—H), where R can adopt the same meaning as above for formula (I).

A long-chain alkyl group, considering the description of $R^{11}$, $R^{12}$ and $R^{13}$ according to formula (L-I), preferably has 5 to 20 C atoms. Further considering the description of $R^{11}$, $R^{12}$ and $R^{13}$, alkyl groups where it is not precised that they are "long-chain", can preferably have 1 to 10, more preferably 1 to 4 C atoms.

The description and definition of the groups, in particular the description and definition of the preferred groups in the frame of formula (L-I) are to be found inter alia in WO 2013/182389 A2 filed on 14 May 2013 at the European Patent Office with the application number PCT/EP2013/059911, where the disclosure of this document is added by reference in the description of the present application.

The term "metal atom of group 13 to 15" refer to metals of the 13. to 15. group according to IUPAC, that is, aluminum, gallium, indium, silicon, germanium, tin, lead, thallium, arsenic, antimony, bismuth or mixtures thereof.

Preference is given to metals of groups 14 and 15, that is, silicon, germanium, tin, lead, arsenic, antimony, bismuth, more preferably tin and/or bismuth, most preferably bismuth.

In a further preferred embodiment of the present invention, the metal atom of the metal complex according to the invention is selected from the group consisting of bismuth, tin or mixtures thereof, where bismuth is particularly preferred.

According to a preferred embodiment, the metal complex is a mono- or bi- or polynuclear metal complex. More particularly, the metal complex can, in solid state, be present as a polynuclear metal complex.

According to a preferred embodiment, at least one of ligand L is bridged to two metal atoms.

According to a preferred embodiment, the metal complex has the sum formula $M_2L_4$, (with M=metal atom and L=ligand), where both the metals and the individual ligands, independently from each others, can be selected according to the above definition.

The metal complex can further have the following structure: $ML_m$, where M=Metal atom, L=ligand and m=1 to 10 and for the case that m>1, all L are independent from each others. These metal complexes are particularly preferred for tin and Bismuth; in this case, m is preferably equal to 2 for tin and respectively 2.4 and 3 or 5 for bismuth depending on the oxidation state.

According to an alternative preferred embodiment of the invention, the metal complex has the following structure: $ML_2L'_n$, with M=metal atom, L=ligand, as defined above and L'=ligand different from L selected from the group consisting of aryl, heteroaryl, halogenoaryl and halogenoheteroaryl groups, where n is from 0 to 3 and in the case that n>1, each L' is selected independently from each other. These metal complexes are particularly preferred for tin and Bismuth; in this case, n is preferably equal to 2 for tin and respectively 2 or 3 for bismuth depending on the oxidation state, n=0 is preferred.

It is particularly preferred that the metal complex comprises bismuth as a metal atom. Particular preference is given to bismuth-metal complexes of:

Oxidation stage II, which can exhibit—without wishing to be bound by theory—a paddle-wheel structure as a function of the selected ligand.

Oxidation stage III, ($ML_n$=3), which can not exhibit— without wishing to be bound by theory—a paddle-wheel structure. These compounds are generally mono- or polynuclear compounds in solid state.

Oxidation stage V, where a preferred form of the bismuth-metal complex of oxidation stage V corresponds to the form described in WO 2013/182389 A2.

In a further preferred embodiment according to the present invention, a possible metal complex is a metal complex of formula (L-1), in which $R^{13}$ has at least one substituent, which is selected from halogens, pseudohalogens, —CN, —NO$_2$.

Advantageously, a metal complex according to the invention is a metal complex of formula (L-I), in which $R^{13}$ corresponds to one of the following formula ($R^{13}$-I), ($R^{13}$-II) or ($R^{13}$-III) as depicted below:

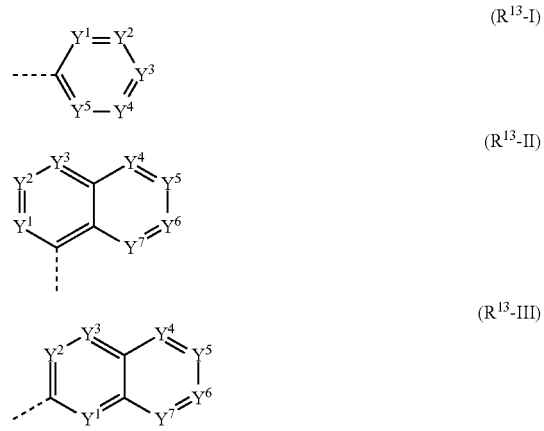

where $Y^1$ to $Y^7$ are, on each occurrence, independently from each other, selected from the group consisting of C—F, C—CF$_3$, C—NO$_2$, C—CN, C-halogen, C-pseudohalogen or N and the dashed lines represent the connecting sites.

According to one of the preferred embodiment, $R^{13}$ is selected from the group consisting of halogenated, preferably perhalogenated and/or pseudohalogenated pteridine, isopteridine, napthyridine, quinoxaline, azaquinoxaline.

$R^{13}$ can further correspond to one of the following structures of the following formulae:

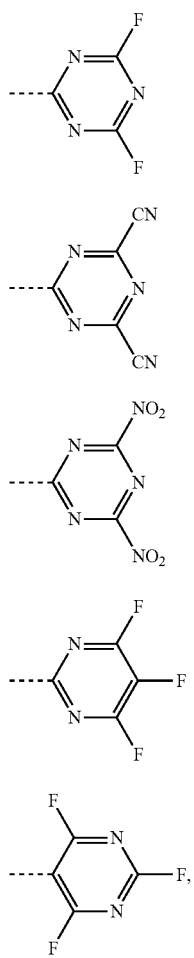

where the dashed lines represent the connecting sites.

According to a preferred embodiment, the metal complex is a lewis-acid (without the presence of matrix material), that is, the metal complex acts as an electron pair acceptor. This is particularly adapted for the interaction with the matrix material.

According to a preferred embodiment, the metal complex (without the presence of a matrix material) has at least one open or at least partly accessible coordination site. This is also particularly adapted for the interaction with the matrix material.

According to a preferred embodiment, $R^{13}$ is selected from the group consisting in halogenoalkyl groups, preferably perfluoralkyl with 1 to 8 C atoms, more preferably 1 to 4 C atoms, halogenoaryl, preferably perfluoraryl, halogenoalkylaryl, preferably perfluoralkylaryl and halogenheteroaryl, preferably perfluorheteroaryl, where these groups preferably have 6 to 20 C atoms.

The metal complex can further comprise a ligand L, which is selected from the group consisting of non-substituted, partially fluorinated or perfluorinated organic carboxylic acids Further examples of preferred ligands L are fluorinated benzoic acids like 2-(trifluoromethyl) benzoic acid; 3,5-difluorobenzoic acid; 3-hydroxy-2,4,6-triiodobenzoic acid; 3-fluoro-4-methylbenzoic acid; 3-(trifluoromethoxy)benzoic acid; 4-(trifluoromethoxy)benzoic acid; 4-chloro-2,5-difluorobenzoic acid; 2-chloro-4,5-difluorobenzoic acid; 2,4,5-trifluorobenzoic acid; 2-fluorobenzoic acid; 4-fluorobenzoic acid; 2,3,4-trifluorobenzoic acid; 2,3,5-trifluorobenzoic acid; 2,3-difluorobenzoic acid; 2,4-bis(trifluoromethyl)benzoic acid; 2,4-difluorobenzoic acid; 2,5-difluorobenzoic acid; 2,6-bis(trifluoromethyl)benzoic acid; 2,6-difluorobenzoic acid; 2-Chloro-6-fluorobenzoic acid; 2-fluoro-4-(trifluoromethyl)benzoic acid; 2-fluoro-5-(trifluoromethyl)benzoic acid; 2-fluoro-6-(trifluoromethyl)benzoic acid; 3,4,5-trifluorobenzoic acid; 3,4-difluorobenzoic acid; 3,5-bis(trifluoromethyl)benzoic acid; 3-(trifluoromethyl)benzoic acid; 3-chloro-4-fluorobenzoic acid; 3-fluoro-5-(trifluoromethyl)benzoic acid; 3-fluorobenzoic acid; 4-fluoro-2-(trifluoromethyl)benzoic acid; 4-fluoro-3-(trifluoromethyl)benzoic acid; 5-fluoro-2-methylbenzoic acid; 2-(trifluoromethoxy)benzoic acid; 2,3,5-Trichlorobenzoic acid; 4-(Trifluoromethyl)benzoic acid; pentafluorobenzoic acid; 2,3,4,5-tetrafluorobenzoic acid, fluorinated or non-fluorinated phenylacetic acid like for example 2-fluoro-phenylacetic acid; 3-fluoro-phenylacetic acid; 4-fluoro-phenylacetic acid; 2,3-difluoro-phenylacetic acid; 2,4-difluoro-phenylacetic acid; 2,6-difluoro-phenylacetic acid; 3,4-difluoro-phenylacetic acid; 3,5-difluoro-phenylacetic acid; pentafluorophenylacetic acid; 2-chloro-6-fluoro-phenylacetic acid; 2-chloro-3,6-difluoro-phenylacetic acid; 3-chloro-2,6-difluoro-phenylacetic acid; 3-chloro-4-fluoro-phenylacetic acid; 5-chloro-2-fluoro-phenylacetic acid; 2,3,4-trifluorophenylacetic acid; 2,3,5-trifluoro-phenylacetic acid; 2,3,6-trifluoro-phenylacetic acid; 2,4,5-trifluoro-Phenylacetic acid; 2,4,6-trifluoro-phenylacetic acid; 3,4,5-trifluoro-phenylacetic acid; 3-chloro-2-fluoro-phenylacetic acid; α-fluoro-phenylacetic acid; 4-chloro-2-fluoro-phenylacetic acid; 2-chloro-4-fluoro-phenylacetic acid; α,α-difluoro-phenylacetic acid; ethyl-2,2-difluoro-2-phenylacetate; and fluorinated or non-fluorinated acetic acid as for example methyltrifluoroacetic acid; allyl-trifluoroacetic acid; ethyltrifluoroacetic acid; isopropyl-trifluoroacetic acid; 2,2,2-trifluoroethyltrifluoroacetic acid; difluoroacetic acid; trifluoroacetic acid; methylchlorodifluoroacetic acid; ethyl-bromodifluoroacetic acid; chlorodifluoroacetic acid; ethylchlorofluoroacetic acid; ethyl-difluoroacetic acid; (3-chlorophenyl)-difluoroacetic acid; (3,5-difluorophenyl)difluoroacetic acid; (4-butylphenyl)difluoroacetic acid; (4-tertbutylphenyl)difluoroacetic acid; (3,4-dimethylphenyl)-difluoroacetic acid; (3-chloro-4-fluorophenyl)-difluoroacetic acid; (4-chlorophenyl)difluoroacetic acid; 2-biphenyl-3',5'-difluoroacetic acid; 3-biphenyl-3',5'-difluoroacetic acid; 4-biphenyl-3',5'-difluoroacetic acid; 2-biphenyl-3',41-difluoroacetic acid; 3-biphenyl-3',4'-difluoroacetic acid; 4-biphenyl-3',4'-difluoroacetic acid and 2,2-bifluoro-propionic acid and their higher homologues. In case that the ligand L contains acid groups, then these groups are preferably deprotonated.

Particular preference is given to metal complexes like $Bi(O_2CCF_3)_3$, $Bi(O_2CC_6H_2 (2, 3, 4-F_3))_3$ and Bismuth-tris-pentafluorobenzoate.

The concentration of the of the metal complex according to the invention can be in the range of from 5 g/l to 100 g/l, preferably 7.5 g/l to 80 g/l, and more preferably 10 g/to 60 g/l, based on the total formulation.

Advantageously, the weight ratio of the semiconductor to the metal complex in the formulation of the invention is from 1000:1 to 1:2, preferably from 400:1 to 1:1, more preferably from 100:1 to 3:2 and most preferably from 20:1 to 2:1. The amount of metal complex to organic semiconductor is preferably from 0.1 to 70 wt. %, more preferably from 0.25 to 50 wt. %, most preferably from 1 to 40 wt. % and very most preferably from 5 to 30 wt. %, calculated on the total amount of organic semiconductor and metal complex. It is possible to use a higher or lower amount of metal complex, but the performance of the layer obtained from the formulation according to the invention can decrease as a consequence.

Besides the said components, the formulation according to the invention may comprise further additives and processing assistants. These include, inter alia, surface-active substances, surfactants, lubricants and greases, additives which increase the conductivity, dispersants, hydrophobicising agents, adhesion promoters, flow improvers, antifoams, deaerating agents, diluents, which may be reactive or unreactive, fillers, assistants, processing assistants, dyes, pigments, stabilisers, sensitisers, nanoparticles and inhibitors.

Further object of the present invention is a method for the preparation of a formulation according to the invention. The preferred method comprises the following steps:

a. Preparing a first solution comprising at least one solvent and at least one metal complex and b. Preparing a second solution comprising at least one solvent and at least one organic semiconductor and c. Mixing the first solution obtained in step a) and the second solution obtained in step b) in a specific ratio and forming a formulation by a physical method.

A formulation in accordance with the present invention can be employed for the production of a layer or multilayered structure in which the organofunctional materials are present in layers, as are required for the production of preferred electronic or opto-electronic components, such as OLEDs.

The formulation of the present invention can preferably be employed for the formation of a functional layer comprising an organic semiconductor and a metal complex on a substrate or on one of the layers applied to the substrate.

Still further object of the invention is a process for the production of an electronic device with a multilayer structure, wherein at least one layer is obtained from the application of a formulation of the present invention. Preferably, a formulation according to the invention is applied to a substrate and dried.

The functional layer obtained from the formulation according to the invention can be produced, for example, by flood coating, dip coating, spray coating, spin coating, screen printing, relief printing, gravure printing, rotary printing, roller coating, flexographic printing, offset printing or nozzle printing, preferably ink-jet printing on a substrate or one of the layers applied to the substrate.

After the application of a formulation according to the invention to a substrate or a functional layer already applied, a drying step can be carried out in order to remove the solvent. The drying can preferably be carried out at relatively low temperature and over a relatively long period in order to avoid bubble formation and to obtain a uniform coating. The drying can preferably be carried out at a temperature in the range from 80 to 300° C., particularly preferably 150 to 250° C. and especially preferably 180 to 200° C. The drying here can preferably be carried out at a pressure in the range from 10-mbar to 2 bar, particularly preferably in the range from $10^{-2}$ mbar to 1 bar and especially preferably in the range from $10^{-1}$ mbar to 100 mbar. The duration of the drying depends on the degree of drying to be achieved, where small amounts of water can optionally be removed at relatively high temperature and in combination with sintering, which is preferably to be carried out.

Another object of the invention is an electronic device obtainable by such a process for the production of an electronic device.

An electronic device is taken to mean a device which comprises anode, cathode and at least one functional layer in between, where this functional layer comprises at least one organic or organometallic compound.

The organic, electronic device is preferably an organic electroluminescent device (OLED), a polymeric electroluminescent device (PLED), an organic integrated circuit (O-IC), an organic field-effect transistor (O-FET), an organic thin-film transistor (O-TFT), an organic, light-emitting transistor (O-LET), an organic solar cell (O-SC), an organic, optical detector, an organic photoreceptor, an organic field-quench device (O-FQD), an organic electrical sensor, a light-emitting electrochemical cell (LEC) or an organic laser diode (O-laser). Preference is given to organic electroluminescent device (OLED).

The invention is explained in greater detail below with reference to working examples, but without being restricted thereby.

WORKING EXAMPLES

Part A: Organic Semiconductor

The organic semiconductors (OS) used for the formation of the formulations according to the invention are already described in the prior art and were produced according to the literature instructions.

They are represented in the table below:

| Organic semi-conductors | Structure | Synthesis according to |
|---|---|---|
| OS1 | | WO2003/048225 WO2010/097155 |
| OS2 | | WO2003/048225 |
| OS3 | | WO2003/048225 |
| OS4 | | WO2003/048225 WO2010/097155 |

| Organic semi-conductors | Structure | Synthesis according to |
|---|---|---|
| OS5 | | WO2003/048225 |
| OS6 | | WO2012-034627 |

Part B: Metal Complex

The metal complex used for the formation of the formulations according to the invention are already described in the prior art and were produced according to the literature instructions.

An example is represented in the table below:

| Metal complex | Structure | Synthesis according to |
|---|---|---|
| M1 | Bi(OOC-C6H2F3)3 | WO 2013/182389 |

Part C: Formulation

A formulation here is taken to mean a mixture comprising at least one organic semiconductor, at least one metal complex and at least one solvent.

The solubility of a material in a solvent is the highest material-to-solvent ratio in which the solution at 20° C. is clear and stays clear for several hours.

The solubility (g/l) is determined according to the following method:
(1) A known amount of the solvent (for example 100 mL) is put in a container
(2) A defined amount of the material is added and the mixture is stirred with a magnetic stirring bar;
(3) Step (2) is repeated until some of the material does not dissolve despite a vigorous and prolonged stirring.

The solubilities (in g/l) of the various materials in various solvent at 20° C. are listed in the table below.

| | | Material | | | |
|---|---|---|---|---|---|
| | Solvent | OS3 | M1 | OS5 | OS6 |
| LM1 | Anisole:Xylene (2:1) | >20 g/l | <7.5 g/l | >20 g/l | >50 g/l |
| LM2 | Anisole | >20 g/l | <7.5 g/l | >20 g/l | 100 g/l |
| LM3 | Xylene | >20 g/l | <7.5 g/l | >20 g/l | 40 g/l |
| LM4 | Chlorobenzene | >20 g/l | <7.5 g/l | >20 g/l | |
| LM5 | THF | >40 g/l | >100 g/l | >40 g/l | >40 g/l |
| LM6 | Toluene:THF (9:1) | >50 g/l | >30 g/l | >50 g/l | >50 g/l |
| LM7 | Hexafluorobenzene | 10 g/l | 15-20 g/l | | |
| LM8 | Toluene:Hexafluorobenzene (7:3) | 40 g/l | 15 g/l | 40 g/l | 30 g/l |
| LM9 | Meta-difluorobenzene | >20 g/l | <7.5 g/l | >20 g/l | |
| LM10 | Fluorobenzene | >30 g/l | <7.5 g/l | >30 g/l | |
| LM11 | Acetonitrile | <5 g/l | <10 g/l | <5 g/l | |
| LM12 | Benzonitrile | | >20 g/l | | |
| LM13 | Acetone | <5 g/l | >20 g/l | <5 g/l | |
| LM14 | DMF | <2 g/l | >40 g/l | <2 g/l | 10 g/l |
| LM15 | Toluene:DMF (8:2) | 30 g/l | 15 g/l | 30 g/l | 25 g/l |

-continued

| | Solvent | Material | | | |
|---|---|---|---|---|---|
| | | OS3 | M1 | OS5 | OS6 |
| LM16 | DMSO | <2 g/l | >20 g/l | <2 g/l | 10 g/l |
| LM17 | Methanol | <5 g/l | >20 g/l | <5 g/l | |
| LM18 | Toluene:Methanol (8:2) | 35 g/l | 20 g/l | 35 g/l | 30 g/l |
| LM19 | EGDME | <5 g/l | >20 g/l | <5 g/l | |
| LM20 | Toluene | >40 g/l | <7.5 g/l | >40 g/l | 60 g/l |

Part D: Device Examples

Formulations according to the invention, which comprise at least one organic semiconductor, at least one metal complex and at least one solvent, lead to OLEDs which are much easier to produce than OLEDs obtained from vacuum processes, and at the same time still exhibit good properties.

The production of solvent-based OLEDs has already been described in the literature, e.g. in WO 2004/037887 and in WO 2010/097155. The method is adapted to the conditions described below (layer thickness variation, materials).

The formulations according to the invention can be used in two different layer sequences:

Stack A is as follows:

Substrate,

ITO (50 nm),

Hole injection layer (HIL) (200 nm),

Cathode.

Stack B is as follows:

Substrate,

ITO (50 nm),

HIL (150 nm),

Hole transport layer (HTL) (40 nm)

Emissive layer (EML) (30 nm)

Electron transport layer (ETL) (20 nm),

Cathode.

The substrate consists of glass platelets, which are coated with a structured 50 nm thick ITO (indium tin oxide) layer. The functional layers are then applied onto the coated substrate according to the structures of Stacks A and B.

For the preparation of the hole injection layer, the formulations according to the invention as well as comparative mixtures are used. The comparative mixture according to the prior art comprises a solvent consisting of Anisole: Xylene in the ratio 2:1 (LM1). The typical solid content of such solutions is about 8-35 g/l, when film thicknesses of between 20 nm and 200 nm have to be achieved by means of spin coating. The layers were spin coated in an inert gas atmosphere, in this case argon, and heated for 60 minutes at 180° C. or 220° C.

The hole transport layer in Stack B is formed by thermal evaporation in a vacuum chamber. The materials used in this case are shown in Table D1.

TABLE D1

Structural formula of the hole-transport material (vacuum processed)

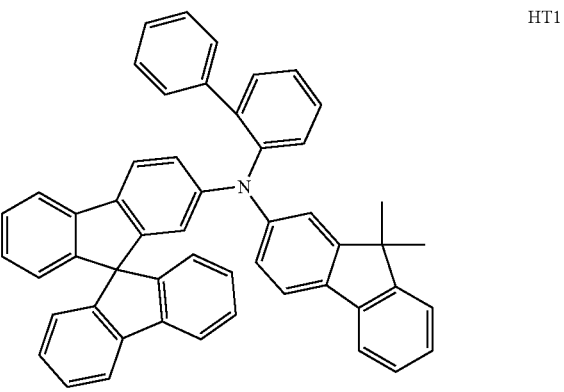

HT1

The emissive layer in Stack B is formed by thermal evaporation in a vacuum chamber. In this case, the layer may consist of more than one material, which are deposited by means of co-evaporation in a given volume fraction. A reference such as MB1:SEB (95%:5%) in this case means that the materials MB1 and SEB are present in the layer in a volume fraction of 95%:5%.

The materials used in this case are shown in Table D2.

TABLE D2

Structural formulae of the materials used in the emissive layer

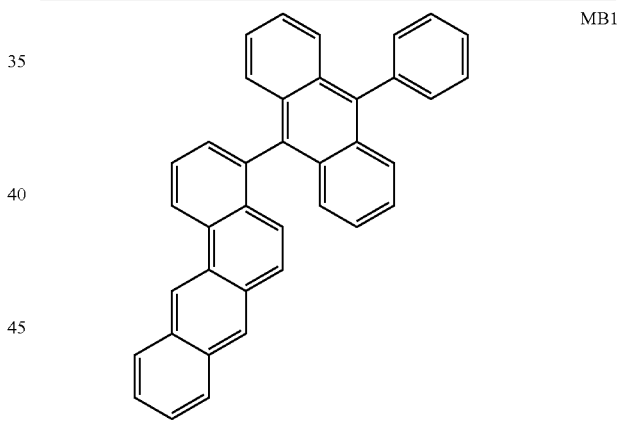

MB1

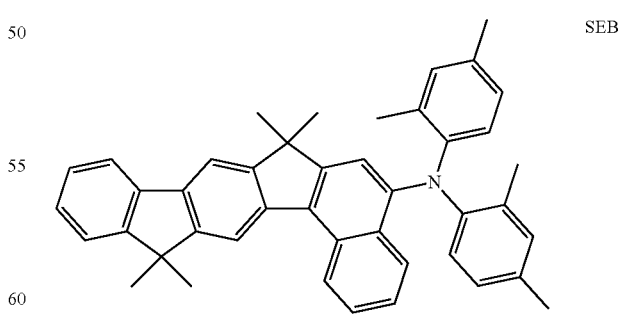

SEB

The materials for the electron-transport layer are also thermally evaporated in a vacuum chamber and are shown in Table D3. The electron-transport layer consists of the two materials ETM1 and ETM2, which are deposited by means of co-evaporation in a volume fraction of 50%:50%.

TABLE D3

Structural formulae of the materials used in the hole-blocking and/or electron-transport layers

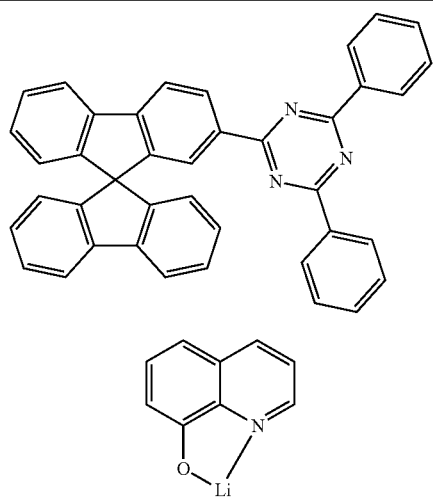

ETM1

ETM2

Furthermore, the cathode is formed by the deposition of a 100 nm thick aluminum layer by means of thermal evaporation.

The exact structure of the OLEDs is shown in Table D4.

TABLE D4

Structure of the OLEDs

| Ex. | Stack | OS | metal complex (M) | HIL weight ratio (OS:M) | solvent | T [° C.] | HTL material | EML composition |
|---|---|---|---|---|---|---|---|---|
| D1 | B | OS4 | M1 | 85:15 | LM6 | 180 | HT1 | MB1 95% SEB 5% |
| D2 | A | OS5 | M1 | 70:30 | LM1 | 180 | — | — |
| D3 | A | OS1 | M1 | 70:30 | LM1 | 180 | — | — |
| D4 | A | OS5 | M1 | 70:30 | LM6 | 180 | — | — |
| D5 | A | OS1 | M1 | 70:30 | LM6 | 180 | — | — |
| D6 | A | OS6 | M1 | 70:30 | LM6 | 180 | — | — |
| D7 | A | OS3 | M1 | 70:30 | LM8 | 180 | — | — |
| D8 | A | OS4 | M1 | 85:15 | LM15 | 220 | — | — |
| D9 | A | OS2 | M1 | 85:15 | LM18 | 180 | — | — |

The OLEDs are characterized by standard methods. For this purpose, the electroluminescence spectra, the current-voltage-luminance characteristics (IUL characteristics), assuming a Lambertian radiation pattern and in the case of Stack B, the operating lifetime are determined. Data like the operating voltage (in V) and the external quantum efficiency (in %) at a certain brightness are determined from the IUL characteristics. LD80@4000 cd/m$^2$ corresponds to the lifetime until which the brightness of the OLED drops from an initial brightness of 4000 cd/m$^2$ to a brightness equal to 80% of the initial intensity, i.e. at 3600 cd m$^2$.

The properties of the different OLEDs are summarized in Tables D5a and D5b. Examples D2 and D3 were prepared according to the prior art, all the other examples show properties of components according to the invention.

Table D5a shows results of hole-dominated components according to Stack A. In such components, the current is dominated by holes, which is why no recombination with electrons takes place that would lead to luminescence.

TABLE D5a

| Ex. | Current density at U = 3 V [mA/cm$^2$] | Scattering parameter |
|---|---|---|
| D2 | 33 | 1.1 |
| D3 | 1 | 0.9 |
| D4 | 24 | 0.2 |
| D5 | 2 | 0.1 |
| D6 | 36 | 0.2 |
| D7 | 39 | 0.4 |
| D8 | 5 | 0.2 |
| D9 | 19 | 0.3 |

The scattering parameters in Table D5a correspond to the relative error of the mean value of the current density at U=3V, which corresponds to the standard deviation divided by the mean value.

The results in Table D5a show that the scattering of the current density for components obtained from formulations according to the invention is significantly lower than the scattering of the current density for components obtained from formulations according to the prior art.

TABLE D5b

| Ex. | Efficiency at 1000 cd/m$^2$ % EQE | Voltage at 1000 cd/m$^2$ [V] | LD80 at 4000 cd/m$^2$ [h] |
|---|---|---|---|
| D1 | 7.7 | 4.5 | 420 |

Table D5b shows that the use of formulations according to the invention leads to OLEDs with a good lifetime and efficiency.

The invention claimed is:

1. A formulation comprising at least one organic semiconductor, at least one metal complex and at least one organic solvent, wherein the solubility at 20° C. of the metal complex is ≥5 g/l in at least one organic solvent and the solubility at 20° C. of the organic semiconductor is ≥10 g/l in at least one organic solvent and wherein at least one organic semiconductor is a polymer comprising at least one structural unit of the following formula (I):

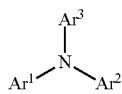

(I)

where

Ar¹ to Ar³ is on each occurrence, in each case identically or differently, a mono- or polycyclic, aromatic or heteroaromatic ring system having 5 to 60 aromatic ring atoms, which may be substituted by one or more radicals R;

R is on each occurrence, identically or differently, H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1OSO_2R^1$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals $R^1$, where one or more non-adjacent $CH_2$ groups may be replaced by $R^1C≡CR^1$, C≡C, $Si(R^1)_2$, C=O, C=S, C=$NR^1$, P(=O)($R^1$), SO, $SO_2$, $NR^1$, O, S or $CONR^1$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$, or a crosslinkable group Q, where two or more radicals R may also form a mono- or polycyclic, aliphatic, aromatic and/or benzo-fused ring system with one another;

$R^1$ is on each occurrence, identically or differently, H, D, F or an aliphatic hydrocarbon radical having 1 to 20 C atoms, an aromatic and/or a heteroaromatic hydrocarbon radical having 5 to 20 C atoms, in which, in addition, one or more H atoms may be replaced by F; where two or more substituents $R^1$ may also form a mono- or polycyclic, aliphatic or aromatic ring system with one another; and the dashed lines represent bonds to adjacent structural units in the polymer, and where at least one of Ar¹, Ar² and/or Ar³ is substituted by a radical R comprising at least 2 C atoms wherein the at least one metal complex comprises a metal atom of group 13 to 15 and a ligand of the following structure

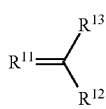

(L-1)

where $R^{11}$ and $R^{12}$ are selected, identically or differently, from the group consisting of O, S, Se, NH or $NR^{14}$, where $R^{14}$ is an alkyl or aryl group; where $R^{14}$ and $R^{13}$ may form a ring with one other; and $R^{13}$ is selected from the group consisting of a straight-chain alkyl, alkoxy or thioalkyl group having 1 to 40 C atoms or an alkenyl or alkinyl group having 2 to 40 C atoms or a branched or cyclic alkyl, alkoxy or thioalkyl group having 3 to 40 C atoms, each of which may be substituted by one or more radicals $R^1$, where in each case one or more non-adjacent $CH_2$ groups may be replaced by $R^1C≡CR^1$, C≡C, $Si(R^1)_2$, C=O, C=S, C=$NR^1$, P(=O)($R^1$), SO, $SO_2$, $NR^1$, O, S or $CONR^1$ and where one or more H atoms may be replaced by D, F, Cl, Br, I or CN, an aromatic or heteroaromatic ring system having 5 to 60 aromatic ring atoms, which may in each case be substituted by one or more radicals $R^1$, an aryloxy or heteroaryloxy group having 5 to 60 aromatic ring atoms, which may be substituted by one or more radicals $R^1$, or an aralkyl or heteroaralkyl group having 5 to 60 aromatic ring atoms, which may in each case be substituted by one or more radicals $R^1$, or a diarylamino group, diheteroarylamino group or arylheteroarylamino group having 10 to 40 aromatic ring atoms, which may be substituted by one or more radicals $R^1$; where $R^{13}$ may form a ring with at least one of the radical $R^{12}$; and $R^1$ is defined above; and wherein the one organic solvent comprises at least two solvents wherein the formulation comprises a first organic solvent which has a boiling point of from 100° C. to 300° C. and a second organic solvent which has a boiling point of from 40° C. to 100° C.

2. The formulation according to claim 1, wherein the solubility at 20° C. of the metal complex is ≥7.5 g/l, in at least one organic solvent and the solubility at 20° C. of the organic semiconductor is ≥15 g/l, in at least one organic solvent.

3. The formulation according to claim 1, wherein the first solvent is Benzonitrile, Dimethylformamide, Dimethyl sulfoxide, Toluene, Anisole, Xylene, Chlorbenzene or mixture thereof.

4. The formulation according to claim 1, wherein the second solvent is Tetrahydrofurane, Hexafluorbenzene, Acetonitrile, Acetone, Methanol, Ethylene glycol dimethyl ether, or mixture thereof.

5. The formulation according to claim 1, wherein the proportion of the organic solvent in the formulation is at least 60% by weight, based on the total weight of the formulation.

6. The formulation according to claim 1, wherein at least one organic semiconductor is selected from the group consisting of hole-transport materials (HTM) and hole-injection materials (HIM).

7. The formulation according to claim 1, wherein at least one organic semiconductor is a polymer having a molecular weight ($M_w$) in the range of 10,000 to 2,000,000 g/mol.

8. The formulation according to claim 1, wherein at least one of Ar¹, Ar² and/or Ar³ according to formula (I) or (I') is in at least one ortho-positions relating to the Nitrogen atom represented in formula (I) or (I'), substituted by Ar⁴, where Ar⁴ is a mono- or polycyclic, aromatic or heteroaromatic ring system with 5 to 60 aromatic ring atoms, which may be substituted by one or more radical R.

9. The formulation according to claim 1 wherein the concentration of the organic semiconductor is in the range of from 10 g/l to 100 g/l, based on the total formulation.

10. The formulation according to claim 1 wherein the concentration of the metal complex is in the range of from 5 g/l to 100 g/l based on the total formulation.

11. A method for the preparation of the formulation according to claim 1 comprising the following steps:
   a. Preparing a first solution comprising at least one solvent and at least one metal complex and
   b. Preparing a second solution comprising at least one solvent and at least one organic semiconductor and
   c. Mixing the first solution obtained in step a) and the second solution obtained in step b) in a specific ratio and forming a formulation by a physical method.

12. A process for the production of an electronic device with a multilayer structure, wherein at least one layer is obtained from the application of the formulation according to claim 1.

13. The process according to claim 12, wherein the formulation is applied by flood coating, dip coating, spray coating, spin coating, screen printing, relief printing, gravure printing, rotary printing, roller coating, flexographic printing, offset printing, slot die coating or nozzle printing.

14. An electronic device obtainable by the process according to claim 12.

15. The electronic device according to claim 14, wherein the electronic device is selected from the group consisting of organic electroluminescent devices, organic integrated circuits, organic field-effect transistors, organic thin-film transistors, organic light-emitting transistors, organic solar cells, organic optical detectors, organic photoreceptors, organic field-quench devices, light-emitting electrochemical cells, organic laser diodes and organic light-emitting diodes.

16. The formulation according to claim 1, wherein the polymer comprises a polymer of the formula

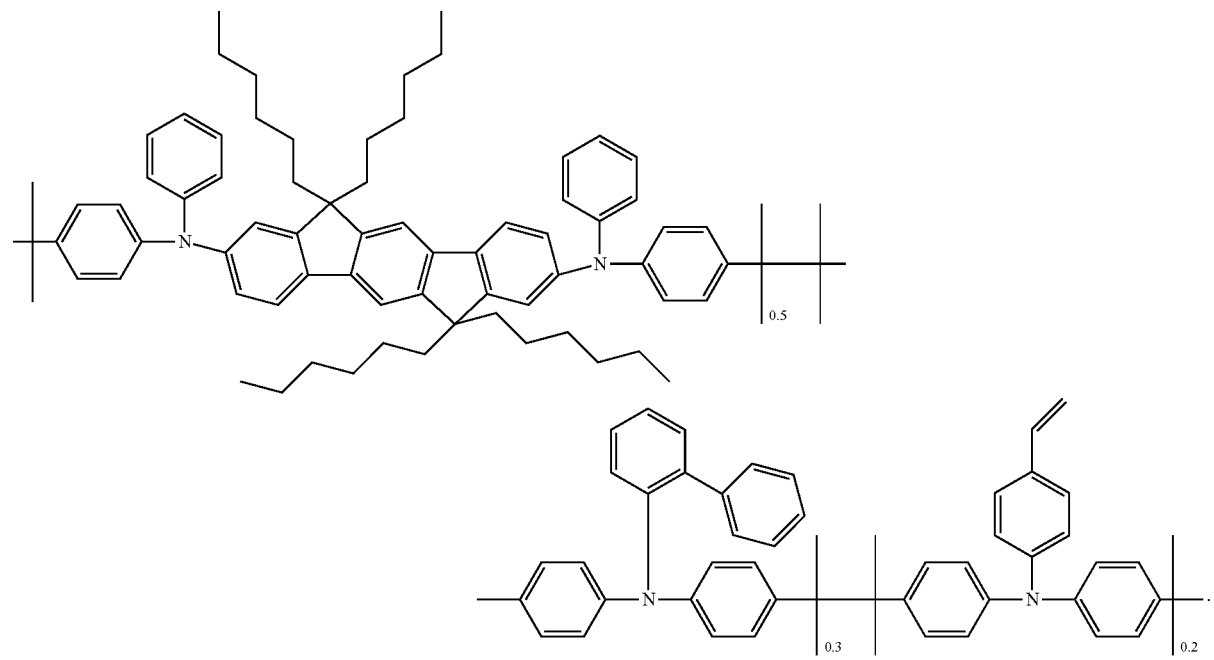

* * * * *